United States Patent [19]

Davis et al.

[11] Patent Number: 4,816,098
[45] Date of Patent: Mar. 28, 1989

[54] APPARATUS FOR TRANSFERRING WORKPIECES

[75] Inventors: Cecil J. Davis, Greenville; Robert T. Matthews, Plano, both of Tex.

[73] Assignee: Texas Instruments Incorporated, Dallas, Tex.

[21] Appl. No.: 73,940

[22] Filed: Jul. 16, 1987

[51] Int. Cl.$^4$ .................. B44C 1/22; C03C 15/00; C03C 25/06; C23F 1/02

[52] U.S. Cl. .................... 156/345; 118/728; 156/643; 156/646; 204/298

[58] Field of Search ............... 156/643, 646, 653, 656, 156/657, 659.1, 662, 345; 427/38, 39, 41, 54.1; 118/728, 50.1, 620; 204/192.1, 192.12, 192.23, 192.25, 192.32, 192.35, 192.36, 192.37, 298; 437/228, 234, 235, 238, 241, 245; 252/79.1; 414/222, 225, 226, 744 R, 744 A, 744 B, 744 C, 786

[56] References Cited

U.S. PATENT DOCUMENTS

| | | | |
|---|---|---|---|
| 3,439,238 | 4/1969 | Williams et al. | 317/235 |
| 3,765,763 | 10/1973 | Nygaard | 355/100 |
| 4,250,428 | 2/1981 | Oliver et al. | 313/268 |
| 4,293,249 | 10/1981 | Whelan | 406/72 |
| 4,306,292 | 12/1982 | Head | 364/468 |
| 4,393,095 | 7/1983 | Greenberg | 427/87 |
| 4,439,243 | 3/1984 | Titus | 134/33 |
| 4,439,244 | 3/1984 | Allenato | 134/33 |
| 4,447,469 | 5/1984 | Peters | 427/54.1 |
| 4,465,898 | 8/1984 | Orcutt et al. | 174/52 |
| 4,493,977 | 1/1985 | Arai et al. | 219/411 |
| 4,579,609 | 4/1986 | Reif et al. | 148/175 |
| 4,584,207 | 4/1986 | Wilson | 427/124 |
| 4,609,103 | 9/1986 | Bimer et al. | 206/328 |
| 4,615,905 | 10/1986 | Ovshinsky et al. | 427/39 |
| 4,629,635 | 12/1986 | Brors | 427/255.2 |
| 4,632,057 | 12/1986 | Price et al. | 118/716 |
| 4,673,456 | 6/1987 | Spencer et al. | 156/345 |
| 4,684,542 | 8/1987 | Jasinski et al. | 437/245 |

FOREIGN PATENT DOCUMENTS 0113778 5/1986 Japan .
0114531 6/1986 Japan .
0150219 7/1986 Japan .

OTHER PUBLICATIONS

Lucovsky et al., "Deposition of Dielectric Films by Remote Plasma Enhanced CVD", Mat. Res. Soc. Symp. Proc., vol. 68, 1986, pp. 323–334.
Sakai et al., "Sealing Concept of Elastic Metal Gasket Helicoflex", 32 Vacuum 33(1982).
Ishimaru et al., "Bakable Aluminum Vacuum Chamber and Bellows With an Aluminum Flange and Metal Seal for Ultrahigh Vacuum", 26IEEE Transactions on Nuclear Science 4000 (1979).
Fleming et al., "Development of Bakable Seals for Large Non-Circular Ports on the Tokamak Fusion Test Reactor", 17 Journal of Vacuum Science and Technology 337(1980).

(List continued on next page.)

Primary Examiner—William A. Powell
Attorney, Agent, or Firm—Joseph E. Rogers; James T. Comfort; Melvin Sharp

[57] ABSTRACT

A processing apparatus and method for transferring wafers or flat workpieces between a controlled vacuum load lock and a non-vacuum transfer mechanism. The apparatus is adapted to receive the wafers in a carrier under vacuum. The load lock chamber of the apparatus is then pumped down and purged, if desired. Next the chamber is brought to ambient pressure and an opening to the chamber is created. A transfer arm within the chamber transfers the wafers from the carrier through the opening and to a platform or an non-vacuum carrier. The wafers are received by the arm outside the chamber and transferred through the opening and placed into the vacuum carrier within the chamber. The opening into the chamber is closed and a vacuum is generated. The chamber can then be purged, if desired and the vacuum carrier sealed. The carrier can now be removed from the load lock chamber.

4 Claims, 43 Drawing Sheets

OTHER PUBLICATIONS

Accomazzo et al., "Ultrahigh Efficiency Membrane Filters for Semi-Conductor Process Gases", Solid State Technology 27(3), pp. 141-146 (1984).

Kasper et al., "A Gas Filtration System for $10^5$ Particles/cm$^3$", Aerosol Science and Technology 5(2), pp. 167-185 (1986).

M. L. Malczewski, J. D. Borkman, and G. T. Vardian, "Measurement of Particulates in Filtered Process Gas Streams", Solid State Technology 28 (4), pp. 151-157 (1986).

C. M. Van Atta, "Vacuum Science and Engineering", McGraw-Hill, New York, pp. 31.

R. A. Bowling, "An Analysis of Adhesion on Semiconductor Surfaces", Journal of the Electrochemical Society 132 (9), pp. 2208-2214 (1985).

"Grooves Reduce Aircraft Drag", NASA Tech Briefs 5 (2), pp. 192.

"Mission Accomplished", NASA Tech Briefs 117 (3), pp. 82-83 (1987).

C. J. Howard, J. Phys. Chem. vol. 83, pp. 6 (1979).

H. Schlichting, "Boundary-Layer Theory", 7th Edition, McGraw Hill, New York, (1979).

S. V. Nguyen, "Plasma Assisted Chemical Vapor Deposited Thin Films for Microelectronic Applications", J. Vac. Sci. Technol. B4 (5), Sep./Oct. 1986, pp. 1159-1167.

S. Nishino, et al., "SiO$_2$ Deposition by Photo-Initiation", Extended Abstracts of the 18th (1986 International) Conference on Solid State Devices and Materials, Tokyo, 1986, pp. 209-212.

C. J. Mogab, "Plasma Etching of Si and SiO$_2$-The Effect of Oxygen Additions to CF$_4$ Plasmas", J. Appl. Phys., vol. 49, No. 7, Jul., 1978, pp. 3796-3803.

D. L. Flamm, et al., "Reaction of Fluorine Atoms with SiO$_2$", J. Appl. Phys. 50 (10), Oct. 1979, pp. 6211-6213.

D. L. Flamm, et al., "The Reaction of Fluorine Atoms with Silicon", J. Appl. Phys. 52 (6), 1981, pp. 3633-3639.

G. Smolinski, et al., "The Plasma Oxidation of CF$_4$ in a Tubular-Alumina Fast-Flow Reactor", J. Appl. Phys. 50 (7), Jul. 1979, pp. 4982-4987.

J. F. Gibbons, et al., "Limited Reaction Processing: Silicon Epitaxy", Appl. Phys. Lett. 47 (7), 1 Oct. 1985, pp. 21-723.

A. Yamada, et al., "Photochemical Vapor Deposition of Single-Crystal Silicon at a Very Low Temperature of 200° C.", Extended Abstracts of the 18th (1986 International) Conference on Solid State Devices and Materials, Tokyo, 1986, pp. 217-220.

K. Tsujimoto, et al., "A New Sidewall Protection Technique in Microwave Plasma Etching Using a Chopping Method", Extended Abstracts of the 18th (1986 International) Conference on Solid State Devices and Materials, Tokyo, 1986, pp. 229-232.

Robert R. Krchnavik, et al., "Photo Deposition Rates of Metal from Metal Alkyls", J. Vac. Sci. Tecnol. B 5 (1), Jan./Feb. 1987, pp. 20-26.

Hiroyuki Yokoyama, "Photo Induced Surface Morphology Improvement and Preferential Orientation Enhancement in Film Deposition of Evaporated ZnS", Appl. Phys. Lett. 49 (20), 17 Nov. 1986, pp. 1354-1356.

J. B. Mullin, et al., "Ultraviolet Assisted Growth of II-VI Compounds", J. Vac. Sci. Technol. A, vol. 4, No. 3, May/Jun. 1986, pp. 700-703.

S. Oda, et al., "Hydrogen Radical Assisted Chemical Vapor Deposition of ZnSe", Appl. Phys. Lett. 48 (1), 6 Jan. 1986, pp. 33-35.

R. A. Levy et al., "Low Pressure Chemical Vapor Deposition of Tungsten and Aluminum for VLSI Applications", J. Electrochem. Soc.: Reviews and News, Feb. 1987, pp. 37C-49C.

Carl E. Larson, et al., "Chemical Vapor Deposition of Gold", Aug. 11, 1986, IBM Almaden Research Center, San Jose, CA 91520, p. 266.

Paul A. Robertson, et al., "Photo Enhanced Deposition of Silicon Oxide Thin Films Using an Internal Nitrogen Discharge Lamp", Fall 1986, Materials Research Society Symposium, Dec., 1986.

J. Praraszczak, et al., "Methods of Creation and Effect of Microwave Plasmas Upon the Etching of Polymers and Silicon", Microelectronic Engineering 3 (1985), pp. 397-410.

C. Arnone, et al., Study of Photo-Induced Thin Film Growth on CdS Substrates, Mat. Res. Soc. Symp. Proc. vol. 29 (1984), pp. 275-281.

Helicoflex Company, Catalog H. 001. 002, Resilient Metal Seals and Gaskets.

P. D. Richard, et al., "Remote Plasma Enhanced CVD Deposition of Silicon Nitride and Oxide for Gate Insulators in (In. Ga) As FET Devices", J. Vac. Sci. Technol. A3 (3), May/Jun. 1985, pp. 867-872.

G. Lucovsky, et al., "Deposition of Silicon Dioxide and Silicon Nitride by Remote Plasma Enhanced Chemical Vapor Deposition", J. Vac. Sci. Technol. A4 (3), May/Jun. 1986, pp. 681-688.

(List continued on next page.)

OTHER PUBLICATIONS

D. E. Tsu, et al., "Silicon Nitride and Silicon Diimide Grown by Remote Plasma Enhanced Chemical Vapor Deposition", J. Vac. Sci. Technol. A4 (3), May/Jun. 1986, pp. 480–485.

Advertisement, "Dry Stripper", Samco/Mar., Solid State Technology, 30 (3) Mar. 1987, p. 45.

F. Paneth et al., "Paneth's Lead–Mirror Experiment", Ber. Dt. Chem. Ges. B62 1335 (1929).

Hajime Ishimaru et al., "Bakable Aluminum Vacuum Chamber and Bellows With an Aluminum Flange and Metal Seal for Ultrahigh Vacuum", J. Vac. Sci. Technol., 15(6) Nov./Dec. 1978, pp. 1853–1854.

S. Mehta, et al., "Blanket CVD Tungsten Interconnect for VLSI Devices", Jun. 9–10, 1986, V-MIC Conf., pp. 418–435.

M. E. Burba. et al., "Selective Dry Etching of Tungsten for VLSI Metallization", J. Electrochem. Soc.: Solid State Science and Technology, Oct. 1986, pp. 2113–2118.

S. Iwata et al., "A New Tungsten Gate Process for VLSI Applications", IEEE Transactions on Electron Devices, vol. ED-31, No. 9, Sep. 1984 pp. 1174–1179.

C-K. Hu, et al., "Reactive Ion Etching of CVD and Sputtered Tungsten Films", IBM Thomas J. Watson Research Center, P.O. Box 218, Yorktown Heights, N.Y. 10598, two pages.

IBM, "Anisotropic and Selective Etching of Tungsten Silicide–Tungsten–Tungsten–Silicide Composite Stack", IBM Technical Disclosure Bulletin, vol. 29, No. 3, Aug. 1986, pp. 1151.

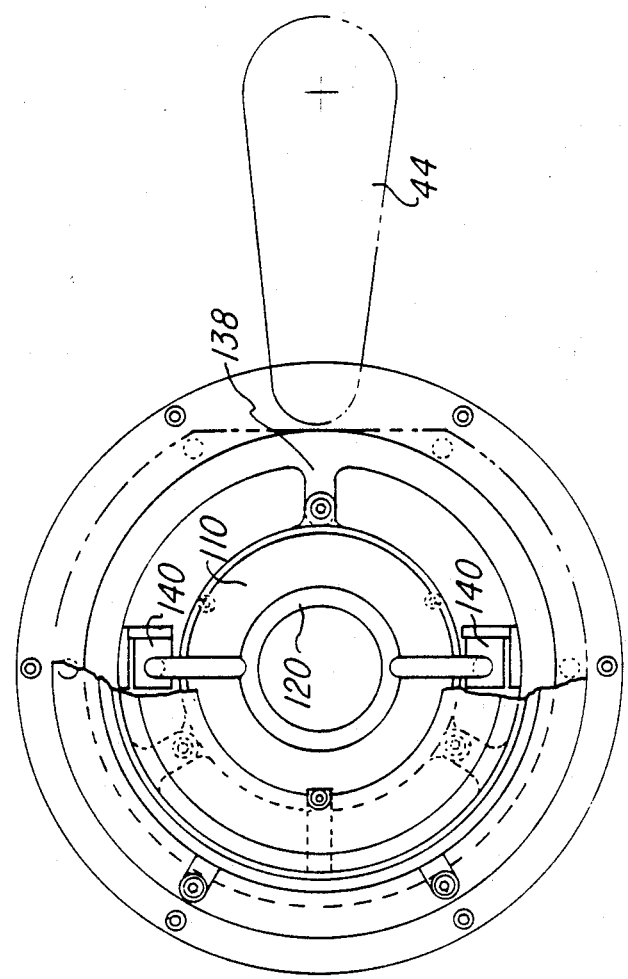

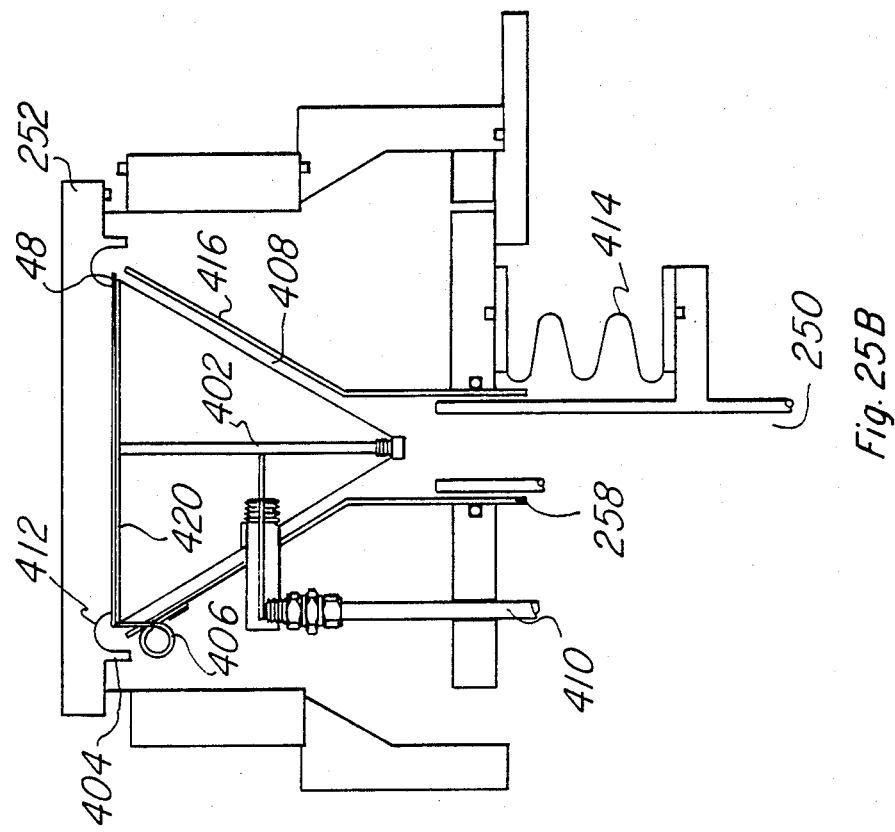

TYPE 1

TYPE 2

APPARATUS FOR TRANSFERRING WORKPIECES

CROSS REFERENCE TO RELATED APPLICATIONS

The present application incorporates by reference each of the following applications which are related cases of a common assignee and contain related subject matter:

Ser. No. 060,991, filed June 12, 1987, pending, Vacuum Slice Carrier; which is a continuing application of Ser. No. 790,918, filed Oct. 24, 1985 by Davis, Cecil and Matthews, Robert; now abandoned;

Ser. No. 060,976 filed June 12, 1987, abandoned, Advanced Vacuum Processor; which is a continuing application of Ser. No. 790,708, filed Oct. 24, 1985 by Davis, Cecil; Spencer, John; Wooldridge, Tim; and Carter, Duane; now abandoned;

U.S. Pat. No. 4,687,542, issued Aug. 18, 1987, entitled Vacuum Processing System by Davis, Cecil; Matthews, Robert; and Hildenbrand, Randall;

Ser. No. 790,707, filed Oct. 24, 1985, U.S. Pat. No. 4,685,999, entitled Apparatus for Plasma-Assisted Etching by Davis, Cecil; Carter, Duane; and Jucha, Rhett;

Ser. No. 061,017, filed June 12, 1987, abandoned, entitled Integrated Circuit Processing System; which is a continuing application of Ser. No. 824,342, filed Jan. 30, 1986 by Davis, Cecil; Bowling, Robert; and Matthews, Robert; now abandoned; and Ser. No. 915,608, filed Oct. 6, 1986 U.S. Pat. No. 4,718,975, entitled Movable Particle Shield by Bowling, Robert; Larrabee, Graydon; and Liu, Benjamin;

Ser. No. 074,448, filed July 16, 1987, pending, entitled Processing Apparatus and Method; by Davis, Cecil; Matthews, Robert; Loewenstein, Lee; Abernathy, Joe; and Wooldridge, Timothy;

Ser. No. 075,016, filed July 17, 1987, pending, entitled Processing Apparatus and Method; by Davis, Cecil; Loewenstein, Lee; Matthews, Robert; and Jones, John;

Ser. No. 073,943, filed July 16, 1987, pending entitled Processing Apparatus and Method; by Loewenstein, Lee; Rose, Alan; Kennedy, Robert III; Huffman, Craig; and Davis, Cecil;

Ser. No. 073,948, filed July 16, 1987, pending entitled Processing Apparatus and Method; by Loewenstein, Lee;

Ser. No. 073,942, filed July 16, 1987, pending entitled Processing Apparatus and Method; by Jucha, Rhett; and Davis, Cecil;

Ser. No. 074,419, filed July 16, 1987, pending entitled Processing Apparatus and Method; by Davis, Cecil; and Matthews, Robert;

Ser. No. 074,377, filed July 16, 1987, pending, entitled processing Apparatus and Method; by Davis, Cecil; Jucha, Rhett; Hildenbrand, Randall; Schultz, Richard; Loewenstein, Lee; Matthews, Robert; Huffman, Craig; and Jones, John;

Ser. No. 074,398, filed July 16, 1987, abandoned, entitled Processing Apparatus and Method; by Davis, Cecil; Loewenstein, Lee; Jucha, Rhett; Matthews, Robert; Hildenbrand, Randall; Freeman, Dean; and Jones, John;

Ser. No. 074,456, filed July 16, 1987, pending, entitled Processing Apparatus and Method; by Davis, Cecil; Jucha, Rhett; Luttmer, Joseph; York, Rudy; Loewenstein, Lee; Matthews, Robert; and Hildenbrand, Randall;

Ser. No. 074,399, filed July 16, 1987, abandoned, entitled Processing Apparatus and Method; by Jucha, Rhett; and Davis, Cecil;

Ser. No. 074,450, filed July 16, 1987, pending, entitled Processing Apparatus and Method; by Jucha, Rhett; Davis, Cecil; and Jones, John;

Ser. No. 074,375, filed July 16, 1987, pending, entitled Processing Apparatus and Method; by Jucha, Rhett; Carter, D.; Davis, Cecil; and Crank S.;

Ser. No. 074,411, filed July 16, 1987, pending, entitled Processing Apparatus and Method; by Jucha, Rhett; Davis, Cecil; Carter, D.; Crank, S.; and Jones, John;

Ser. No. 074,390, filed July 16, 1987, abandoned, entitled Processing Apparatus and Method; by Jucha, Rhett; Davis, Cecil; and Crank S.;

Ser. No. 074,114, filed July 16, 1987, abandoned, entitled Processing Apparatus and Method; by Davis, Cecil; Loewenstein, Lee; Freeman, Dean; and Burris, James;

Ser. No. 074,373, filed July 16, 1987, pending, entitled Processing Apparatus and Method; by Freeman, Dean; Burris, James; Davis, Cecil; and Loewenstein, Lee;

Ser. No. 074,391, filed July 16, 1987, pending, entitled Processing Apparatus and Method; by Freeman, Dean; Burris, James; Davis, Cecil; and Loewenstein, Lee:

Ser. No. 074,415, filed July 16, 1987, pending, entitled Processing Apparatus and Method; by Freeman, Dean; Burris, James; Davis, Cecil; Loewenstein, Lee;

Ser. No. 074,451, filed July 16, 1987, pending, entitled Processing Apparatus and Method; by Luttmer, Joseph; Davis, Cecil; Smith, Patricia; York, Rudy; Loewenstein, Lee; and Jucha, Rhett;

Ser. No. 073,945, filed July 16, 1987, pending, entitled Processing Apparatus and Method; by Luttmer, Joseph, Davis, Cecil; Smith, Patricia; and York, Rudy;

Ser. No. 073,936, filed July 16, 1987, abandoned, entitled Processing Apparatus and Method; by Luttmer, Joseph, Davis, Cecil; Smith, Patricia, and York, Rudy;

Ser. No. 074,111, filed July 16, 1987, abandoned, entitled Processing Apparatus and Method; by Luttmer, Joseph, York, Rudy; Smith, Patricia; and Davis Cecil;

Ser. No. 074,386, filed July 16, 1987, pending, entitled Processing Apparatus and Method; by York, Rudy; Luttmer, Joseph; Smith, Patricia; and Davis, Cecil;

Ser. No. 074,407, filed July 16, 1987, abandoned, entitled Processing Apparatus and Method; by York, Rudy; Luttmer, Joseph; Smith, Patricia; and Davis, Cecil;

Ser. No. 075,018, filed July 16, 1987, pending, entitled Processing Apparatus and Method; by Davis, Cecil; Abernathy, Joe; Matthews, Robert; Hildenbrand, Randall; Simpson, Bruce; Bohlman, James; Loewenstein, Lee; and Jones, John;

Ser. No. 074,112, filed July 16, 1987, pending, entitled Processing Apparatus and Method; by Davis, Cecil; Matthews, Robert; York, Rudy; Luttmer, Joseph; Jakubik, Dwain; and Hunter, James;

Ser. No. 074,449, filed July 16, 1987, pending, entitled Processing Apparatus and Method; by Davis, Cecil; Smith, Greg; Matthews, Robert; Jones, John; Smith, James; and Schultz, Richard;

Ser. No. 074,406, filed July 16, 1987, abandoned, entitled Processing Apparatus and Method; by Davis, Cecil; Freeman, Dean; Matthews, Robert; Tomlin, Joel;

Ser. No. 073,941, filed July 16, 1987, pending, entitled Processing Apparatus and Method; by Davis, Cecil;

Loewenstein, Lee; Tipton, Charlotte; Smith, Randee, Pohlmeier, R.; Jones, John; Bowling, Robert; and Russell, I;

Ser. No. 074,371, filed, July 16, 1987, pending, entitled Processing Apparatus and Method; by Loewenstein, Lee; and Davis, Cecil;

Ser. No. 074,418, filed July 16, 1987, abandoned, entitled Processing Apparatus and Method; by Fisher, Wayne;

Ser. No. 073,934, filed July 16, 1987, abandoned, entitled Processing Apparatus and Method; by Fisher, Wayne; Bennett, Tommy; Davis, Cecil; and Matthews, Robert;

Ser. No. 074,403, filed July 16, 1987, abandoned, entitled Processing Apparatus and Method; by Davis, Cecil; Matthews, Robert; and Fisher, Wayne;

Ser. No. 075,019, filed July 16, 1987, pending, entitled Processing Apparatus and Method; by Davis, Cecil; Freeman, Dean; Matthews, Robert; and Tomlin, Joel;

Ser. No. 073,939, filed July 16, 1987, abandoned, entitled Processing Apparatus and Method; by Davis, Cecil; Abernathy, Joe; Matthews, Robert, Hildenbrand, Randy; Simpson, Bruce; Bohlman, James; Loewenstein, Lee; and Jones, John;

Ser. No. 073,944, filed July 16, 1987, pending, entitled Processing Apparatus and Method; by Cecil, Davis and Jucha, Rhett;

Ser. No. 073,935, filed July 16, 1987, abandoned, entitled Processing Apparatus and Method; by Liu, Jiann; Davis, Cecil; and Loewenstein, Lee;

Ser. No. 074,129, filed July 16, 1987, pending, entitled Processing Apparatus and Method; by Loewenstein, Lee; Freeman, Dean; and Davis; Cecil;

Ser. No. 074,455, filed July 16, 1987, pending, entitled Processing Apparatus and Method; by Loewenstein, Lee; Freeman, Dean; and Davis, Cecil;

Ser. No. 074,453, filed July 16, 1987, pending, entitled Processing Apparatus and Method; by Loewenstein, Lee; Freeman, Dean; and Davis, Cecil;

Ser. No. 073,949, filed July 16, 1987, abandoned, entitled Processing Apparatus and Method; by Loewenstein, Lee; and Davis, Cecil;

Ser. No. 074,379, filed July 16, 1987, pending, entitled Processing Apparatus and Method; by Loewenstein, Lee; and Davis, Cecil;

Ser. No. 073,937, filed July 16, 1987, abandoned, entitled Processing Apparatus and Method; by Loewenstein, Lee; and Davis, Cecil;

Ser. No. 074,425, filed July 16, 1987, abandoned, entitled Processing Apparatus and Method by Loewenstein, Lee; Davis, Cecil; and Jucha, Rhett;

Ser. No. 073,947, filed July 16, 1987, abandoned, entitled Processing Apparatus and Method; by Davis, Cecil; Loewenstein, Lee; and Jucha, Rhett;

Ser. No. 074,452, filed July 16, 1987, abandoned, entitled Processing Apparatus and Method; by Jucha, Rhett; Davis, Cecil; and Loewenstein, Lee;

Ser. No. 074,454, filed July 16, 1987, pending, entitled Processing Apparatus and Method; by Jucha, Rhett; Davis, Cecil; and Loewenstein, Lee;

Ser. No. 074,422, filed July 16, 1987, pending, entitled Processing Apparatus and Method; by Davis, Cecil; Matthews, Robert; Jucha, Rhett; and Loewenstein, Lee;

Ser. No. 074,113, filed July 16, 1987, pending, entitled Processing Apparatus and Method; by Davis, Cecil; Matthews, Robert; Loewenstein, Lee; Jucha, Rhett; Hildenband, Randy; and Jones, John;

Ser. No. 075,017, filed July 16, 1987, pending, entitled Processing Apparatus and Method; by Loewenstein, Lee;

Ser. No. 073,946, filed July 16, 1987, pending, entitled Processing Apparatus and Method; by Davis, Cecil; and Matthews, Robert; and Ser. No. 073,938, filed July 16, 1987, abandoned, entitled Processing Apparatus and Method; by Davis, Cecil; and Matthews, Robert.

BACKGROUND AND SUMMARY OF THE INVENTION

The present invention relates to apparatus and methods for manufacturing integrated circuits and other electronic devices.

One of the basic problems in integrated circuit manufacturing is defects caused by the presence of particulates. For example, if photolithography with 0.8 micron minimum geometry is being performed to pattern a conductor layer, the presence of a 0.5 micron particle can narrow the patterned line enough to cause a defect which will prevent the circuit from operating (either immediately due to an open circuit, or eventually due to electromigration). For another example, if a 100Å particle of silicon adheres to the surface and is included in a 200Å nitride layer being grown, the dielectric will have greater chances of breaking down at that point, even assuming that no subsequent process step disturbs the silicon particle.

This problem is becoming more and more troublesome because of two trends in integrated circuit processing: First, as device dimensions become smaller and smaller, the size of a "killing defect" becomes smaller, so that it is necessary to avoid the presence of smaller and smaller particles. This makes the job of making sure that a clean room is really clean increasingly difficult. For example, a clean room which is Class 1 (i.e. has an atmosphere with less than one particle per cubic foot) for particles of one micron and larger may well be Class 1000 or worse if particle sizes down to 100 Angstroms are counted.

Second, there is an increased desired to use large size integrated circuits. For example, integrated circuit sizes larger than 50,000 square mils are much more commonly used now than they were five years ago. This means that each fatal defect is likely to destroy a larger area of processed wafer than was previously true. Another way to think of this is that not only has the critical defect size decreased, but the critical defect density has also decreased.

Thus, particulates are not only an extremely important source of loss in integrated circuit manufacturing yields, but their importance will increase very rapidly in the coming years. Thus, it is an object of the present invention to provide generally applicable methods for fabricating integrated circuits which reduce the sensitivity of the process to particulate contaminantion.

One of the major sources of particulate contamination is humangenerated, including both the particles which are released by human bodies and the particles which are stirred up by equipment operators moving around inside a semiconductor processing facility (front end). To reduce the potential for particulate contamination from this major source, the general trend in the industry has been to make more use of automatic transfer operations. Using such operations, for example, a cassette of wafers can be placed into a machine, and then the machine automatically transfers the wafers, one by one, from the cassette through the machine (to effect the processing steps necessary) and back to the cassette, without manual assistance.

However, efforts in the area of automatic transfer operations have served to highlight the importance of a second source of particles, namely particles generated by the wafers and the transfer mechanisms during handling and transport operations. When the surface of the wafer jostles slightly against any other hard surface, some particulate (of silicon, silicon dioxide, or other materials) is likely to be released. The particulate density inside a conventional wafer carrier is typically quite high, due to this source of particulate. Moreoever, many of the prior art mechanisms for wafer transport generate substantial quantities of particulate. The general problem is discussed in U.S. Pats. Nos. 4,439,243 and 4,439,244, which are incorporated by reference hereinto.

Some types of wafer processing are shown in U.S. Pats. Nos. 4,293,249 by Whelan issued on Oct. 6, 1981, 4,306,292 by Head issued on Dec. 15, 1981, and 3,765,763 by Nygaard issued on Oct. 16, 1973, which are incorporated by reference hereinto.

The prior applications of common assignee discussed above addressed this facet of the problem by providing a vacuum wafer carrier in which particulate generation due to abrasion of the surface of the wafer during transport is reduced. The teachings of these prior applications enabled not only reduced generation of particulate in the carrier during transport and storage, but also reduced transport of particulate to the wafer's active face during transport and storage, by carrying the wafers face down under a high vacuum. This allowed the rapid settling of both ambient and transport generated particulate on other than the active wafer face.

The wafers can therefore be transported, loaded, unloaded and processed without ever seeing atmospheric or even low vacuum conditions. This is extremely useful, because, at pressures of less than about $10^{-5}$ Torr, there will not be enough Brownian motion to support particles of sizes larger than about 100Å, and these particles will fall out of this low-pressure atmosphere relatively rapidly.

FIG. 2 shows the time required for particles of different sizes to fall one meter under atmospheric pressure. Note that, at a pressure of $10^{-5}$ Torr or less, even 100Å particles will fall one meter per second, and larger particles will fall faster. (Large particles will simply fall ballistically, at the acceleration of gravity.) Thus, an atmosphere with a pressure below $10^{-5}$ Torr means that particles one hundred angstroms or larger can only be transported ballistically, and are not likely to be transported onto the critical wafer surface by random air currents or Brownian drift.

The relevance of this curve to the various embodiments described in the present application is that the prior applications were the first known teachings of a way to process wafers so that the wafers are never exposed to airborne particulates, from the time they are loaded into the first vacuum process station (which might well be a scrubbing and pumpdown station) until the time when processing has been completed, except where the processing step itself requires higher pressures (e.g. for conventional photolithography stations or for wet processing steps). This means that the total possibilities for particulate collection on the wafers are vastly reduced.

The prior applications cited above also taught use of the vacuum wafer carrier design together with a load lock and vacuum wafer transport mechanism at more than one process module, to provide a complete low-particulate wafer transfer system. These vacuum load locks can usefully incorporate mechanisms for opening a vacuum wafer carrier after the load lock has been pumped down, for removing wafers from the carrier in whatever random-access order is desired, and for passing the wafers one by one through a port into an adjacent processing chamber. Moreover, the load lock mechanism can close and reseal the vacuum wafer carrier, so that the load lock itself can be brought up to atmospheric pressure and the vacuum wafer carrier removed, without ever breaking the vacuum in the vacuum wafer carrier. This process takes maximum advantage of the settling phenomena illustrated in FIG. 2 and described in more detail below. The wafer can then be moved in a virtually particulate free environment from the carrier to the load lock, into the process chamber and back through the load lock to the carrier for, potentially, an entire manufacturing sequence.

A process station (which may optionally contain one process module or more than one process module) has more than one load lock attached to it. This has several actual and potential advantages, First, processing can continue on wafers transferred in from one load lock while the other load lock is being reloaded, so that throughput is increased. Second, with some types of mechanical malfunction it will be possible to move at least the in-process wafers out of the central module area (into one of the load locks, or even into one of the process modules) to keep them from exposure to ambient if it is necessary to vent the process module to correct the malfunction. This means that even fairly severe faults may be recoverable. Third, if separate transfer arms are provided inside each of the load locks, this provides the further advantage that, if a mechanical problem occurs with one transfer apparatus inside its load lock, the process station can continue in production, using transfer through the other load lock, while maintenance is summoned to correct the mechanical malfunction.

The various process modules disclosed in the present application provide a tremendous improvement in the modularity of processing equipment. That is, a reactor can be changed to any one of a very wide variety of functions by a relatively simple replacement. It may be seen from the detailed descriptions below that most of the different functions available can be installed merely by making replacements in the wafer susceptor and related structures—i.e. in the top piece of the reactor, which bolts on—or in the feed structures, i.e. the structures directly below the wafer. Thus, the basic configuration of the vacuum chamber and wafer transfer interface is changed very little.

This capability confers tremendous advantages. First, the marginal capital cost of adding a new processing capability is greatly decreased. Second, the flexibility of manufacturing space is greatly increased, since machines can be reconfigured with relative ease to perform new functions. Third, the design development time for reactor structures is greatly decreased. Fourth, the time required to train personnel in use of a new reactor is also greatly decreased, since many key functions will be performed identically across a wide variety of reactors. Fifth, the cost of mistakes will be reduced, since operators will less frequently make mistakes due to unfamiliarity or confusion due to variety of equipment. Sixth, the carrying cost of an adequate spare parts inventory will be reduced. Seventh, the delay cost of repair and maintenance functions can be reduced, since many such functions can be performed off-line after an appropriate replacement module is swapped into the production reactor. Eighth, the presence of disused and obsolete machines in manufacturing space can be minimized, because a machine which had been configured to perform an unneeded function can be reconfigured.

The various classes of modules disclosed herein provide the advantage that the "footprint" required to emplace them is minimal. That is, if one or more process modules like those described is located in a clean room, only a minimum of clean room floor space (which is very expensive) will be required.

The capability for transferring wafers from one process chamber to another without breaking vacuum is enhanced by the modular compatibility of the below described embodiments. In particular, one of the advantages of modular processing units of the kind disclosed herein is that a single process station may advantageously contain several process modules like those described, so that wafers need not even go through the load lock to be transferred between two modules which are in a common station.

One way to think about the advantages of the various module designs discussed below might be to consider that they provide a super-capable reactor, i.e. has more adaptation capability than can ever be used for any single process. Viewed in this light, it may also be seen that their features are advantageous in sequential processing. That is, it has been recognized as desirable to perform more than one process in the same chamber without removing the wafer. The reactor designs disclosed herein are particularly advantageous in doing this, since the "excess" capability of the reactor design means that it is easier to configure it to perform two sequential steps.

Other and further advantages are set forth within and toward the end of the Description of the Preferred Embodiment.

BRIEF DESCRIPTION OF THE DRAWINGS

The present invention will be described with reference to the accompanying drawings, wherein:

FIG. 8 shows a plan view of the reactor of FIG. 6.

FIGS. 25A and 25B show a process module with capability for edge-preferential processing (and specifically for photoresist bake and/or edge bead removal).

DESCRIPTION OF THE PREFERRED EMBODIMENTS

The present invention provides major new concepts in semiconductor process methods and apparatus. The presently preferred embodiments will now be discussed in great detail, but it must be appreciated that the concepts which are included in these embodiments could also be used in many other embodiments, and the scope of the invention is not delimited by the particular examples shown.

Figure 1:
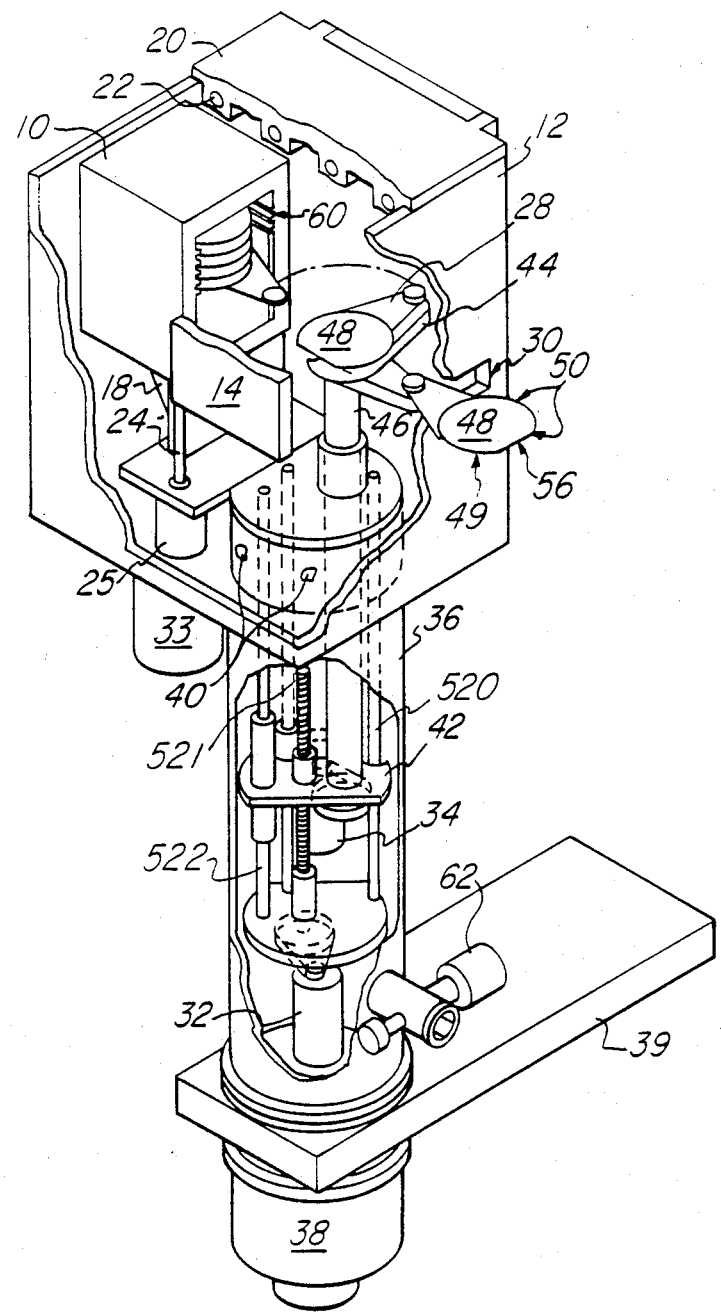
FIG. 1 shows a sample embodiment of a load lock which is compatible with vacuum processing and transport of semiconductor integrated circuit wafers.
Figure 2:
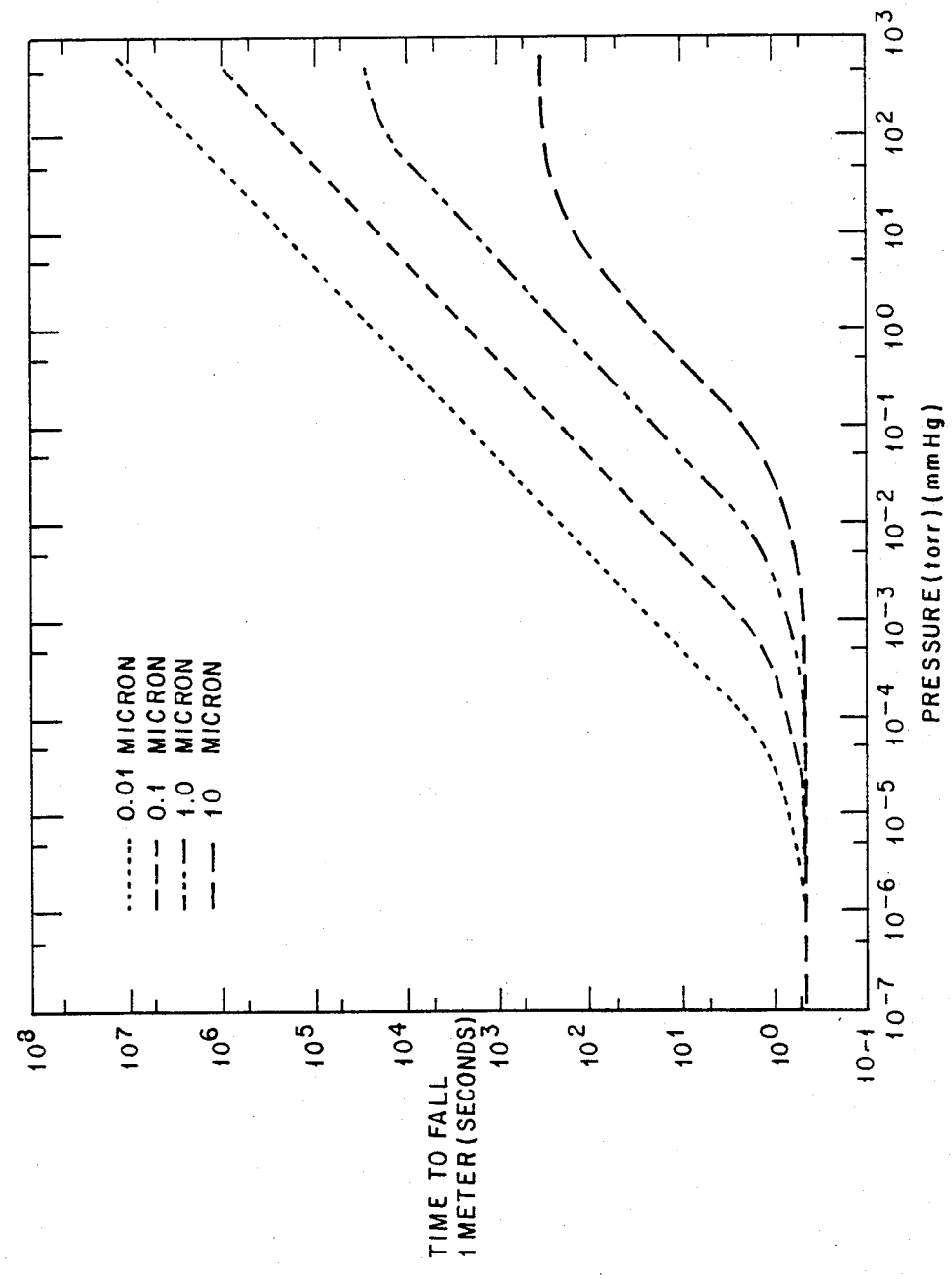
FIG. 2 shows a graph of the time required to fall through air at various pressures for particulates of various sizes.

FIG. 1 shows a sample embodiment of a vacuum wafer carrier 10 inside a vacuum load lock chamber 12. The vacuum wafer carrier 10 is also shown, in slightly greater detail, in FIG. 4.

Figure 4:
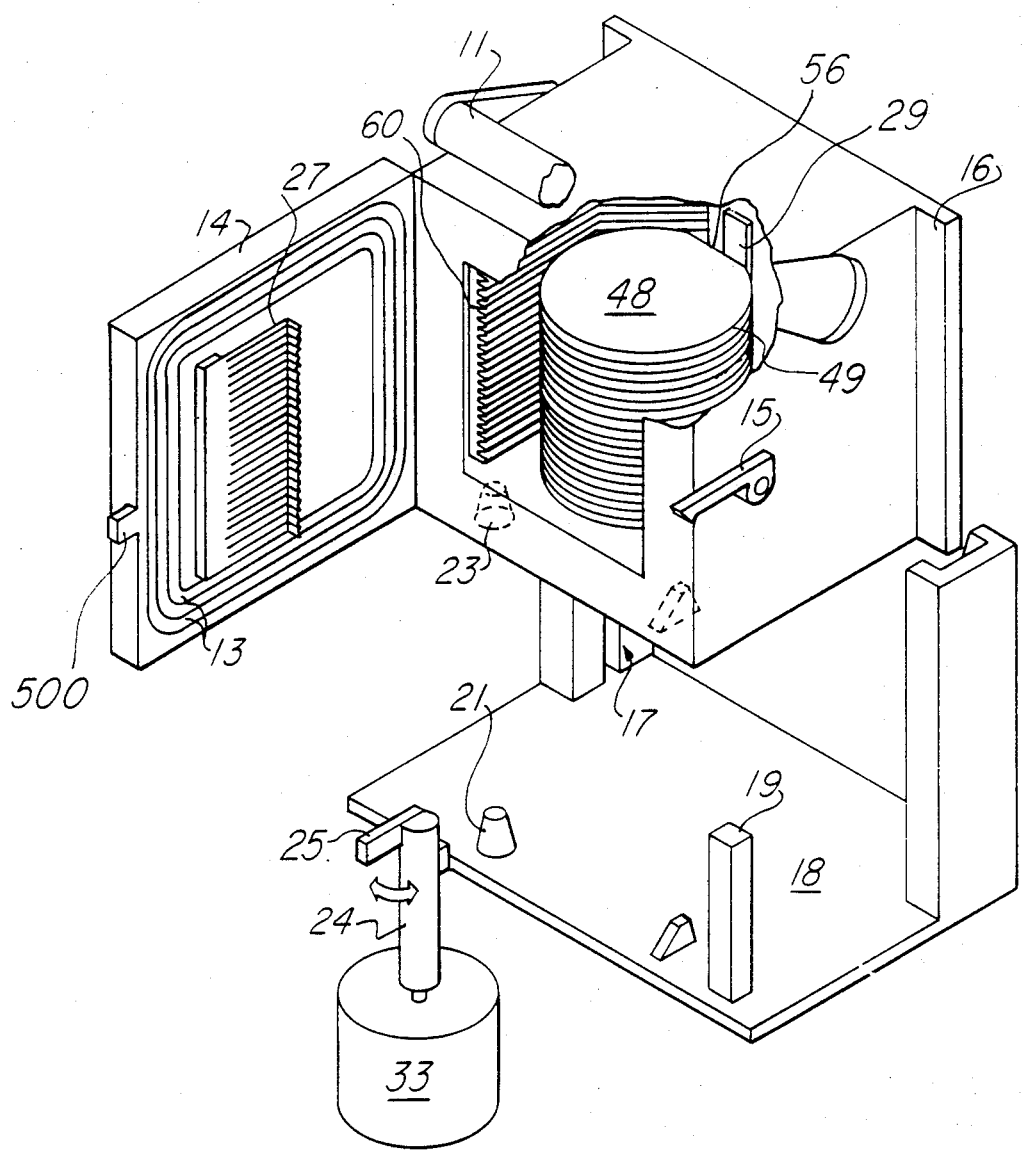
FIG. 4 shows a closer view of a sample embodiment of a multi-wafer vacuum wafer carrier 10, docked onto the position registration platform 18 inside a load lock like that of FIG. 1.

The vacuum wafer carrier 10 is shown with its door 14 open. The door 14 is mounted in a pivotal manner to one side (the left side as shown in FIGS. 1 and 4) of the main body of carrier 10 by, for example, hinges (not shown). The door 14 has a vacuum seal 13 (FIG. 4) where it mates with the body of the vacuum wafer carrier, so that the interior of vacuum wafer carrier 10 can be maintained for several days and possibly for several tens of days, without enough leakage to raise the internal pressure above $10^{-3}$ Torr, for example, while the exterior of carrier 10 is subjected to the atmosphere.

The vacuum wafer carrier 10 is adapted to dock with a position registrtion platform 18. The position registration platform 18 is only partially visible in FIG. 1, but is shown in more detail in FIG. 4. When a vacuum wafer carrier 10 is placed inside the vacuum load lock chamber 12, the position of the vacuum wafer carrier 10 will, therefore, be accurately known. The vacuum wafer carrier 10 has ears 16 which engage vertical slots 17 fixed to the position registration platform 18. The vacuum wafer carrier 10 can be slid into these slots until it rests on the position registration platform 18, and thereby assure that the position of the vacuum wafer carrier 10 is definitely known. It is also useful for the position registration platform 18 to include two tapered pins 21. As shown in FIG. 4, the pins 21 are both conical shaped but they can be of different shapes, for example, one conical and one wedge-shaped. The pins 21 are positioned to engage tapered holes 23 in the underside of the vacuum wafer carrier 10 when it is lowered with ears 16 engaged with slots 17. A wide variety of other arrangements could be used to assure mechanical registration. Thus, the use of slots 17, ears 16, and pins 21 being carrier 10 and chamber 12 into alignment for mechanical registration).

The vacuum wafer carrier 10 also has a safety catch 15 on it which secures the door 14 from opening due to external forces being accidentally applied. An ear 500 extends from the side of the door 14 away from the hinges (not shown) which attach it to the main body of carrier 10. The safety catch 15 can also be used to hold the door 14 closed if the carrier 10 is used as a non-vacuum carrier. The ear is adapted to engage with a safety catch 15 rotatably mounted on the side (the right side as shown in FIG. 4) of carrier 10. However, under normal conditions of transport, this safety catch is nt needed, since atmospheric pressure holds the door 14 shut against the internal vacuum of the vacuum wafer carrier 10. When the vacuum wafer carrier 10 is placed inside the vacuum load lock chamber 12 by engaging ears 16 with slots 17, a fixed finger 19 will engage the safety catch 15 and rotate it (upward as shown in FIG. 4) away from ear 500 to release it, so that the door 14 can be opened. Fixed finger 19 extends upward from platform 18 as shown in FIG. 4.

When the vacuum wafer carrier 10 is docked with the position registration platform 18, the door 14 will also be engaged with the top of door opening shaft 24. The door 14 can be provided with a shallow groove (not shown) in its underside, which mates with a finger and arm 25 on the top of the door opening shaft 24. The arm 25 is located to engage the door 14 near its attachment to the main body of carrier 10 in order to rotate the door 14 as desired. Thus, after the load lock has been pumped down so that differential pressure no longer holds the door 14 closed, the door can be opened by rotating (clockwise as shown in FIG. 4) door opening shaft 24. The door can be closed by rotating shaft 24 counterclockwise as shown in FIG. 4.

After the vacuum wafer carrier 10 is placed in the vacuum load lock chamber 12 (FIG. 1) and closed the load lock lid 20, a purge (with dry nitrogen or other clean gas), which can be at high pressure, is usefully applied through the manifold 22 (FIG. 1) inside the load lock lid 20. The manifold 22 includes holes in lid 20, a connection with a source of the gas into the holes in lid 20, and openings from the holes in the bottom of lid 20. The gas flows from the source through the holes in lid 20 and exits downward from lid 20 through the openings. The gas from the manifold 22 provides vertical flow which tends to transport particles downward. The gas flow from the manifold 22 also helps to remove some of the large particles which may have collected on the vacuum wafer carrier 10 during its exposure to atmospheric conditions.

After this initial stage (e.g. for 30 seconds or more), the chamber is then slowly pumped down to $10^{-3}$ Torr or less. This stage of the pump down should be relatively slow, in order not to stir up random particulates. That is, while low pressures do permit particles to fall from the air, those particles will still be available on the bottom of the chamber, and must not be stirred up if this can be avoided.

In order to make sure that the airborne particulates have actually fallen out of the chamber air, the interior of the vacuum load lock can then be allowed to stay at $10^{-3}$ or $10^{-4}$ Torr for a few seconds, to make sure that all of the particles which are able to fall out of the air will do so.

The use of the carrier 10 and chamber 12 in the manner described above greatly reduce the problems of airborne particulates, which have always been the dominant type of particulate transport, so that the problem of ballistically transported particulates can now be usefully addressed.

A sloped bottom and polished sidewalls for the load lock may be used as a modification of chamber 12. This would reduce the population of particulates sticking to the sidewalls and bottom which can be sent disturbed by mechanical vibration.

Note that vacuum gauges 62 (FIG. 1) are connected to the interior of the vacuum load lock chamber 12. The vacuum gauges 62 include a high-pressure gauge (such as a thermocouple), a low pressure gauge (such as an ionization gauge), and a differential sensor which accurately senses when the load lock interior pressure has been equalized with the atmosphere. The door of a vacuum wafer carrier 10 is not opened until the gauges indicate that desired vacuum has been achieved inside the load lock.

After a roughing pump and its isolation valve 702 (FIG. 31) has brought the chamber down to a soft vacuum, the gate or isolation valve 39 can be opened to connect the pump 38 to the interior of the load lock, and the pump 38 can then be operated to bring the pressure down to 10 to the $-3$ Torr or less.

At this point, the pressures inside the vacuum wafer carrier 10 and the vacuum load lock chamber 12 are more or less equalized, and the door 14 can be opened by activating by an door drive motor 26 (FIG. 4), which is connected to door opening shaft 24 through a vacuum feedthrough 33. Motor 26 rotates shaft 24 in a clockwise direction as shown in FIGS. 1 and 4 to open the door 14 and in a counterclockwise direction to close the door 14. Two sensor switches 708 (FIG. 31) are also included inside the vacuum load lock chamber 12, to ascertain when the door 14 is in its fully opened position, and when the door 14 is fully shut. Thus, after the load lock chamber 12 has been pumped down and allowed to sit for a few seconds, the door opening shaft 24 is rotated in a clockwise direction to open the door 14, until one sensor switch detects that the door is fully open.

During this time, the transfer arm 28 is kept in its home position at an elevation below the bottom of the door, so that the door 14 has clearance to open. After the sensor switch detects that the door 14 is fully open, the transfer arm 28 can begin to operate. In order to close the door 14, shaft 24 is rotated in a counterclockwise direction until the other sensor switch detects that the door 14 is closed.

Figure 9:
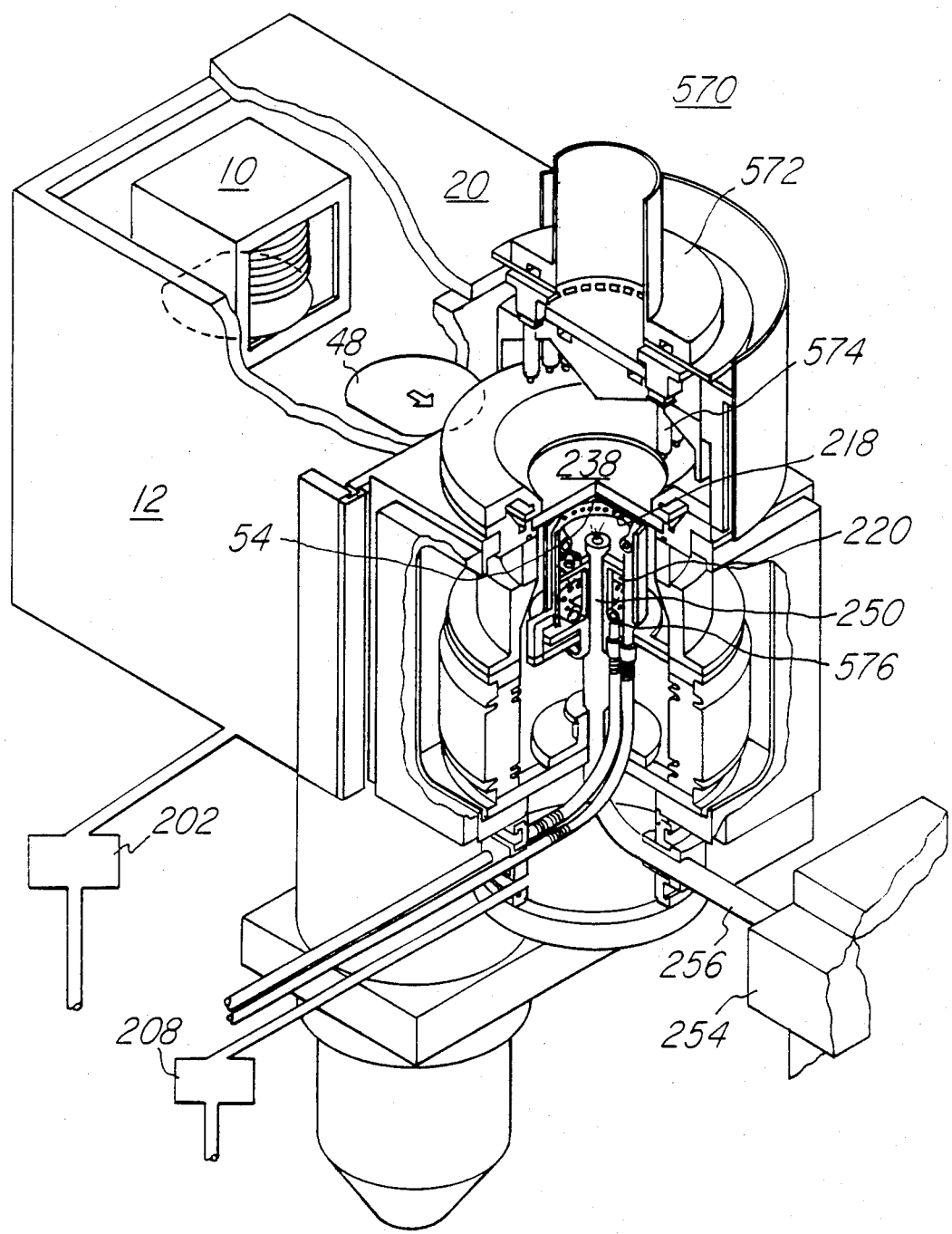
FIG. 9 shows an improved version of the process module of FIG. 6, in a sample embodiment which includes the capability for process enhancement by ultraviolet light generated in situ and also the capability is also provided for providing activated species (generated by gas flows through an additional plasma discharge which is remote from the wafer face) to the wafer face. The module is shown in a process station which includes only one module and one load lock, but can also be used in embodiments like that of FIGS. 5A and 5B.

The transfer arm 28 has two degrees of freedom. The arm is capable of both vertical and horizontal movement. One direction of motion permits the transfer arm 28 to reach into vacuum wafer carrier 10 or through interchamber transfer port 30 int o the adjacent process module, for example, process module 570 (FIG. 9). The other degree of freedom corresponds to vertical motion of the transfer arm 28, which permits selection of a wafer inside the vacuum wafer carrier 10 to remove, or which slot a wafer is placed into during a transfer operation.

An elevator drive motor 32 provides the elevation of the transfer arm 28, and the arm drive motor 34 provides the extension and retraction of the transfer arm 28. Neither of these motors requires a vacuum feedthrough since they are housed inside the exhaust manifold 36. The manifold 36, as shown in FIG. 1, has a cylindrical shape and extends from the bottom of chamber 12 downward. The manifold also extends through and is attached to the bottom of chamber 12 a short distance into chamber 12. The pump 38 is at the end of manifold 36 away from its attachment to chamber 12. The motor 26 also extends downward from chamber 12. Pump 38 can be, for example, a turbomolecular pump. The exhaust manifold 36 does not open directly into the vacuum load lock chamber 12, but instead has apertures 40 around its top (the end of manifold 36 extending into chamber 12). Thus, the exhaust manifold 36 is configured so that there is not a line of sight path from the elevator drive motor 32, the arm drive motor 34, or from the pump 38 to the vacuum load lock chamber 12. This reduces ballistic transport of particulates from these moving elements into the load lock chamber. The arrangement shown in FIG. 1 has been found useful but other arrangements are possible to provide the necessary transportation of the wafer 48.

The elevator drive motor 32 is connected to drive a sub-platform 42 up and down, and the arm drive motor 34 is mounted on this sub-platform 42 within the manifold 36. Motor 34 is fixed within manifold 36. The drive shaft of motor 32 drives a screw 510. Screw 510 passes through threads in sub-platform 42 to drive sub-platform 42 up or down dependent on the direction of rotation of the drive shaft of motor 32. Three rods 520, 521, and 522 pass through and are capable of sliding engagement with sub-platform 42. The rods are affixed to the top of manifold 36. Also affixed to sub-platform 42 is a tubular support 46. This linkage within the manifold 36 allows the transfer 28 to easily move vertically.

Another linkage is provided inside the rotatable transfer arm support 44 which permits the transfer arm 28 to move very compactly. The tubular support 46 extends form sub-platform 42 up through the top of manifold 36. The rotatable transfer arm support 44 is connected to to be driven by a rotating rod (not shown) within tubular support 46. The tubular support 46 is fixed to arm support 44. Thus, the rotating rod is driven by the arm drive motor 34 and in turn drives arm support 44 and the rotatable transfer arm support 44 is mounted on a tubular support 46 which does not rotate but moves up and down. An internal chain and sprocket linkage is used so that the joint between rotatable transfer arm support 44 and transfer arm 28 moves with twice the angular velocity of the joint between rotatable transfer arm support 44 and tubular support 46. Of course, many other mechanical linkages could alternatively be used to accomplish this. This means that, when the rotatable transfer arm support 44 is in its home position, a wafer 48 will be supported approximately above the tubular support 46, but when the rotatable transfer arm support 44 is rotated 90 degrees with respect to the tubular support 46, the transfer arm 28 will have been rotated 180 degrees with respect to the rotatable transfer arm support 44, so the transfer arm can either extend straight into the vacuum wafer carrier 10 or else straight through the inter-chamber transfer port 30 into the adjacent processing chamber. This linkage is described in greater detail in U.S. Pat. No. 4,659,413 issued to Davis et al on Apr. 21, 1987, which is hereby incorporated by reference.

Figure 3:
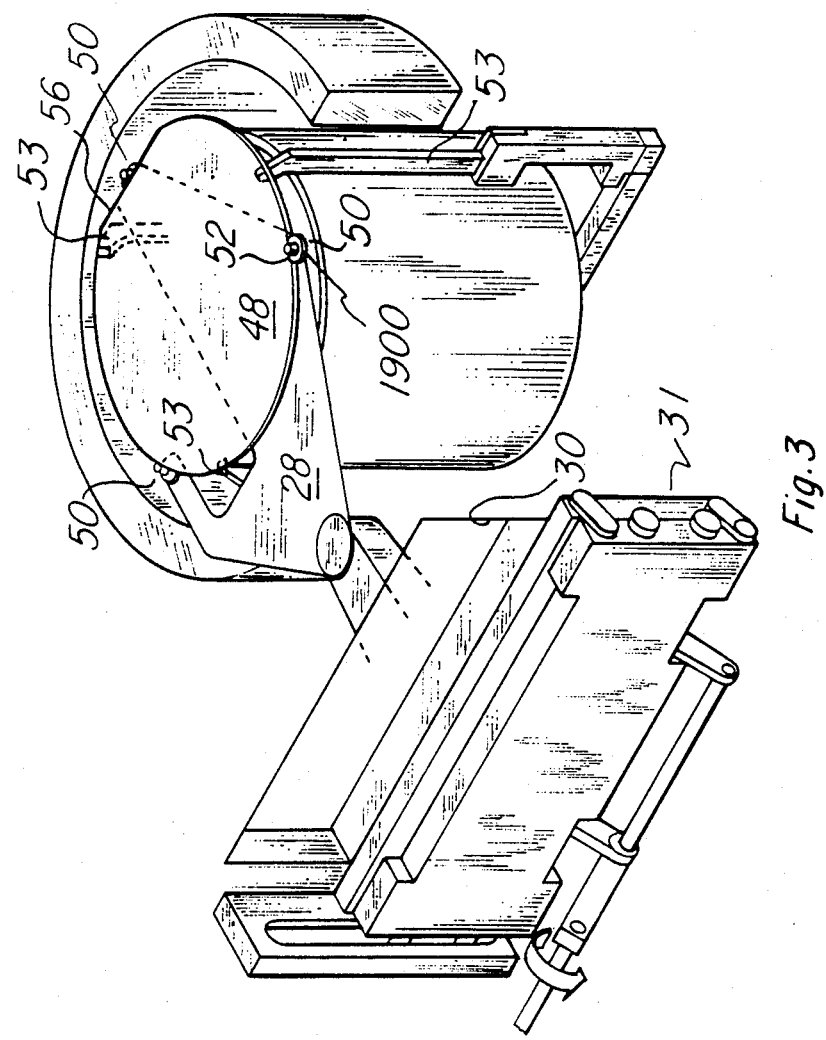
FIG. 3 shows a sample wafer transfer structure, in a process station, wherein the wafer is placed onto three pins by the transfer arm 28 reaching through the interchamber transfer port 30 from the adjacent vacuum load lock chamber 12.

The transfer arm 28 is a thin piece of spring steel, e.g. 0.030 inch thick. The transfer arm 28 has 3 pins 50 (FIGS. 1 and 3) on it to support the wafer 48. Each of the 3 pins 50 includes a small cone 52 (FIG. 3) on a small shoulder 1900 (FIG. 3). The small cones 52 and small shoulders 1900 can be made of a material which is soft enough to not scratch silicon. For example, these portions, which are the only portions of transfer arm 28 which actually touch the wafers being transported, can be made of a high-temperature plastic (i.e. a plastic with a relatively low propensity to outgas under vacuum) such as Ardel (a thermoplastic phenyl acrylate, made by Union Carbide) or Delrein. Note that the use of a small cone 52 at the center of each of the 3 pins 50 permits very slight misalignments of the wafer to the transfer arm 28 to be corrected. In other words the system of wafer transport described here is a stable mechanical system, wherein small misalignments during successive operations will not accumulate, but will be damped out. The contact with the wafer 48 and the pins 50 are only at the edge of the wafer.

Note that, in the positioning of the wafer 48 as shown, one of the 3 pins 50 rests against the flat portion 56 (FIG. 4) on the circumference 49 (FIG. 4) of wafer 48. This means that, in this embodiment, the 3 pins 50 on the transfer arm 28 do not define a circle of the same diameter as the diameter of the wafer 48 to be handled.

To assure that the flat portion 45 (FIG. 4) of each wafer 48 does not interfere with accurate handling of the wafers, the vacuum wafer carrier 10 has a flat contact surface 29 on its interior back side which the flat portion 56 of each wafer 48 will rest against. Elastic elements 27 (FIG. 4) on the inside surface of the door 14 pushes each wafer against this flat surface when the door 14 is closed, so that relative movement of the wafers and the carrier during transit is minimized, that is the wafers do not rub against the ledges 60. This also assures that, when the door 14 is opened, the location of the flat portion 56 on each wafer 48 is accurately known. That is the wafer is in a known predetermined alignment.

In operation, after the vacuum wafer carrier 10 is in the vacuum load lock chamber 12 with its door 14 open, the elevator drive motor 32 is operated to bring the transfer arm 28 to just below the height of the first wafer 48 which it is desired to remove, and the arm drive motor 34 is then operated to extend the transfer arm 28 into the interior of the carrier 10. This is the leftmost position of the three positions of arm 28 shown in FIG. 1. By operating the elevator drive motor 32 briefly, the transfer arm 28 is raised slightly until the 3 pins 50 around its circumference 49 lift the desired wafer off of the ledges 60 (FIG. 4) on which it has been resting inside the vacuum wafer carrier 10.

Note that the ledges 60, as shown in FIG. 4, are tapered surfaces rather than flat surfaces, so that contact between the ledges 60 and the wafer 48 resting on them is a line contact rather than an area contact, and is limited to the edge of the wafer. This prevents contact between carrier and wafer over a substantial area, possibly of many square millimeters, but the "line contact" used is over a much smaller area, typically of a few square millimeters or less. An alternative definition of the "line contact" used in this embodiment iss that the wafer support contacts the surface of the wafer only at points which are less than one millimeter from its edge. Thus, by raising the transfer arm 28, a wafer 48 will be picked up, and will be resting on the small cones or small shoulders 1900 of the 3 pins 50 on the transfer arm 28.

The ledges 60 can have a center-to-center spacing of 0.187 inches inside the vacuum wafer carrier 10. This center-to-center spacing, less the thickness of the wafers 48, must allow clearance enough for the height of the transfer arm 28 plus the 3 pins 50, but need not be much more. for example, the transfer arm is about 0.080 inch thick, including the height of the small cones 52 on the 3 pins 50. The wafer 48 can be, for example, about 0.021 inch thick so that about 0.0845 inch clearance is available. The thickness and diameters of the wafers can vary widely. Generally, larger diameter wafers will have greater thicknesses, but vacuum wafer carrier 10 of this kind is suited to use with such larger diameter wafers, since the size of the vacuum wafer carrier 10 and the center spacing of the ledges 60 inside the vacuum wafer carrier 10 can simply be adjusted appropriately. The carrier 10 can also be adapted to carry thinner wafers, for example, GaAs as desired.

After the transfer arm 28 has picked up the wafer 48, the arm drive motor 34 is operated to bring the transfer arm 28 to the home position (which is the middle position as shown in FIG. 1). This is the middle position of arm 28 as shown in FIG. 1. The elevator drive motor 32 is then operated to bring the transfer arm 28 to a height where it can reach through the inter- chamber transfer port 30 (FIG. 3).

The inter-chamber transfer port 30 is covered by an isolation gate 31. Although the gate 31 as shown in FIG. 3 seals the inter-chamber transfer port 30 by making sliding contact. When shaft 580 is rotated (as shown in FIG. 3), the linkage provided drives gate 31 upward (as shown in FIG. 3) and covers the port 30. To open the port 30 the shaft 580 is rotated in the opposite direction. If desired the sealing can be performed by a rotated movement. (Again, the absence of sliding contact may be advantageous to reduce internally generated particulates.) The isolation gate 31 over the inter-chamber transfer port 30 can operated by an air cylinder, but a stepper motor could be used in the alternative. Thus, a total of four motors can be used: two which use vacuum feedthroughs, and two which are contained inside the exhaust manifold 36. The arm drive motor is now operated again, to extend the transfer arm 28 through inter- chamber transfer port 30 into the adjacent processing chamber. This is the rightmost position of arm 28 as shown in FIG. 1. The adjacent processing chamber may be any one of many different kinds of process modules, for example, any processing module disclosed herein such as an implanter, a plasma etch, and a deposition module or any other type of process module.

The transfer arm reaching through the inter-chamber transfer port 30 will place the wafer 48 on wafer support pins 53 as shown in FIG. 3, like those used in the transfer arm 28 itself. (Note that the inter-chamber transfer port 30 should have enough vertical height to permit some vertical travel while the transfer arm 28 is extended through inter-chamber transfer port 30, so that transfer arm 28 can move vertically to lift a wafer from or deposit a wafer onto the wafer support, for example, wafer support pins 53 inside the processing chamber.) The wafer 28 is deposited by arm 28 on the tops of pins 53.

Alternatively, the processing chamber may include a fixture having spaced sloped ledges like the ledges 60 inside the transfer box, or may have other mechanical arrangements to receive the wafer. However, in any case, the arrangement used to receive the transferred wafer 48 must have clearance on the underside of the wafer (at least at the time of transfer), so that the transfer arm 28 can reach in on the underside of the wafer to emplace or remove it. If the wafer support pins 53 are used to receive the transferred wafer, it may be desirable to provide a bellows motion or a vacuum feed-through in order to provide vertical motion of the wafer support pins 53 inside the processing chamber. Thus, for example, where the processing chamber is a plasma etch or RIE (reactive ion etch) module, a bellows may be provided to move the wafer 48 vertically, for example, onto a susceptor after the transfer arm 28 has been withdrawn out of the way of the wafer 48.

Of course, the processing chamber may be an enginerring inspection module or deposition module, for example, A vacuum-isolated microscope objective lens will permit inspection of wafers in vacuum and (using an appropriately folded optical path) in a face-down position. This means that heavy use of engineer inspection can be made where appropriate, without the loss of engineer time and clean-room quality which can be caused by heavy traffic through a clean-room. The inspection module could be compbined with other modules if desired.

In any case, the transfer arm 28 is withdrawn, and the gate 31 is moved to the closed position to close port 30, if desired. The process of wafer 48 then proceeds. After processing is finished, the isolation gate over the inter-chamber transfer port 30 is opened again, the transfer arm 28 is extended again, the elevator drive motor 32 is operated briefly so that the transfer arm 28 picks up the wafer 48, and the arm drive motor 34 is again operated to bring the transfer arm 28 back into the home position. The elevator drive motor 32 is then operated to bring the transfer arm 28 to the correct height to align the wafer 48 with the desired slot inside of the vacuum wafer carrier. The arm drive motor 34 is then operated to extend the transfer arm 28 into the vacuum wafer carrier 10, so that the wafer 48 which has just been processed is sitting above its pair of ledges 60. The elevator drive motor 32 is then briefly operated to lower the transfer arm 28, so that the wafer is resting on its own ledges 60, and the arm drive motor 34 is then operated to retract the transfer arm 28 to home position.

The sequ3ence of steps described above is then repeated, and the transfer arm 28 selects another wafer for processing.

Note that, with the mechanical linkage of the transfer arm 28 and rotatable transfer arm support 44 described above, the wafers being transferred will move in exactly a straight line if the center to center lengths of transfer arm 28 and transfer arm support 44 are qual. This is advantageous because it means that the side of the wafer being transferred will not bump or scrape against the sides of the vacuum wafer carrier 10 when the wafer is being pulled out of or pushed into the box. That is, the clearances of the vacuum wafer carrier 10 can be relatively small (which helps to reduce particulate generation by rattling of the wafers during transport in the carrier) without risking particulate generation due to abrasion of the wafers against the metal box sides.

Processing continues in this fashion, wafer by wafer, until all the wafers inside the vacuum wafer carrier 10 (or at least as many of them as desired) have been processed. At that point the transfer arm 28 is returned empty to its home position and lowered below the lower edge of the door 14, and the isolation gate 31 over inter-chamber transfer port 30 is closed. Shaft 24 is rotated to close door 14 and the provide initial contact for the vacuum seals between door 14 and the flat front surface of vacuum wafer carrier 10, so that the vacuum wafer carrier 10 is ready to be sealed (by pressure differential) as the pressure inside the load lock is increased. The vacuum load lock chamber 12 can now be pressurized again. When the differential sensor of the vacuum gauges 62 determines that the pressure has come up to atmospheric, the load lock lid 20 can be opened and the vacuum wafer carrier 10 (which is now sealed by differential pressure) can be manually removed. A folding handle 11 is usefully provided on the top side of the carrier, to assist in this manual removal without substantially increasing the volume required for the vacuum wafer carrier 10 inside the load lock.

After the vacuum wafer carrier 10 has been removed, it can be carried around or stored as desired. The vacuum seal 13 will maintain a high vacuum in the vacuum wafer carrier 10 so that particulate transport to the wafer surfaces (and also adsorption of vapor-phase contaminants) is minimized. The surface of wafers within the carrier 10 have the surface which is being processed to construct devices are facing downward to prevent particulates from settling on that surface.

Note that the vacuum wafer carrier 10 also includes elastic elements 27 mounted in its door. These elastic elements 27 exert light pressure against the wafers 48 when the door 14 is closed, and thus restrain them from rattling around and generating particulates. The elastic elements 27 are configured as a set of springs in the embodiment shown, but other mechanical structures (e.g. a protruding bead of an elastic polymer) could alternatively be used to configure this. Where the wafers used have flats, a flat contact surface 29 is provided on the inner back surface of the vacuum wafer carrier 10 for the wafer flats to be pressed against.

Note also that the ledges 60 on the sidewalls of the vacuum wafer carrier 10 are tapered. This helps to assure that contact with the supported surface of the wafer is made over a line only, rather tha over any substantial area. This reduces wafer damage and particulate generation during transport. This also assists in damping out the accumulation of positioning errors, as discussed. The load lock lid 20 can have a window (not shown), to permit inspection of any possible mechanical jams.

An advantage of such embodiments is that, in the case of many possible mechanical malfunctions, the door of the vacuum wafer carrier 10 can be closed before attempts are made to correct the problem. For example, if somehow the transfer arm 28 picks up a wafer so that the wafer is not sitting properly on all three of the 3 pins 50, the door drive motor 26 can be operated to close the door 14 before any attempts are made to correct the problem. Similarly, the inter-chamber transfer port 30 can be closed if the transfer arm 28 can be retracted into home position. It may be possible to correct some such mechanical misalignment problems simply by deviating from the normal control sequence. For example, the position of a wafer 48 on the transfer arm 28 may in some cases be adjusted by partially extending the transfer arm 28, so that the edge of the wafer 48 just touches the outside of the door 14, or of the isolation gate over the inter-chamber 12 can be brought back up to atmospheric pressure (with the door 14 of vacuum wafer carrier 10 closed) and the load lock lid 20 opened so that the problem can be manually corrected.

Figure 6:
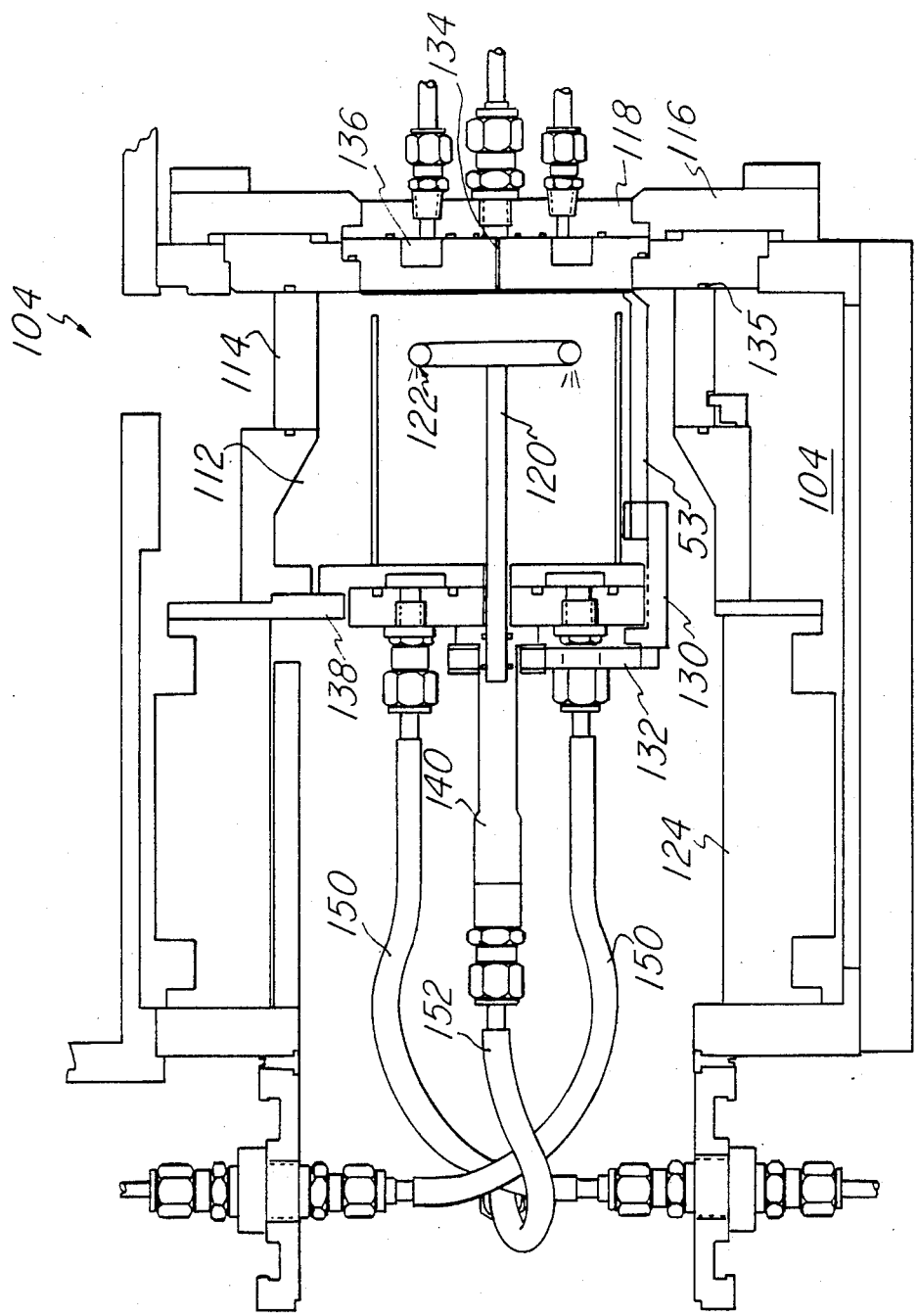
FIG. 6 shows a configuration for a process module, which can be used as one of the process modules inside the process station shown in FIGS. 5A and 5B.
Figure 7:
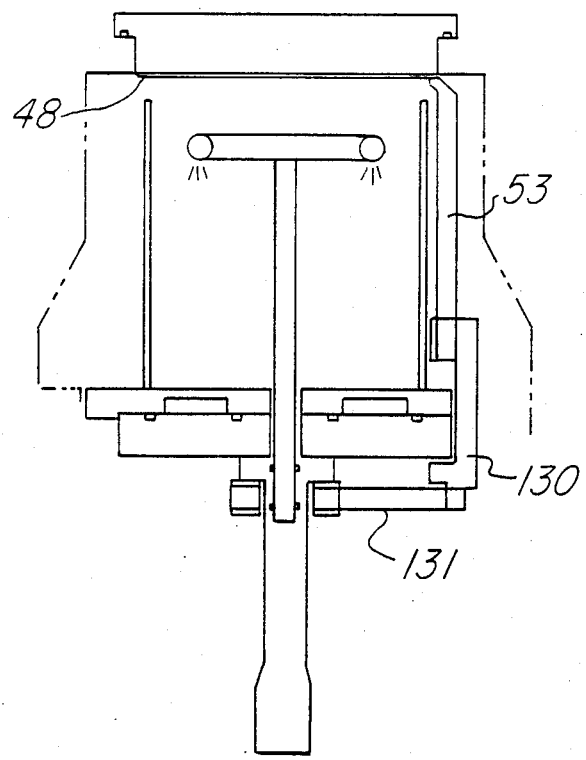
FIG. 7 shows the plasma reactor of FIG. 6 in the closed position, as it would be during the actual etch process.

FIGS. 6, 7, and 8 show a single wafer reactor which can be used for reactive ion etching. Many of the process modules described in the present application incorporate at least some of the ideas and advantages of this embodiment, together with additional ideas and additional advantages derived therefrom. (A very similar reactor design can be used for plasma etching, i.e. etching at pressures higher than 100 mTorr. The terms "plasmas etching" and "reactive ion etching" (or "RIE") are sometimes kept distinct in the art, with RIE being usede to refer to etching under conditions where plasma bombardment is large, i.e. at lower pressure and with teh wafer mounted on the powered electrode. This distinction will not be rigorously observed in the present application. The teachings of the present application are applicable to both plasma and RIE etching as conventionally distinguished, although some of the several featrues taught by the present application are more advantageous in the context of RIE etching processes.

Figure 5A:
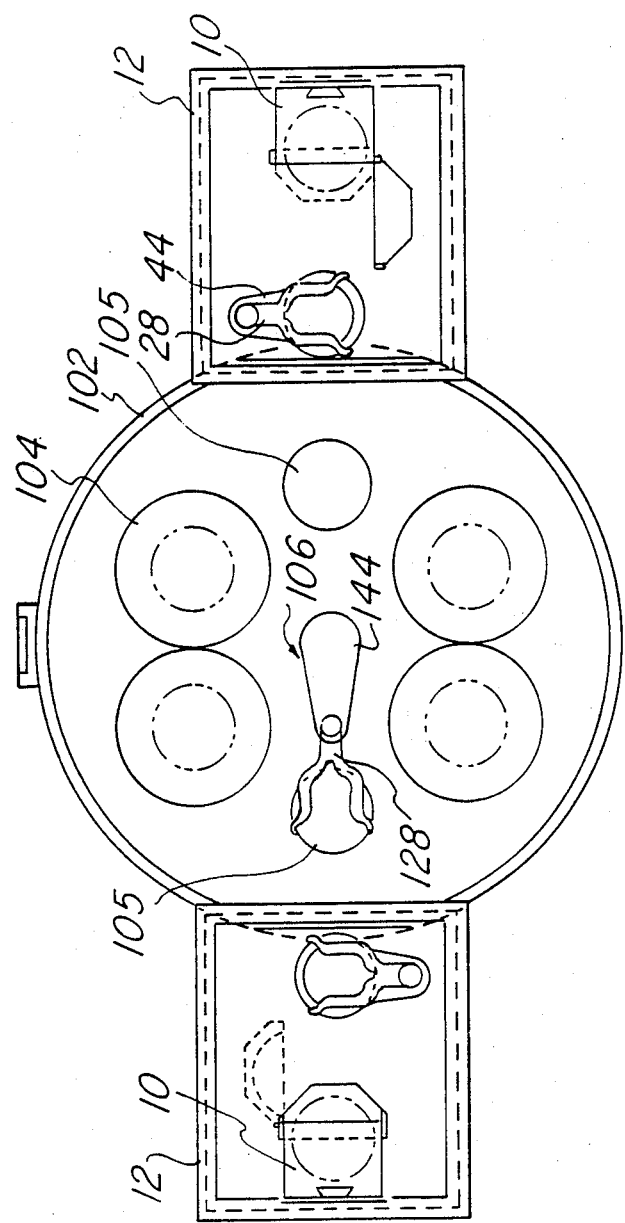
FIGS. 5A and 5B show a plan view of a sample process stations including process modules and wafer transfer stages, and a load locks.
Figure 5B:
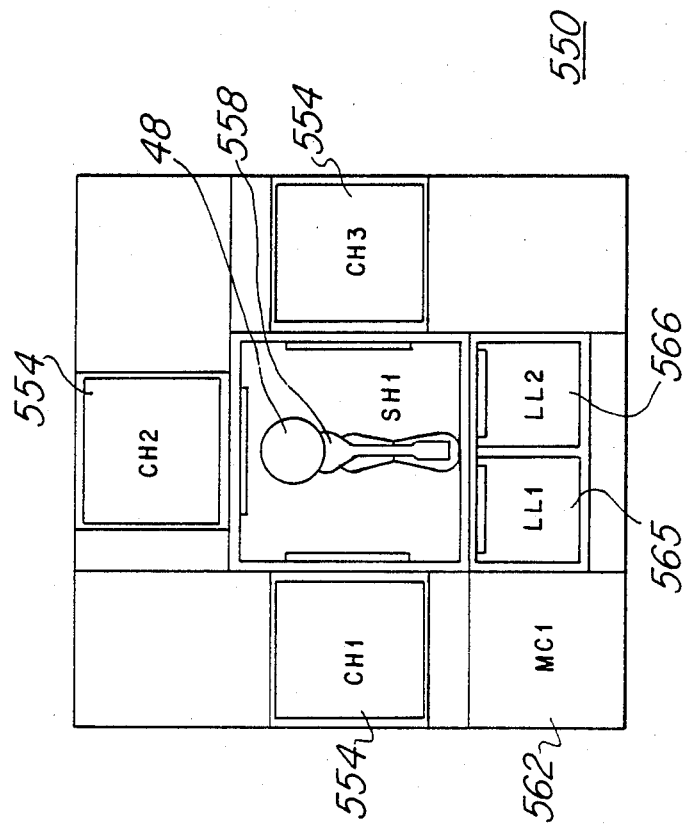

FIG. 6 shows a process module 104, which can be used in processing system such as is shown in FIGS. 5A and 5B, as discussed below.

FIG. 6 shows a single wafer reactor which can be used for reactive ion etching or for plasma etching. As discussed above, the transfer arm 28 places a wafer onto the wafer support pins 53 (FIG. 4) and then retracts. At this point the whole lower assembly, including the chamber 112, ground electrode 110, process gas distributor 120, base plate 138, and quartz cylinder 114 are moved upward, using, e.g., an air cylinder or a vacuum feed through (not shown). A bellows 124 permits this vertical motion to occur while maintainin a vacuum-tight interface to the interior of the module 104. This vertical motion causes the backside of the wafer resting on the wafer support pins 53 to make contact with the powered electrode 118, and at this point the sliding pin supports 130 which are attached to the underside of the wafer support pins 53 retract slightly against a leaf spring 132. (Other elastic elements could be used in place of leaf spring 132, to assure a small amount of give in the sliding pin supports 130, so that the wafer is not pressed against the powered electrode 118 with too much force.)

The last portion of the upward travel of this assembly causes the seal 135 (FIG. 7) to make closure between the quartz cylinder 114 at the top of the chamber 112 and the quartz piece 116 which surrounds the powered electrode 118. Thus, when the seal is made, the interior of this process chamber is vacuum-sealed from the remainder of the interior of process module 104.

A helium bleed port 134 is provided to connect a helium supply to the back of the wafer. This helium space means that the space between the low points of the powered electrode 118 and the wafer will be filled with helium, rather than vacuum, and this assure a reasonably low-thermal-resistance and highly repeatable thermal contact between the wafer and the powered electrode 118. The powered electrode 118 can include coolant manifold spaces 136, to which coolant can be supplied.

In an alternative embodiment, the pins 53 are not mounted on sliding pin supports 130 supported by leaf spring 132, but are fixed. Since the helium bleed port 134 assures good thermal contact betwee the back sides of the wafer and the surface of the powered electrode 118, a tolerance of several thousandths of an inch will still permit good RF coupling of the powered electrode 118 to the wafer 48, and still permit good thermal contact between the powered electrode 118 and the wafer 48. A tolerance of this magnitude should provide enough allowance for thermal expansions of chamber walls, variation in seal thickness, variation in wafer thickness, etc., to still permit reliable sealing of the lower chamber portion to the upper portion. Note that, in this embodiment, the quartz cylinder 114 and quartz piece 116 would usefully be shaped slightly differently, to minimize the lateral spread of the plasma adjacent to the face of the wafer. However, it has been found that utilizing sliding pin supports 130 permits the quartz cylinder 114 to confine the plasma closely near the wafer face 54 as shown in FIG. 7.

FIG. 7 shows the upper portion of the process module of FIG. 6, in the closed position, with a wafer 48 held therein for processing. After the reactor has been closed, the helium bleed can be started through helium bleed port 134 (FIG. 6). At the same time, desired process gases can be provided through a process gas distributor 120.

The process gas distributor 120 is made of quartz, so that it does not pick up eddy currents from the RF power present. Moreover, since the surface of the quartz is highly insulating, the plasma boundary near the quartz will not have as much voltage nor as much current across it as the plasma boundary near a grounded conductive element would. This means that plasma-assisted reactions near the quartz will not occur at as high a rate as they would near a grounded conductive element, so that deposition is reduced. It should also be noted that quartz is a fairly good thermal insulator, and the temperature of the susceptor may therefore be raised (by radiation from the plasma) to 100 or 200 degrees C. This is advantageous for some processes, since raising the temperature of the distributor will further reduce deposition on it.

Under typical RIE operating conditions (10 to 200 microns of pressure, and 100 to 800 watts of applied power) the generated plasma will fill the chamber between the powered electrode 118 and the ground electrode 110 fairly uniformly. Thus, the process gas distributor 120 protrudes into the densest part of the plasma. The process gas distributor 120 is a ring, of perhaps one-half the diameter of the wafer being processed, with hollow supports which lead dow to gas connections 140 (FIG. 6) mounted in the base plate 138. A quick-connect mounting is provided for the quartz process gas distributor 120, so it can rapidly and easily be changed out as desired.

The process gas distributor 120 is usefully spaced away from the surface of the wafer by only four centimeters, for example. This spacing, and the exact shape of the process gas distributor 120, and the spacing of the gas feed ports 122 on the gas distributor, are not critical. These parameters can be changed if desired, but, if modified, they should be selected so that diffusion of process gases and process gas products from the gas feed ports 122 in the process gas distributor 120 provides: (1) diffusion-dominated transport of the process gases and process gas products to the plasma coundary at the face of the wafer 48; and (2) a fairly uniform concentration of process gases and process gas products at the plasma boundary next to the face of wafer 48. For example, the spacing of the process gas distributor 120 away from the wafer face could be anywhere in the range from one to fifteen centimeters.

Under these low pressure conditions, and given the high area ratio between the area of the powered electrode 118 in contact with the plasma (which, in this embodiment, is essentially the same as the area of wafer 48), and the grounded electrode area (which in this embodiment is essentially the area of ground electrode 110, plus the interior area of chamber 112 and the exposed upper area of base plate 138), a high density of plasma bombardment will occur at the face wafer face 54. As is well-known to those skilled in the art, this plasma bombardment assists in achieving desirable anisotropy effects during etching.

The ground electrode 110 can be cooled, using coolant lines 150 (FIG. 6) connected to manifold cavities inside the ground electrode 110. If additional cooling is needed, the chamber 112 may also be cooled. Note that coolant lines 150 are flexible hoses, to accommodate the vertical travel of the whole lower etching chamber 138 as described above. The gas supply tube 152, which supplies process gases through gas conections 140 to the process gas distributor 120, is also flexible for the same reason. If flexure of these hoses is found to generate excess particulates, a gas feed outside the bellows 124, through the side of the base plate 138, could be used instead.

FIG. 8 shows a plan view of the reactor of FIG. 6. The shape of the process gas distributor 120 can be seen more clearly in this plan view. It can also be seen that the base plate 138 includes substantial spaces around the edge of the ground electrode 110, which provide a passage from the gas feed ports 122 (FIG. 6) to a vacuum pump below. The overall gas flow in this reactor is downward, away from the face of the wafer, which assists in reducing particulates. An optional modification is the use of an in situ vacuum particle counter in the chamber 112, so that any increase in particle population in the critical volume can be detected and the opening of chamber 112 delayed until the particle count reaches selected level.

After the desired etching operation is finished, the gas supplied through process gas distributor 120 is cut off, and the process module 104 is pumped down to the same pressure as the rest of the process module (10 to the −3 Torr or less). A holding time may then be interposed, for thermal stabilization of the process module or for release of possible suspended particulates, and then the process module 104 is opened and arm 28 operates as described above to remove the wafer from chamber 12. The position of the arm 28 with the chamber 12 would be the rightmost position of arm 28 shown in FIG. 1.

Figure 10:
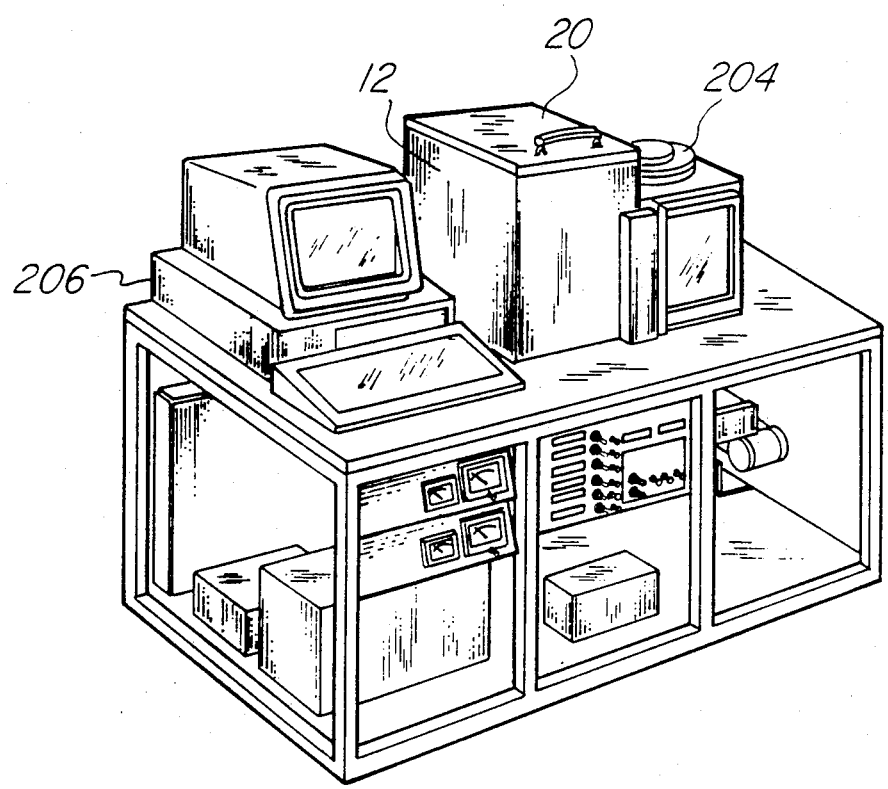
FIG. 10 shows a physical configuration for a process station which can be used for implementing some of the embodiments described herein.

Note that all of the operations described above can be very easily controlled. No servos or complex negative feedback mechanisms are needed. All the motors described are simple stepper motors, so that multiple modules of this type can be controlled by a single computer control system 206 (FIG. 10). The mechanical stability of the system as a whole—i.e. the inherent correction of minor positioning errors provided by the tapering of the wafer support pins 53, by the slope of the ledges 60 in the wafer carrier, and by the flat contact surface 29 on the backwall of the vacuum wafer carrier 10—helps to prevent accumulation of minor errors, and facilitates easy control.

This advantage of simple control is achieved in part beacuse good control of mechanical registration is achieved. As noted, the docking of the vacuum wafer carrier 10 with position registration platform 18 provides one element of mechanical registration, since the location of the position registration platform 18 with respect to the transfer arm 28 can be accurately and permanently calibrated. Similarly, the vacuum wafer carriers 10 do not need to be controlled on each dimension, but merely need to be controlled so that the location and orientation of the ledges 60 are accurately known with respect to the bottom (or other portion) of the vacuum wafer carrier 10 which mates with position registration platform 18. As described above, this is accomplished by having channels which the vacuum wafer carrier 10 slides into until it rests on the position registration platform 18, but many other mechanical arrangements could be used instead. Various types of electronic and mechanical sensors could provide information about the position and operation of the system for further control and corrective action by the computer control system 206.

Similarly, mechanical registration must be achieved between the home position of the transfer arm 28 and the 3 pins 50 (or other support configuration) which the wafer will be docked to inside the processing chamber. However, this mechanical registration should be a simple one-time setup calibration. Note that angular positioning will be preserved by the vacuum wafer carrier itself, as was noted, whenever the door 14 is closed, spring elements inside it will press each wafer 48 against the flat contact surface 29 of the vacuum wafer carrier 10. Optionally, the vacuum wafer carrier 10 could be provided with a quick-connect vacuum fitting, to permit separate pumpdown on the vacuum wafer carrier 10.

It should be noted that the load lock mechanism described need not be used solely with vacuum wafer carriers 10, although that has been could to be useful. This load lock can also be used with wafer carriers which carry atmospheric pressure inside. Although this is an alternative embodiment, it still carries substantial advantages, as is discussed above, over prior art load lock operations such as that shown in U.S. Pat. No. 4,609,103, by Bimer et al, issued on Aug. 27, 1984, which is incorporated by reference hereinto.

It should be noted that a vacuum wafer carrier 10 as described can be made in different sizes, to carry any desired number of wafers. Moreover, a vacuum wafer carrier 10 of this kind can be used to carry or store any dsired number of wafers, up to its maximum. This provides additional flexibility in scheduling and process equipment logistics.

FIG. 5A shows a sample further alternative embodiment wherein two load locks, each containing a vacuum wafer carrier 10, are both connected to a process station 102 which contains four process modules one or more of which can be process module 104 or the other process modules disclosed herein or any other suitable module. Unlike the embodiment described above, when the transfer arm 28 reaches through the inter-chamber transfer port 30 from a vacuum load lock chamber 12 into the process station 102, it places the wafer 48 onto one of two wafer stages 105. These wafer stages 105 can be three pin supports similar to pins 53 or two ledge supports, or may have other mechanical configurations as long as there is space underneath the supported wafer for the transfer arm 28 to lower free of the wafer and retract after it has placed the wafer on the supports. The wafer support used should be such as to make line contact, rather than contact over any substantial area, with the under surface or edge of the wafer.

Another transfer arm assembly 106 is provided inside the process station 102. This transfer arm assembly is generally similar to the transfer arm 28, rotatable transfer arm support 44 and tubular support 46 as used inside the chamber 12, but there are some differences. First, the transfer arm 28 used inside the load lock only needs to move wafers in a straight line. By contrast, the transfer arm assembly 106 must also be able to move radially, to select any one of the process modules 104. Thus, an additional degree of freedom is needed. Second, the reach of the transfer arm assembly 106 need not be the same as the transfer arm 28, the rotatable transfer arm support 44, and tubular support 46 used inside the load lock, and in fact the reach of transfer arm assembly 106 can be larger, to permit adequate spacing of the process modules 104. Third, the transfer arm assembly 106 does not need as much travel in elevation as the transfer arm 28 used in the load locks. Fourth, in the configuration shown, the transfer arm assembly 106 will not have one of its 3 pins 60 resting on a wafer flat, so that the diameter of the circle defined by 3 pins 60 is not the same for tansfer arms 28 and 128, even through they are handling wafers of the same diameter.

The tubular support of assembly 106 can be made rotatable and providing a third motor to drive this rotation. Thus, a third degree of freedom for the transfer arm is provided. Similarly, the dimensions of the transfer arm 128 of assembly 106 can simply be scaled as desired. Thus, transfer arm assembly 106 usefully includes a transfer arm rotatably mounted on a transfer arm support 144. The transfer arm support 144 is pivotably mounted to a tubular support (not shown), and an internal shaft, fixed to the transfer arm support 144, extends down through the tubular support. An internal chain drive with two to one gearing translates any differential rotation between tubular support 146 and transfer arm support 144 into a further differential rotation, i.e., over twice as many degrees between transfer arm support 144 and transfer arm 128. An arm drive motor, mounted below the transfer arm assembly 106, is connected to rotate the shaft which is fixed to transfer arm support 144. An arm rotation motor is connected to rotate the tubular support 146. Finally, an elevator mechanism provides vertical motion of the transfer arm assembly 106.

Note that the vertical motion required of transfer arm assembly 106 is not typically as much as that required of the transfer arm 28 in the vacuum load lock chamber 12, since the transfer arm 128 will typically not need to select one of several vertically separated wafer positions like those in the vacuum wafer carrier 10, but will typically merely be used to pick and place wafers from a number of possible wafer fmodules which are all in approximately the same plane. Thus, optionally the vertical elevation of the transfer 128 could be controlled by an air cylinder rather than by an elevator motor assembly as discussed above.

Thus, by rotating the tubular support of assembly 106 simultaneously with the transfer arm support 144, the transfer arm assembly 106 can be rotated without being extended. After the transfer arm assembly 106 has been rotated to the desired position, the tubular support 146 can be held fixed while the transfer arm support 144 is rotated, and this will cause the transfer arm 128 to extend as described in connection with arm 28.

Thus, after transfer arm 28 from one of the vacuum load lock chambers 12 has placed a wafer 48 to be processed on one of the wafer stages 105. The transfer arm assembly 106 is rotated, if necessary, extended at a low position so that transfer arm 128 comes underneath the wafer, elevated so that trnasfer arm 128 picks up the wafer 28, and retracted to its home position. The transfer arm assembly 106 is then rotated again, and the transfer arm 128 is extende, so that the wafer is now located above a wafer support in one of the process modules 104, or above the other wafer stage 105. By lowering the transfer arm assembly 106, the wafer 48 can now be placed on a wafer support within process modules 104 or the wafer stage 105, and the transfer arm 128 can onw be retracted The process module 104 can now be sealed off from the main process station 102, and separate single-wafer processing of the wafer can begin. Meanwhile, the transfer arms 128 and 28 can perform other operations. What a wafer in a process module 104 has completed processing, that process module 104 can then be pumped down to the same low pressure as the interior of process station 102, and process module 104 can be opened. The transfer arm assembly 106 can now be operated to remove this wafer, and transfer it either to one of the wafer stages 105 or to another one of the process modules 104.

One advantage of such embodiments is that the process modules 104 can all be configured to do the same operation, which will permit wafer transport-limited throughput, even for fairly slow processing operations, if there is a sufficient number of process modules 104 in the process station 104; or, alternatively, different operations can be used in different ones of the process modules 104.

That is, such embodiments facilitate the use of sequential processing, which is increasingly recognized as desirable, since processing variations caused by adsorbed contaminants or by native oxide are eliminated. For example, two of the process modules 104 can be configured for oxide growth, one for nitride deposition, and one for polysilicon deposition, to permit complete in situ fabrication of oxynitride poly-to-poly capacitors. Moreover, the provision of different process steps in the different process modules 104 means that many lot splits and process variations can be performed simply by programming the appropriate operations, without relying on manual identification of which wafers should go to which machines. Thus, the capability to have different operations proceed in different ones of the sample process modules 104 provides additional processing flexibility.

Note also that the overall wafer transfer sequence is completely arbitrary, and may be selected as desired. For example, the wafers from one vacuum wafer carrier 10 could be completely processed and returned to that vacuum wafer carrier 10, and the vacuum load lock chamber 12 containing the just-processed wafers could be sealed off from process station 102, so that the wafers in the other vacuum wafer carrier 10 in the other vacuum load lock chamber 12 could be processed while the vacuum wafer carrier 10 full of processed wafers is removed from the other vacuum load lock chamber 12. Alternatively, the programmability and random access of this arrangement could be used to shuffle and interchange wafers between the two vacuum wafer carriers 10 in whatever fashion desired.

It should also be noted that this arrangement is not at all limited to two vacuum load lock chambers 12 nor to four process modules 104, but the arrangement described can be scaled to other numbers of process modules 104 in a station 102, or other numbers of vacuum load lock chambers 12 attached to a station 104, or to use of more than one transfer arm assembly 106 inside a station, if desired.

Note that this arrangement still preserves wafer orientation. Assuming that wafers are carried in vacuum wafer carrier 10 with their flat portion 56 toward flat contact on the back of carrier vacuum wafer carrier 10, they will be placed on wafer stage 105 with their flat portin 56 toward the center of station 102. Transfer arm assembly 106 will preserve this orientation, so that, when the wafer 48 is replaced in either vacuum wafer carrier 10, it will have its flat portion 56 toward the flat contact surface 29 on the back of the vacuum wafer carrier 10.

FIG. 5B shows a process station 550 which has three process modules 554 which can be any of the process modules shown herein such as process module 104 or another appropriate process module. The process modules 554 can be the same type of process module, each can be different, or two can be same and the other different. The transfer arm assembly 558, which is similar to transfer arm assembly 106 in FIG. 6, adapted to transfer the wafer between any of the process modules 554 in any order under the control of the computer control system 562. The vacuum load lock chambers 565 and 566 are similar to chamber 12 in FIG. 1. The arm 558 can reach into modules 554 and chambers 565 and 566 to remove or deliver wafers (only wafer 48 is shown in FIG. 5B. The computer control system 562 supplies the necessary control for modules 554, assembly 558, and chambers 565 and 566. The routing of the wafers can be from any chamber 565 and 566 to any process module 554, between any desired process modules 554, and from any process module 554 to any chamber 565 and 566.

A closed loop particle control system is usefully provided to control the operation of the load lock and the process chamber before and after processing operations in any of the chambers 565 ad 566, as discussed above in connection with chamber 12 (FIG. 1).

FIG. 9 shows an improved version of the process module of FIG. 6. in an embodiment which includes the capability for process enhancement by ultraviolet light generated in situ and the capability is also provided for providing activated species, generated by gas flows through an additional plasma discharge which is remote from the wafer face to the wafer face. The module is shown in a process station 570 which includes only one module and one vacuum load lock, but can also be used in embodiments like that of FIGS. 5A and 5B, where a central handling chamber is combined with plural process modules 104 and one or more vacuum load lock chambers 12.

Note that a particulate sensor 202 (FIG. 9) is explicitly shown connected to the interior of the vacuum load lock chamber 12. This particulate sensor 202 need not be physically located very close to the docking position of vacuum wafer carrier 10, as long as the signal from particulate sensor 202 does provide an indication of the level of particulates present in the interior of the vacuum load lock chamber 12. The particulate sensor 202 is usefully located downstream from the vacuum load lock 12, in the pump out path (not shown). The particle sensor is a commercially available laser particle counter (which detects individual particles) combined with a counter which provides an output signal showing the number of particles counted over a certain time duration. The ultraviolet plasma space 220 is supplied with a gas useful for the production of ultraviolet light, for example, $H_2$, Ar, or He through ring 576. The frequency of the power utilized to generate the ultraviolet light can, for example, 100 KHz or 13.56 MHz. The module 570 has a process chamber 218 whch can have gas introduced through either a distributor 212 or feed 250. Ozone, for example, could be feed through distributor 212. A transparent vacuum wall 238 allow the radiant heat from a heating module 572 to pass through to wafer 48 below.

The following process can also be used with FIG. 9 and the other process modules which have ultraviolet light and remote plasma capability.

One process which can be used with module 570 is for the deposition of polysilicon utilizing either or both an additional ultraviolet generated in side module 570 (which is directly optically coupled into the process chamber 218) and a remotely generated plasma from remote plasma chamber 254. A silane gas is introduced into the process chamber. If the remote plasm is not used then the silane gas can also be introduced into chamber 218 through distributor 212. The chamber should be maintained at deposition temperature. After the wafer is disposed with chamber 28, a purge can be performed if desired by utilizing an appropriate gas which is non-reactive with the wafer and the exposed layers thereon, for example, $N_2$. An example of this process follows: the wafer is placed in the chamber. The chamber is evacuated and purged with $N_2$ (in general the pressures usable within the chamber are between 0.1 to 750 Torr). A remote plasma is generated within chamber 254 from silane gas. The remote plasma is introduced into the chamber 218 and to the downward facing face 54 of wafer 48. The chamber is heated to the deposition temperature of, for example, 550 to 700 degrees by exciting the gas therein, for example, $H_2$, Ar, or He introduced through ring 576 using a power of 300 watts at a frequency of 100 KHz. The reaction is as follows:

$$SiH_4 > SiH_2 + Si_2H_6 > Polysilicon + H_2$$

where the light enhances deposition by increasing the molecular excitation level. The gases and heat is turned off and the chamber is again purgd, with an appropriate gas, if desired. The wafer is then removed. A cleaning step can then be performed as desired utilizing a remote plasma formed from a mixture of HCl and HBr.

Another useful process is the deposition of silicon nitride. A source of nitrogen is used to generate a remote plasma. Locally generated ultraviolet energy is coupled into the process chamber, as discussed above. A gas mixture of a source of silicon, for example, dichlorosilane (DCS) is introduced into the process chamber and to the face 54 of the wafer. The remote plasma and the ultraviolet energy in combination allow the deposition rate to be raised to an acceptable level. A sample process follows:

1. Disposing the wafer into the process chamber face down and the chamber closed.
2. Evacuating the process chamber and then purging with an appropriate gas, for example, $N_2$, if desired.
3. Generating a remote a plasma from a gas mixture of DCS and a source of nitrogen, for example, $N_2$ or $NH_3$, is introduced into the process chamber.
4. Heating the process chamber to the deposition temperature, for example, between 550 and 800 degrees C.
5. Generating ultraviolet energy coupled into the process chamber which is absorbed by the process gases to increase the molecular excitation level of the DCS.
6. Halting gas flows and heating and purging the chamber with an appropriate gas, for example, $N_2$.
7. Opening the process chamber and removing the wafer from the process chamber.
8. Cleaning the process chamber using a gas mixture of, for example, $CF_4$ and $O_2$.

During the cleaning operations discussed herein the process chamber can be closed.

The process module 570 is capable of sequentially removing organics, removing metallic contaminates, removing native oxides, oxidizing, then depositing a shield over the oxide film formed. An example of such ap rocess follows:

1. Disposing the wafer into the process chamber at lower pressure.
2. Removing organic compounds from the wafer utilizing additional ultraviolet light and introducing ozone into the chamber.
3. Removing metallic contaminates using halides and oxygen:
4. Removing the native oxides caused by the prior steps utilizing Fluorine chemistry, for example, anhydrous HF technique.
5. Evacuating and then purging the chamber to a higher pressure, for example, 700 Torr, using an appropriate gas which is non-reactive with the wafer and the exposed layers thereon, for example, $N_2$ or Ar.
6. forming an oxide film on said wafer, or at least a part thereof, by introducing an oxidizing source, for example, $O_2$, and heating the wafer, for example, by actuatig lamps 574 of heating module 572 to provide radiant heat through wall 238.
7. Performing an anneal operation, for example, by turning off the oxidizing source and purging with $N_2$ or Ar, after the anneal operation turning off the heat and allowing the wafer to cool, if desired.
8. Remove the moisture, if desired, by utilizing a purge operation.
9. Evacuating the chamber and purging the chamber with an appropriate gas, for example, $N_2$ or Ar to a lower pressure, for example, 750 to 0.1 Torr.
10. Introducing a gas for deposition into the chamber, for example, silane to deposit polysilicon or Silicon Nitride could be utilized.
11. Heating the wafer to a deposition temperature, for example, 550 to 700 degrees.
12. Generating additional ultraviolet light to increase the excitation level.
13. Removing the heat and deposition gas and purging the chamber with an appropriate gas, for example, $N_2$ or Ar and another deposition could be such as Silicon Nitride.
14. After removing the wafer from the process chamber, utilizing remote plasma to clean the chamber prior to the next wafer.

Various of the above steps and/or portions can be omitted if required by the particular process.

Another process, which can be useful for the process module 570 of FIG. 9, is the deposition of silicon dioxide. The wafer is placed into the process chamber. The chamber is evacuated and then purged, if desired, with an appropriate gas, for example, $N_2$. The pressure can vary between 0.1 to 750 Torr. An oxygen source, for example, $N_2O$ or $O_2$, is excited within the chamber 254 to produce a remote plasma. A silicon source, for example, silane or disilane, is introduced into the chamber 218 either from chamber 254 or distributor 212. Ozone is introduced into chamber 218 through distributor 212. The wafer is heated to, for example, between 200 to 500 degrees C. Ultraviolet light is generated with space 220 as discussed above to provide the excitation discussed above. After the deposition is performed, the gas and the heat is turned off and the chamber 218 can be again purged, if desired. After the wafer is removed, the chamber can be cleaned utilizing a remote plasma formed from, for example, $CF_4$ and $O_2$. The pressure can be, for example, 0.1 to 750 Torr and the ratio of $SiH_4$ to $O_2$ can be, for example, 1 to 5.

One class of embodiments disclosed herein provides a deglaze process wherein the activated products of a source gas flow which includes both a fluorine source gas species, or, alternatively, anhydrous HF and also a large percentage of oxygen are flowed across a wafer surface downstream from a plasma discharge which is remote from the wafer surface. This embodiment has the advantages that a dry deglaze process which does not selectively erode silicon is provided. This embodiment has the further advantage that a deglaze process is readily combined sequentially with a following process step. For example, an in situ deglaze can be used to remove native oxides, and assure a clean interface for succeeding deposition steps. The process module 570 shown in FIG. 9 can be used without actuating the ultraviolet light or in the alternative another process module could be constructed without the space 220, ring 576, and the other components associated with the production of ultraviolet light in space 220.

A deglaze process has been successfully demonstrated as follows: Process gas flows of 300 sccm of He plus 2000 sccm of $O_2$ plus 250 sccm of $CF_4$ were passed through a 400 W discharge, and were found to give a selectivity of 3:1 oxide to polysilicon measured using a thermal oxide as compared with polysilicon on oxide (on silicon). The oxide etch rate was only 7Å/min at room temperature, but this rate can readily be increased by using higher temperatures.

Thus, the teaching of the present application in this respect is that a very high oxygen fraction can advantageously be used to perform deglaze, using a gas flow which has passed through a remote discharge. The introduction of this high fraction of oxygen serves to enhance selectivity by lowering the etch rate of polysilicon. These gas flows would not work as well without the remote plasma, since the additional plasma bombardment would not permit as high a selectivity.

The sample recipes given can be modified in various ways in accordance with the teachings of the present application. For example, to obtain higher (oxide:silicon) selectivity, a higher fraction of $O_2$ can be used. Somewhat higher rates can be obtained by using higher flows of $CF_4$. Higher temperatures will also increase the rates. The 2.5 Torr total pressure can be widely varied.

Figure 23:
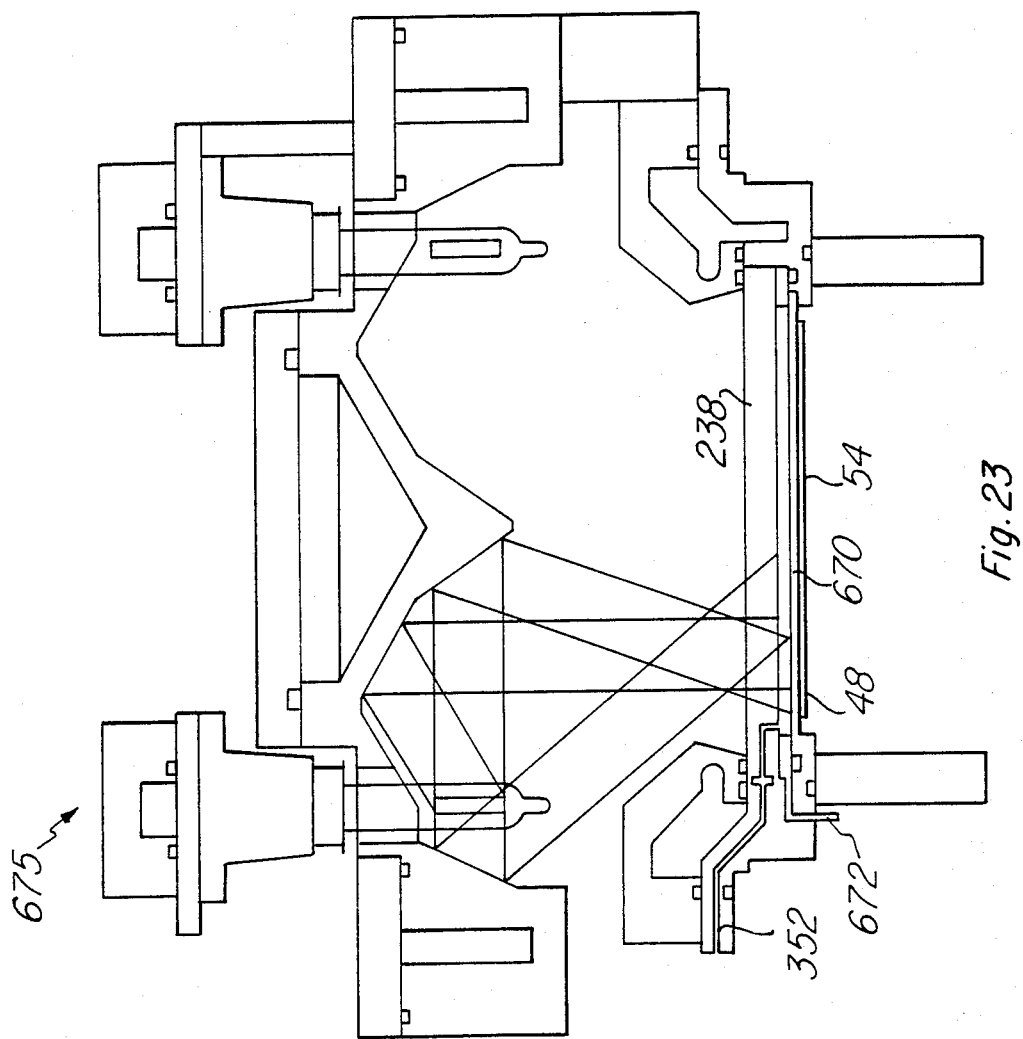
FIG. 23 shows the details of a process module, which provides combined capabilities for high-temperature processing (and cleanup), plasma bombardment, and provision of remotely generated activated species to the wafer face.

An attractive alternative embodiment is to use a reactor like that shown in FIG. 23, with process gas flows of (e.g.) 3000 sccm of He plus 3000 sccm of $O_2$ plus 150 sccm of $CF_4$, at a total pressure of (e.g.) 2.5 Torr, with (e.g.) 400 Watts of RF power applied to the gas flows to generate activated species, at a substrate temperature of (e.g.) 250 C.

FIG. 10 shows an overview of the physical configuration of a sample system using a single process module 204 like that of FIG. 9. The operation of the load lock lid 20 and the process module 204 including the wafer transport mechanisms and the isolation gate 31 (FIG. 4) which separates the vacuum load lock chamber 12 from the process module are all controlled by a computer control system 206 which can be, for example, an 8088-based PC (e.g., a Texas Instruments Professional Computer). The computer control system 206 provides control logic for all of the processes performed at the process station. Process menus can be developed at the keyboard, stored in memory, and carried out automatically by this computer control system 206. For example, therefore, the the number of particles, if any, below which the computer control system allows opening of the vacuum wafer carrier 10 can be programmed.

Figure 11:
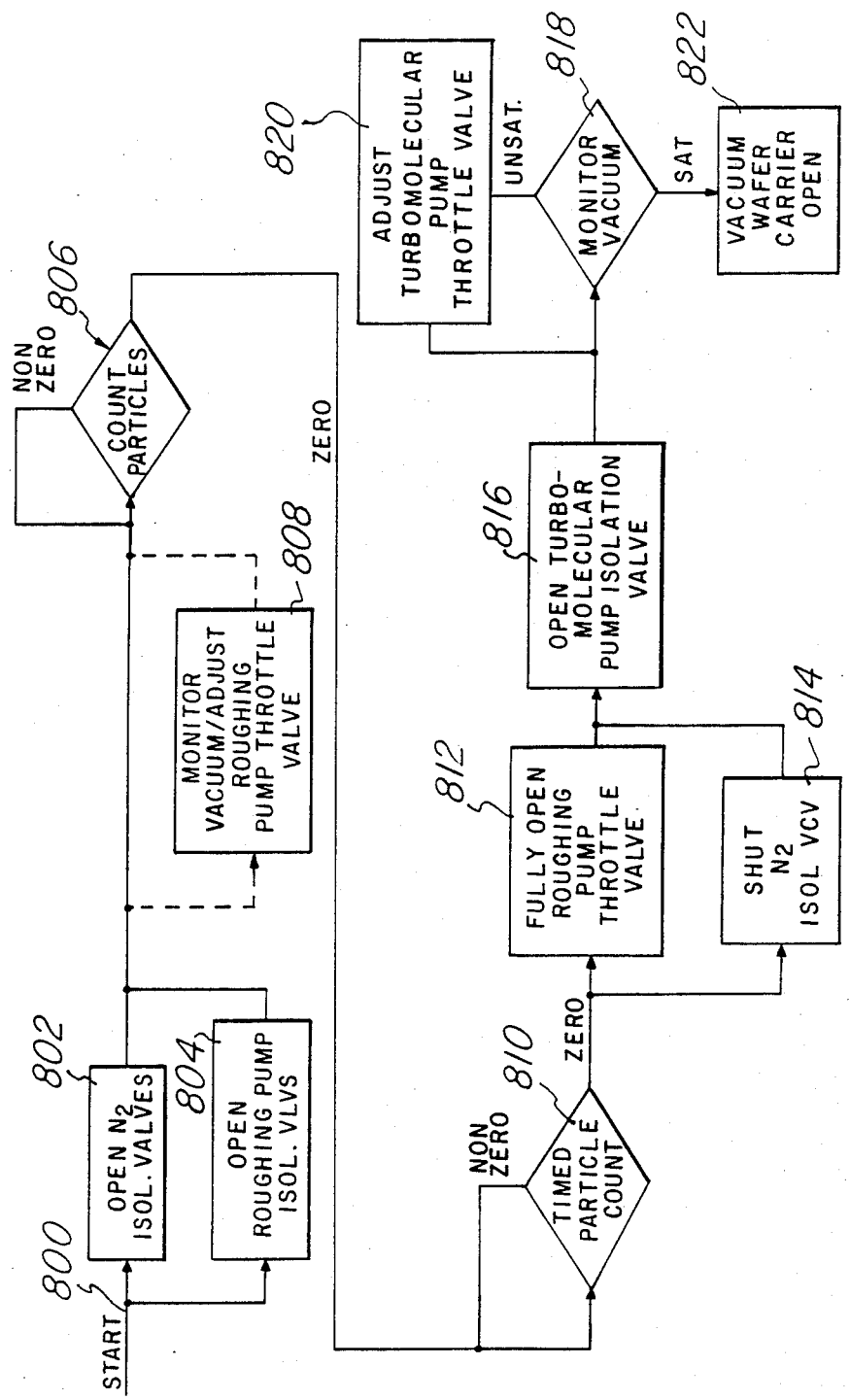
FIG. 11 shows a flow chart for a load lock control system which provides particulate protection in a vacuum process system.

FIG. 11 shows a flow chart for the operation of such a computer control system. The logic starts in step 800 and proceeds to enter steps 802 and 804. After the vacuum wafer carrier 10 has been loaded and the load lock lid 20 is detected to be closed in step 800, the roughing pump isolation valve 702 is opened in step 804. The nitrogen isolation Valve 703 is opened in step 802 to supply nitrogen into chamber 12 (FIG. 1) as discussed above.

The logic then proceeds from steps 802 and 804, which do not need to be performed simultaneously, to state 806 and step 808. In step 808 the computer control system 206 will monitor the pressure and throttle the gate or isolation valve 39 to provide the appropriate control. The load lock is pumped down to a moderate vacuum. This is still a higher pressure than the pressure inside the wafer carrier, so that the vacuum wafer carrier door 14 will not open yet. In state 806, the pressure is held at a moderate level until the load lock particle counter 850 which includes the particulate sensor 202 indicates that the level of particulates is acceptably low. If the count detected by counter is not the appropriate count then the logic loops back to state 806. When the appropriate count is detected, for example, zero, then the logic exits the loop and enter state 810. In state 810, if no particulate is detected for a predetermined period of time, for example, 60 seconds, opening (or closing of the vacuum wafer carrier 10 can safely by permitted). Thus, if for some reason an unusually high concentration of particulates is introduced when a vacuum wafer carrier 10 is loaded into the load lock, the system will not expose the wafers 48 to contamination until the danger of particulate contamination has passed under the close loop control system described above.

After the particulate sensors 202 and 208 (FIG. 9) have detected no particulates for the predetermined period of time, the logic exits state 810 and proceeds to steps 812 and 814. The isolation valve 702 is fully opened in step 812. In step 814, the isolation valve 703 from the nitrogen supply is closed. The logic then proceeds to step 816. While the logic is in step 816 the isolation valve 707 is opened and the pressure within chamber 12 is further reduced. The logic exits step 816 and enters into state 818. The pressure within the chamber 12 is monitored in state 818 and if the pressure has not reached the desired level the logic enters step 820. In step 820, the throttle of isolation valve 707 is adjusted and the logic re-enters state 818. When the pressure, has reached the desired level, the logic exits state 818 and enters step 822. In step 822, door 14 is opened.

Another branch in the control logic may be added to go through another purge cycle if the particulate level has stayed at an unusually high level after a given period of time. Thus, without degrading throughput, this closed loop particle control system advantageously ensures that the risk of particulate introduction during periods of high ambient particulate levels is mininized. This closed loop particle control system also advantageously protects against accidental contamination which could be caused by error in the sequencing of operations in a manually controlled system.

Further, the computer control system 206 allows the pumping system to pump down to working pressure and control the level of particles present when the door 14 (FIG. 1) is opened. The door 14 of the vacuum wafer carrier 10 is opened by rotating shaft 24 as discussed above. Such in situ particle counters, for example, counter 850 in FIG. 31, can be built using a resonant circuit to measure charge transfer in a high-voltage vacuum-gap capacitor, or (for particles sufficiently large) by using a laser-driven optical cavity with a multiply-folded optical path, or by other means.

The isolation gate 31 (FIG. 3) can now be opened to permit passage of arm 28 with the wafer 48 into the process module. This double inhibition logic is useful because neither the vacuum wafer carrier door 14 nor the isolation gate 31 into the process module can be opened until the particulate level in the vacuum load lock chamber 12 has been measured at an acceptably low level. These are separate techniques, and either can be used independently, although synergistic advantages can result if both are used together. The wafer 48 can then be removed from the vacuum wafer carrier 10 by the wafer transfer arm 28. The computer control system 206 (FIG. 10) controls the transfer arm 28 to remove or replace each wafer 48 in any random order which may be programmed. The wafer 48 is transferred with the side which will eventually contain active circuit components facing down.

Optionally, other particle counters (or particulate sensors which better adapted to sensing particulates at higher pressures) can be used to control the nitrogen shower prior to initial pumpdown. That is, instead of doing the nitrogen shower simply for a fixed duration, it may be protracted if the particulate monitor shows that the box was in an unusually dirty environment. It may even be desirable to pump the load lock down to a soft vacuum (using the roughing pump) and then bleed gas through the nitrogen shower ports, to create a downward flow. It may also be desirable to cycle the load lock from a soft vacuum (e.g. 100 milliTorr or so) up to atmospheric again, by initiating another nitrogen shower cycle, if the particulate monitor indicates that that particulate level is still excessive at the time the load lock has reached a given soft vacuum pressure.

The particulate sensor 208 as shown in FIG. 9 is connected to the interior of the process module, and this is used to control another inhibit logic. A large fraction of the particulates which occurs in a vacuum processing system is generated by the actual processes being performed. As a modification, to reduce particulate contaminating from these sources, the isolation gate 31 (FIG. 3) to the process module, for example process module 570 (FIG. 9) is not opened after a wafer 48 has been processed until the particulate sensor 208 indicates an acceptably low level of particulates inside the module. Again, this is another feature which can be applied separately from the other just discussed, although synergistic advantages do result if the two are used together.

Figure 12:
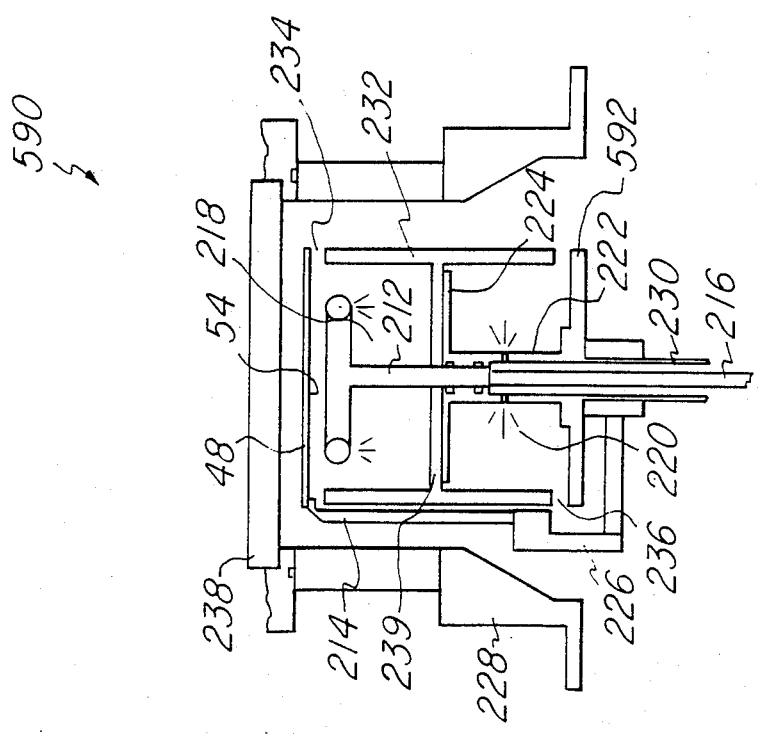
FIG. 12 is a detailed view of the structure to realize the capability for process enhancement by ultraviolet light generated in situ, in embodiments such as that of FIG. 9.

FIG. 12 shows a detailed view of one modification to a process module, such as the process module 570 shown in FIG. 9, which provides a capability for ultraviolet enhancement of process chemistries. The capabilities of this embodiment can be embodied in more conventional reactor configurations as well, but they will be described in connection with a process module of this type because the features described provide particular advantages in this context.

FIG. 12 shows one embodiment for an ultraviolet enhanced vacuum process module 590. A process gas distributor 212 is supplied by the process piping 216 and generates a downward flow of process gases through openings in the bottom of its ring in the top chamber 218. The distributor 212 provides a downward flow of process gases to the top chamber 218 near the wafer face 54 of wafer 48 which is facing downward above distributor 212 and supported by three support fingers 214 (only one of which is shown) the support fingers 214 are similar to pins 53 in FIG. 3. These three support fingers 214 are usefully made of quartz or other high-purity dielectric material.

The process gas distributor 212 is a ring, of perhaps one half the diameter of the wafer 48 being processed, with hollow supports which lead to the process piping 216. It is situated several, e.g. four, centimeters from the wafer 48. The exact dimensions of the process gas distributor 212 are not critical. These parameters may be changed if desired, but if modified, they should be selected so that a fairly uniform concentration of process gases and process gas products occurs over the entire wafer face 54. For example, the spacing of the process gas distributor 212 away from the wafer 48 could be anywhere in the range from 1 to 15 centimeters. The process gases provided through the process gas distributor 212 may be of several different types, including mixtures which include active species generated by a remote plasma.

The reaction of these process gases with the thin flim materials on the wafer face 54 is enhanced by the ultraviolet light emitted by the in ultraviolet plasma space 220 located below top chamber 218. A second flow of process gases is provided from orifices 222 supplied by the piping 230 into the ultraviolet plasma space or lower chamber 220, wherein a plasma is generated by RF power applied to front electrode 224. The gas supplied can be, for example, $H_2$, Ar, or He. The front electrode 224 is perforated to permit passage of ultraviolet light, but alternatively it may be made with a composition and thickness to be transparent to ultraviolet. Ground electrodes for this plasma are provided by structural metal elements and by the metal walls 228 of the process module. The frequency of the power applied to the electrodes to produce the ultraviolet light can be, for example, 100 KHz or 13.56 MHz. Quartz baffle 232 which in this embodiment is approximately H-shaped in cross section, and has an approximately cylindrical outer surface, separates the gas flows in the ultraviolet plasma space 220 from those in the top chamber 218. Thus, the two chambers 218 and 220 not only have separate gas flows, with top chamber 218 being exhausted through openings 234 between the top of baffle 232 and wafer 48, and the ultraviolet plasma space 220 being exhausted through openings 236 between the bottom of baffle 232 and quartz plate 592. Chamber 218 and space 220 may optionally even be operated at different pressures as long as the pressure differential does not lead to back-flow in the exhaust space.

After the wafer has been positioned on the three support fingers 214 and the module has been closed, power can be applied to the front electrode 224 to generate a plasma, and a gas appropriate for the generation of a ultraviolet plasma is admitted to the ultraviolet plasma space 220 through piping 230. Appropriate gases include $N_2$, $H_2$, $O_2$, and many other species. The particular gas can be chosen to match the ultraviolet spectrum desired in a particular application. The ultraviolet-source plasma can be generated by using an appropriate gas or mixtures of appropriate gases and appropriate pressures with greater than a minimum power for the particular chamber configuration and structure, for example, 50 watts.

In the embodiment shown in FIG. 12, the back side of the wafer 48 is in proximity to a transparent vacuum wall 238, and is supported with a slight spacing away from the vacuum wall. These features relate particularly to embodiments with Rapid Thermal Processing (RTP) capability, which will be discussed in greater detail below.

In the embodiment shown in FIG. 12, the quartz baffle 232 includes a member 239, which is shown horizontal and substantially transparent to ultraviolet. Member 239 forms the crossbar in the H shaped cross-section of baffle 232. This ultraviolet transparent window can be fabricated from quartz or sapphire or other similar material.

Figure 13:
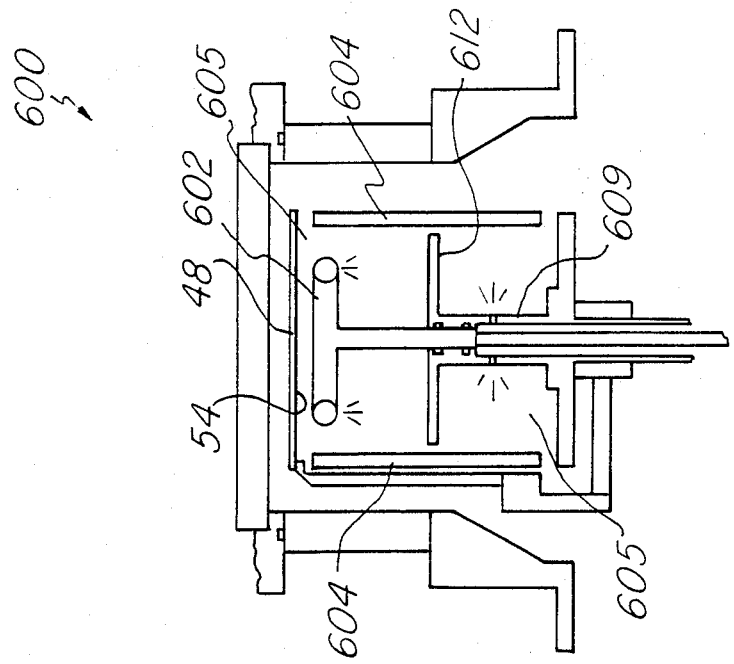
FIG. 13 shows an alternative version of the structure of FIG. 12, without the isolator window which (in the embodiment of FIG. 12) helps separate the gas flows of the ultraviolet source plasma from the process gas flows near the wafer face.

Optionally, if complete separation of the gas flows is not necessary, and especially if very short wavelength operation is desired, the member 239 can be made perforated rather than solid, or can be omitted entirely. This is shown in FIG. 13. The process module 600 is similar to process module 590 of FIG. 12. The gas distributor 602 is similar to distributor 212 of FIG. 12. The quartz baffle 604 is a cylindrical shape (shown as two rectangles in FIG. 13). The process gas to the top chamber 605 is through gas distributor 602 and the ultraviolet plasma space 607 is through piping 609. The front electrode 612 is similar to front electrode 224 in FIG. 12. However, now the process gas in the space 605 can mingle with the process gas in the chamber 605 because the crossbar in the quartz baffle 232 (FIG. 12) is not present in quartz baffle 604.

Figure 14:
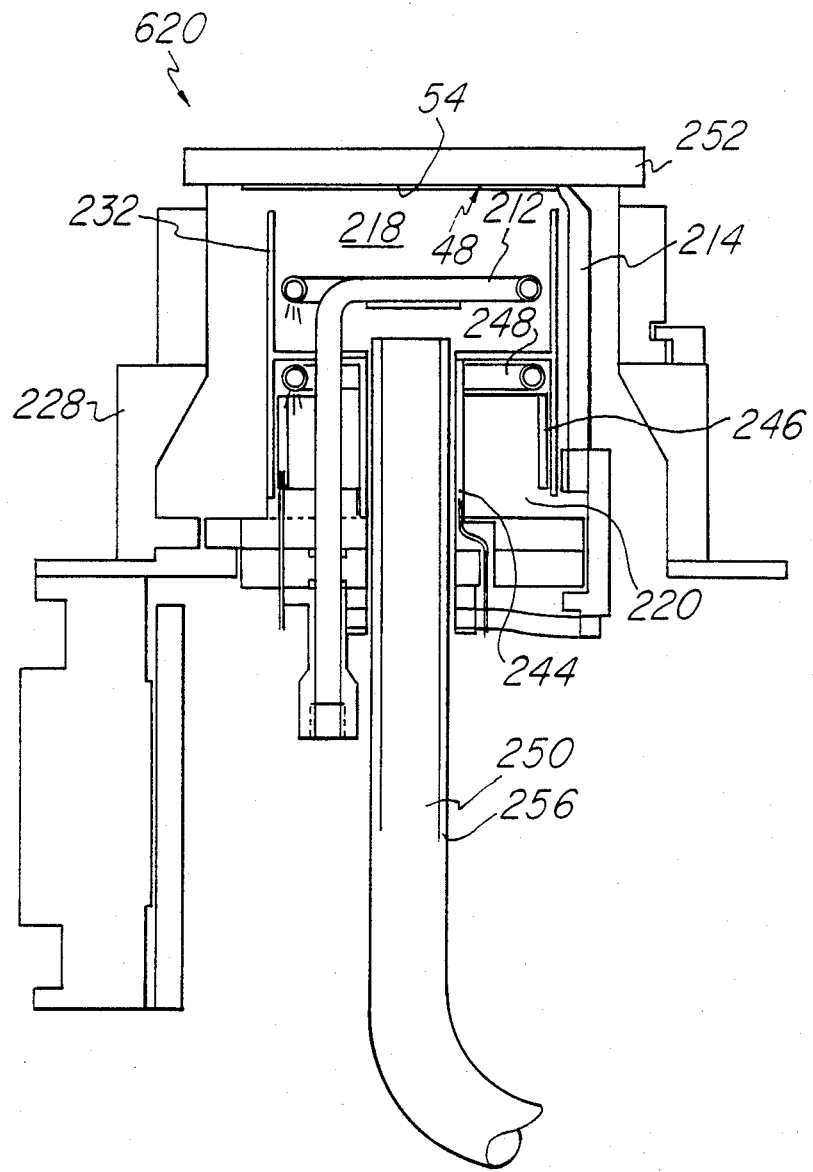
FIG. 14 shows a further alternative version of the structure of FIG. 12, wherein the plasma which provides the ultraviolet source is generated between electrodes which are approximately cylindrical, and wherein capability is also provided for providing activated species (generated by gas flows through an additional plasma discharge which is remote from the wafer face) to the wafer face.

FIG. 14 shows a process module 620 somewhat similar to process modules 590 (FIG. 12 and 600 (FIG. 13). In FIG. 14, the plasma in the ultraviolet plasma space 220 is driven by two electrodes 244 and 246 which are shaped approximately as concentric cylinders. In addition, gas distributor 248 in the ultraviolet plasma space 220 is different form the piping 230 in FIG. 12. The quartz baffle 232 in FIG. 14 is H-spaced. Also process module 620 includes a third gas feed 250, which can be used to provide species generated by a remote plasma, as will be discussed below. The gas feed 250 is in addition to gas distributor 212 which is a ring in the top chamber 212 and feed 256 which provides gas into ultraviolet plasma space 220. further, a susceptor 252, which is RF powered in place of the transparent vacuum wall 238, so that a plasma can be generated in proximity to the wafer face 54. The electrode 244 forms a slip- fit with the feed 250. This slip-fit is not sealed but merely vented downward.

In this application, when a plasma is referred to as being "in proximity" to a wafer, it is meant that the plasma is sufficiently close to the wafer that the DC bias across the dark space at the edge of the plasma induces a significant plasma bombardment of the wafer face. The degree of bombardment will be more or less in accordance with the amount of DC bias, which is controlled by pressure, power levels, and, to some extent gas flow composition.

Thus, FIG. 14 shows a separate feed path being provided for activated species generated by a plasma which is remote from the wafer face 54. In this class of embodiments, a process module is configured so that an integrated circuit wafer 48 can be exposed to activated species generated by a first plasma which is separate from the wafer but is in the process gas flow stream upstream of the wafer 48, and also exposed to plasma bombardment generated by a second plasma which has a dark space which substantially adjoins the surface of the wafer. The in situ plasma is relatively low-power, so that the remote plasma can generate activated species, and therefore the in situ plasma power level and frequency can be adjusted to optimize the plasma bombardment energy.

In particular, the embodiments described derive special advantages from the combination of a remote plasma in the gas feed with a low-power plasma in situ. The use of a remote plasma means that a high density of activated species can be provided at the wafer surface, and the use of the low- power plasma in situ means that sufficient plasma bombardment can be provided to cause anisotropic etching, while limiting the plasma bombardment energy and flux to only that necessary to induce the desired degree of anisotropy. This advantageously permits the damage which can be caused by excessive plasma bombardment energy can be readily avoided. This also advantageously permits the chemistry of the reaction to be fine-tuned. It is desirable to have the plasma bombardment shift the surface chemistry enough to provide anisotropy, but two other primary constraints on any plasma etching process are selectivity and control of extraneous deposition, and the choice of a chemistry to optimize all of these conditions may be very constrained. The ability to independently optimize bombardment conditions provides advantages in developing optimized chemistries, as some of the specific examples discussed below demonstrate. Moreover, the ability to provide a high density of activated species under low-bombardment conditions means that processe can be performed at high throughput under low- bombardment conditions, which was not readily achievable prior to the process modules disclosed herein. Another advantage of using a low-power plasma for the in situ plasma is that wafer heating (which degrades the selectivity to resist) can be minimized.

In a typical usage, the remote plasma will be operated at 300 W or more, and the in situ plasma will be operated at 100 W or less; however, it may be advantages to operate at higher powers, for example, with Aluminum doped with Copper films. Thus, it should be understood that the remote plasma can be operated at four times or more the total power level applied to the in situ plasma. In other alternative versions, the in situ plasma may operated at power levels as low as 25 W. The advantage of reduced plasma bombardment energy is partially independent of the attainment of low power. Thus, the in situ plasma can be operated at a DC bias of 250 V or less, for example, a typical level can be within the 25 to 1000 Volts range.

Figure 32:
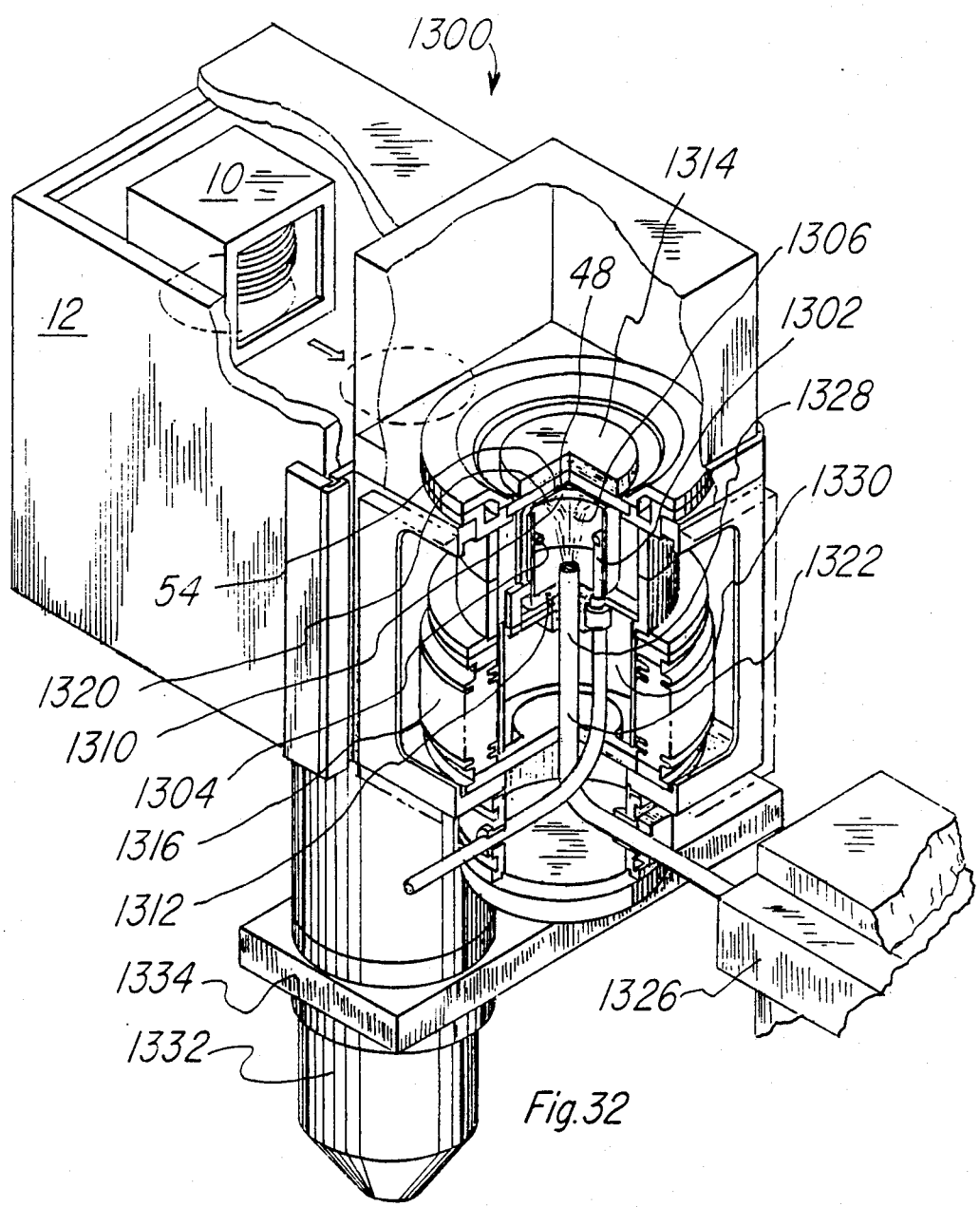
FIG. 32 shows a process module with remote and in situ plasma.

FIGS. 9 and 32 show an overview of a process module with this capability. In FIG. 9, the remote plasma chamber 254 is connected to the process module by a quartz outlet tube 256.

Figure 15:
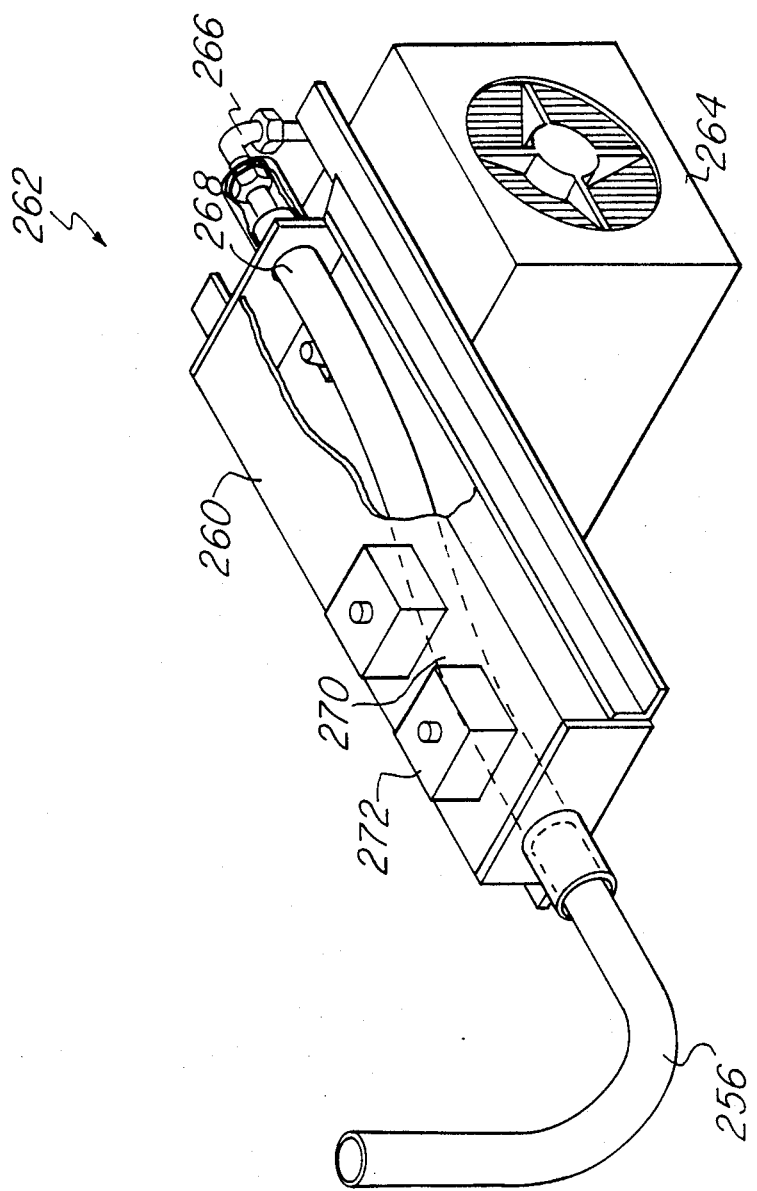
FIG. 15 shows an example of a structure which generates activated species by gas flows through a plasma discharge which is remote from the wafer face, in embodiments like that of FIG. 14.

FIG. 15 shows a remote plasma chamber. A magnetron 264 which, e.g., operates at 2.45 GHz, is directly coupled to a resonant cavity 260 which, e.g., is made of anodized aluminum, and has dimensions of about 1.5 by 3 by 9 inches. A gas input tube 266 is connected to one or more mass flow controllers, to provide a desired flow or process gases, and leads into a gas passage 270 which runs through the resonant cavity 260 and leads into the quartz outlet tube 256. It then passes through a shielded volume which protects against RF leakage out of the cavity. Since the quartz used has an outer diameter of less than a quarter- wavelength, e.g., about 1 inch in this example, which is a shield 268 of the order of one wavelength (or more) long will provide reasonable isolation. The shield 268 extends around the quartz outlet tube 256 and usefully around the whole length of the outlet tube 256, up to the point where it enters the reactor module. A tuning stub 272 permits tuning the cavity to resonance. A nitrogen purge is preferably supplied to the interior of the resonant cavity 260, to prevent ozone generation. Cooling lines (not shown) can also be useful. The outlet tube would be connected to, for example, the gas feed 250 (FIG. 9).

In this embodiment, the gas flow through the gas passage 270 provides a significant fraction of the total loading of the resonant microwave system cavity plus magnetron. Thus, it is useful not to turn on the power until gas flows and pressures have been established. In a process where, for example, 400 W of power will be applied, the pressure should be at least 500 mTorr, and the flow rates at least 500 sccm, before the magnetron 264 is powered. These are conservative numbers, but they do serve to prevent arcing in the cavity or magnetron. At higher powers, of course, higher minima would be used. For example, in sample processes where 5000 sccm of total gas flow is used, powers of as much as 1000 W can optionally be used.

Note that the power efficiency of the remote plasma will be affected by the volumetric ratio of the gas passage 270 to the interior of the resonant cavity 260. Thus, the gas flow passage 270 could be made, instead of the roughly cylindrical shape shown, be modified to have a shape which filled up more of the volume of the cavity.

Instead of the magnetron 264 directly abutting the resonant cavity 260, of course, a waveguide or other RF transmission structure could be used to connect them, according to the normal principles of microwave engineering. Thus, it may alternatively be advantageous to locate the resonant cavity 260 physically inside the process module, to minimize the transit time during which the activated species can relax, recombine, or decay before they reach the wafer face.

In an alternative embodiment, a conventional microwave component known as a three-port circulator can be used to couple both a transmitter and a receiver to the same antenna without coupling the transmitter to the receiver. It could be used to partially de-couple the magnetron 264 from the resonant cavity 260, so that, under conditions where a large reflected power was returned from the cavity, a separate resistive load would assume some of the loading function.

This has the advantage that the sensitivity of the RF system to loading variations caused by changing process conditions is greatly reduced. This has the further advantage that one RF power source can be coupled to more than one remote plasma generation cavity, if desired.

In the embodiment shown in FIG. 9, the quartz outlet tube 256 is connected to the third gas feed 250, like that shown in FIG. 14, by a non-contact slip fit joint 258. This loose slip fit will permit some of the gas feed to leak out directly into the exhaust space during processing, but this is only a minor problem. The advantage of using a slip fit here is that it accommodates the vertical motion of the process chamber while still permitting essentially the whole path of the gas flow from the remote plasma chamber 254 to be conducted through quartz tubing. As discussed above, the vertical motion serves to open and close the process chamber for wafer insertion and removal. This has been found to be a useful feature in practice since many of the activated species generated by the remote plasma will be very active. These active species include radicals such as Oxygen, quasi-stable molecular species such as oxyhalogen compounds, molecules in quasi-stable states with high electron energies, and, especially close to the plasma, a significant fraction of ionized species. The tube used to carry this flow should be both as inert as possible in order to resist attack and be as pure as possible to minimize contamination of the wafer by species which may be removed from the tube walls by the flow of the activated species. Quartz meets both of these criteria for most sources. If the gas flows to be used include fluorine sources the tubing can be made of sapphire, or sintered alumina, or copper. Additionally, depending on the process chemistries used, it may be simpler to use quartz if the erosion of the quartz outlet tube 256 and the modification of the chemistry in the gas flow can be tolerated in the particular process being run.

Figure 16:
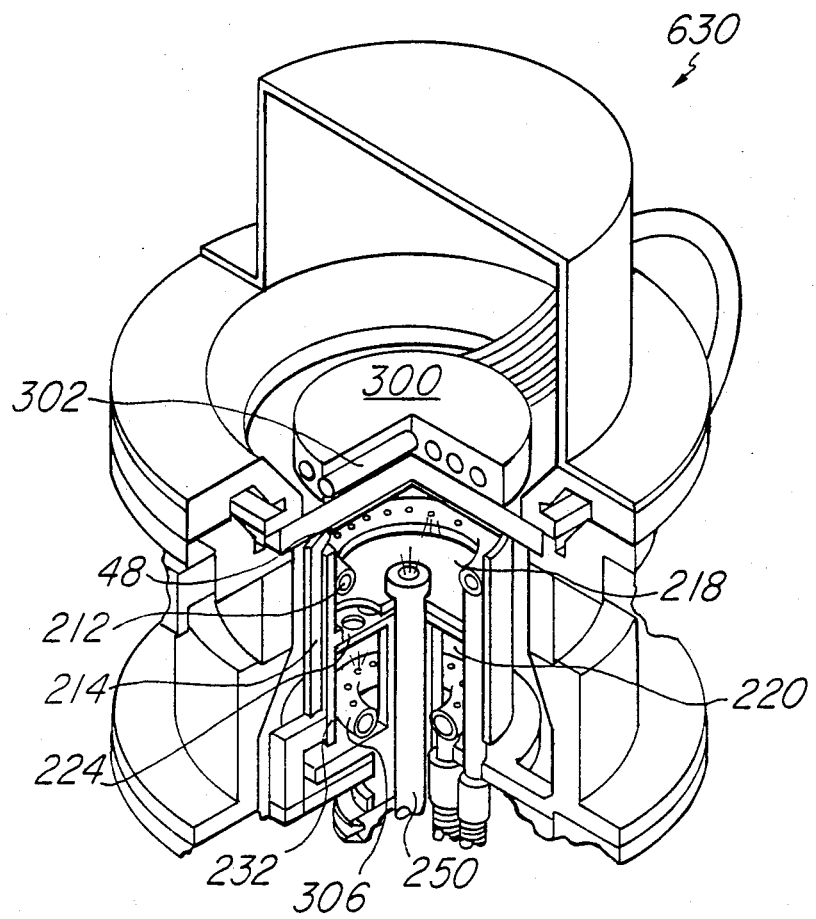
FIG. 16 shows an example of a module which provides the combined capabilities of plasma bombardment from a plasma in close proximity to the wafer face, and provision of activated species from a remote discharge, and illumination of the wafer face with intense ultraviolet light.

FIG. 16 shows details of another process module 630 which in many respects is similar to that shown in FIG. 14. A wafer 48 is held against a conductive susceptor 300 which may be of aluminum, or optionally of silicon if it is useful to modify the process chemistry (e.g. to create a fluorine-deficient plasma near the wafer face 54. The susceptor 300 is located above the wafer 48 with the top chamber 218 located below the wafer 48. The susceptor 300 is cooled by passages 302. If desired susceptor 300 can be heated through passages 302 or by utilizing heater rods (not shown) passing through susceptor 300. The wafer 48 is held against susceptor 300 by the three support fingers 214 in FIG. 16 with its face 54 facing downward away from susceptor 300.

A process which can be performed in the process modules with ultraviolet light generation and remote plasma capability as disclosed herein, for example, 630, is the deposition of conductive films. Conductive films can be produced by reducing or decomposing metal organic compounds with remote microwave activated species. For example, Zn, Al, In or Pb films can be produced by reacting metal organic compounds such as dimethylzinc, trimethylaluminum, trimethylindium or tetramethyllead, respectively, with radicals such as hydrogen or argon. In a sample embodiment, a silicon or HgCdTe substrate (wafer) is transferred into the process chamber. The chamber is evacuated to a pressure of less than $10^{-6}$ Torr. The chamber is then purged with an appropriate gas, for example, hydrogen, which passes into the process chamber through the microwave cavity at, for example, 100 sccm, if desired. The chamber is then brought to a pressure of 0.3 Torr. the substrate is heated to 50 degrees C. Dimethylzinc is introduced into the chamber through distributor 212 at, for example, 6.6 sccm. Active hydrogen radicals are then generated in the remote microwave cavity at, for example, 6 watts, and are introduced into the chamber through feed 250 to mix the the dimethylzinc to produce metallic zinc which deposits onto the substrate and methane, which is pumped from the process chamber. Zn films are produced at 60 Angstroms/minute with $25 \times 10^{-6}$ Ohm-cm electrical resistivity.

A process which can be used with the process module 630 as well as the other process modules with ain situ ultraviolet energy generation capability is to grow native oxides on HgCdTe. After the wafer is disposed in process chamber 218 and the chamber is closed, the chamber is evacuated to a desired low pressure, for example, 0.05 Torr. A purge of the chamber can be performed if desired using an appropriate gas, for example $O_2$ or an inert gas. A remote plasma generated from a source of oxygen, for example, $O_2$ or $N_2 O$, is introduced into chamber 218 to perform a cleanup if desired. The remote plasma is shut off. The chamber is evacuated and purged with $O_2$ or an inert gas, if desired. Ultraviolet light is generated within space 220 and coupled into chamber 218. The ultraviolet light provides the required excitation of the gases within chamber 218. The ultraviolet light is maintained for an appropriate period of time, for example, 1 hour. The chamber is then evacuated and purged with an appropriate gas, for example, $N_2$. The chamber is then opened and the wafer 48 removed.

Another process which can be utilized with the process modules disclosed herein with ultraviolet light and remote plasma capability, for example, module 630. The wafer is transferred into the process chamber and the chamber closed. A purge with an appropriate gas, for example $N_2$ can be performed. A remote plasma is generated from $N_2O$ and introduced into chamber 218 through feed 250. A silane gas, for example, $SiH_4$ is introduced into the chamber through distrubutor 212. Ultraviolet light is produced within space 220 and coupled into chamber 218. It will be absorbed in part by the $N_2O$ gas in chamber 218. After the deposition is completed, a cleanup operation can be performed, if desired, by utilizing a remote plasma generated from $SF_6$.

A process gas distributor 212 provides process gases to the top chamber 218 near the wafer face 54. Another process gas distributor 306 provides gases to the ultraviolet plasma space 220 wherein a second plasma, remote from the wafer face 54, is optionally generated by applying RF power to front electrode 224. The species flowed through distributor 306, and the power level applied to front electrode 224, are chosen to illuminate the wafer face with the desired wavelength and intensity of ultraviolet light. The quartz baffle 232 directs the gas flow out of top chamber 218 and ultraviolet plasma space 220 so that the gas flow through the ultraviolet plasma space 220 does not contaminate top chamber 218, which is a similar gas flow to that shown in FIG. 12. The third gas feed 250 provides a gas flow which has been activated by a remote plasma chamber to top chamber 218 near the wafer 48. Voltage for the in situ plasma is applied to susceptor 300.

A process will now be described wherein a compound, such as zinc sulfide, is deposited from a gas phase in a reactor which is compatible with a vacuum processing system which includes vacuum wafer transport. Two gas distributors are used, each connected to a supply of one or more reagent gases, to improve uniformity and/or avoid gas phase nucleation. This process embodiment has the advantage that II-VI films, such as ZnS, can be rapidly deposited with good uniformity and good film quality.

The deposition of sulfide, selenide, and telluride films such as CdS, AnS, PbS, CdSe, ZnSe, and other II-IV combinations can be produced by utilizing metal organic compounds and sulfide or selenide gases. The organometallic compounds (metal organic) can be, for example, from the group of dimethyltellurium, dimethylzinc, trimethyaluminium, tetraethylead. The sulfide can be, for example, hydrogen sulfide and the selenide gas can be, for example, hydrogen selenide. The required excitation can be provide by either or both a inert gas actuated remote plasma chamber 254 introduced into the process chamber or ultraviolet light generated in space 220 which is coupled into the process chamber. The susceptor 300 can be heated by utilizing heater rods (not shown) passing through the susceptor. It is also possible to dope the deposited film such as ZnS doped with PbS. For example, a mixture of tetraethylead and dimethylzinc is introduced into the chamber through one distributor 310 and hydrogen sulfide is introduced through a second distributor 312 to produce a mixture of ZnS and PbS.

In a sample embodiment, a HgCdTe substrate was used with a very thin passivating dielectric layer already present (in this case, a thin film of sulfide, less than 100 Angstroms thick). $H_2S$ was flowed at 30 sccm through one gas distributor, and dimethylzinc (($Ch_3)_2Zn$) was flowed at two to three sccm through the other distributor, at a substrate temperature of 50 degrees C at a total pressure of 150–200 milliTorr. These conditions resulted in growth of a film of good electrical quality at a rate of about 350 Angstroms per minute.

Optionally, the passivating layer can also be formed in the same reactor just before the ZnS deposition is performed. This is especially advantageous for the fabrication of MIS gates on HgCdTe. In a sample embodiment, a HgCdTe substrate has its native oxide removed with dilute HCl, rinsed with DI (deionized) water, dried with nitrogen and transferred to the process chamber under vacuum. The chamber is purged with hydrogen sulfide at, for example, 30 sccm and the chamber is brought to a pressure of 0.2 Torr and the substrate to a temperature of 100 degrees C. The hydrogen sulfide and HgCdTe surface is illuminated by an additional source of ultraviolet light to produce hydrogen-bearing and sulfur-bearing excited state species (atoms and radicals) which chemically reduce residual oxides on the HgCdTe and create a thin, passivating sulfide film AnS is then deposited over the passivated HgCdTe by introduction of dimethylzinc at, for example, 2 to 3 sccm.

the ZnS growth rate was found to be very sensitive to temperature, and a higher substrate temperature is probably desirable. While the stability of the HgCdTe material sets the maximum growth temperature at about 120 degrees C or less, it is believed to be desirable to increase the growth temperature to the range from 90 degrees to 120 degrees, to achieve rapid growth of a high quality film. while gas phase reaction of these gases is not a large problem at 50 degrees C, it becomes much more significant at temperatures of 100–120 degrees C. Another advantage of the process module 640 configured to be used as a reactor is to facilitate the use of these higher temperatures without incurring problems due to reaction in the gas phase.

To achieve a smoother film, a diluent gas can be mixed in with the reagent gas flow, and/or the reagent gases can be flowed at higher rates. Suitble diluent gases would include hydrogen, helium, and argon.

Growth of a zinc sulfide film under illumination from an in situ ultraviolet source has also been tested, and it has been found that the ultraviolet irradiation provides substantially faster film growth. The additional ultraviolet radiation could be useful in other depositions.

Figure 17:
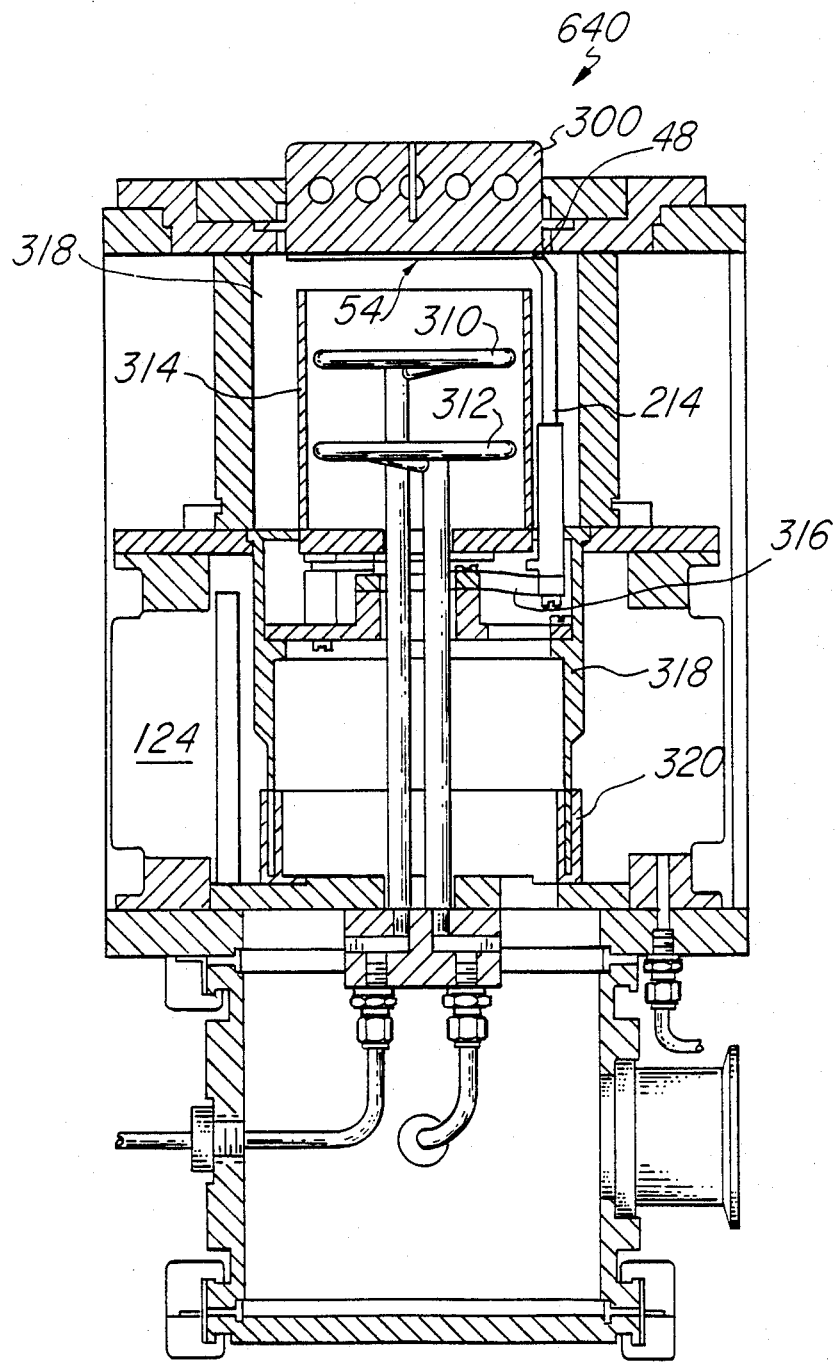
FIG. 17 shows an example of a process module which provides two separate gas feed distributors, and which is particularly advantageous for chemical vapor deposition operations using two source species.

FIG. 17 shows the process module 640 which is used as a reactor. The reactor configuration is useful for the deposition process described above as well as other types of deposition. Distributors 310 and 312 each separately release a flow of a process gas inside a baffle 314, which directs the flow of gases upward to the top chamber 218 near the face 65 of wafer 48 which is held against a conductivity susceptor 300 by the three support fingers 214 (only one is shown in FIG. 17 but all three are shown in FIG. 3).

Note that, in the embodiment shown, the three support fingers 214 are relatively long, and are supported at their bases, well away from the top chamber 218, by respective flexures 316. Each finger is supported by two (or more) leaf springs (not shown), so that the finger can be deflected vertically, but will always tend to maintain a vertical axis. The advantage of this arrangement is that it helps in providing a reactor wherein nearly every exposed surface which is near the wafer surface 54 and, specifically, every surface which is upstream from the wafer surface is made of quartz or, alternatively, another comparably pure and inert material. The species $(CH_3)_2Zn$ is quite reactive, and minimizing exposed surfaces other than quartz assists in avoiding deposition (which can lead to particulate contamination). Moreover, in this embodiment a mating pair of Teflon-coated (TM) baffles 318, 320 is used to separate the exhaust gas flow from the bellows 124, to avoid deposition on the bellows which might flake off when the bellows move.

Figure 18:
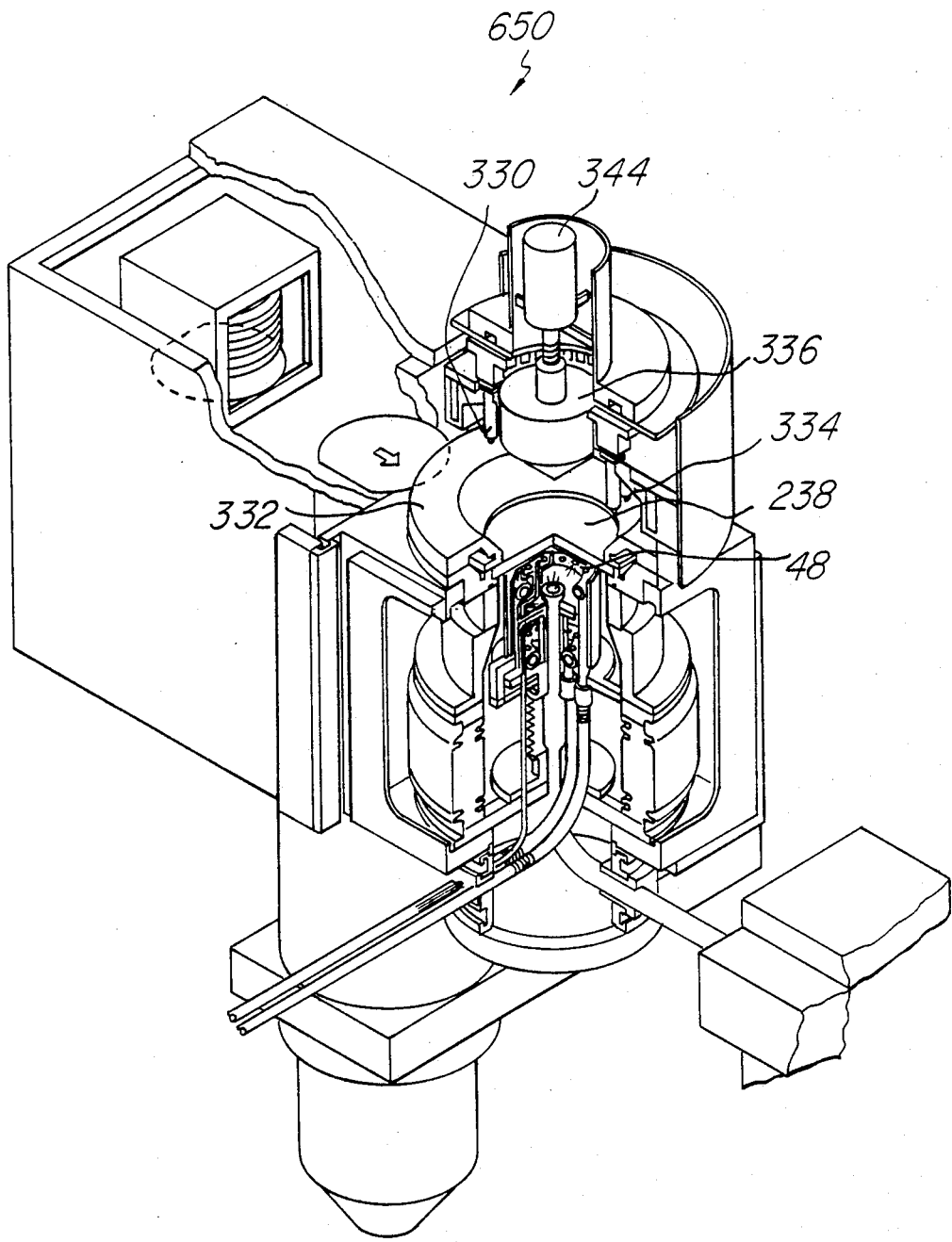
FIG. 18 shows a portion of a process module which permits rapid thermal processing to be performed with reduced risk of wafer damage, and FIGS. 19A, 19B and 19C schematically show how the operation of the heat source of FIG. 18 can alter the the distribution of heating across the wafer.

Several of the embodiments described in the present application use a radiant heat source to permit rapid heating of a wafer, and provide the advantages of high-temperature processing without the long thermal ramping times normally required. FIG. 18 shows an arrangement for performing rapid thermal processing.

Figure 19A:
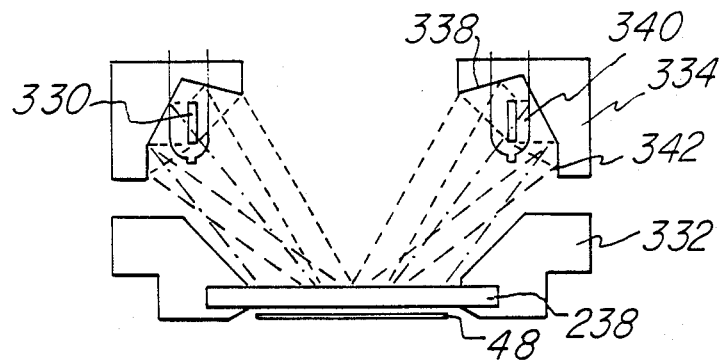

FIG. 18 shows a process module 650 wherein a wafer 48 is held against or in close proximity to a transparent vacuum wall 238. As shown in FIG. 18, a ring of heating elements, for example 18 1-kW high-temperature incandescent lamps 330, is mounted in an upper fixed reflector 334 (FIG. 19A). The upper fixed reflector and a lower fixed reflector 332 help maximize the heating efficiency, i.e. improve the fraction of optical power emitted by the high-temperature incandescent lamps 330 which is optically coupled through the transparent vacuum wall 238 to wafer 48. The control system 206 can use temperature sensors to control altering the shape of the reflector by moving reflector 336 up and down to selected positions.

FIG. 19A shows the geometry of the upper fixed reflector 334 in cross-section. The surface of reflector 334 has three straight lines in proximity to the lamp, i.e. surfaces 338, 340, and 342 with each surface shaped roughly as conic frustum and positioned to reflect light directly from the high-temperature incandescent lamps 330 through the wall 238. The geometric optics of this light path, in this embodiment are shown in FIG. 19A.

It must be appreciated, however, that, while the specific embodiment shown has demonstrated good results and advantages, a wide variety of other reflector geometries could be substituted for that shown, while still retaining the advantages of the concepts described herein. The arrangement of the heating elements and the reflectors forms a heating module. Other types of heating modules are possible with the heat generated being thermally communicated to the wafer 48 with the arrangement of FIG. 18 being one example.

Figure 19B:
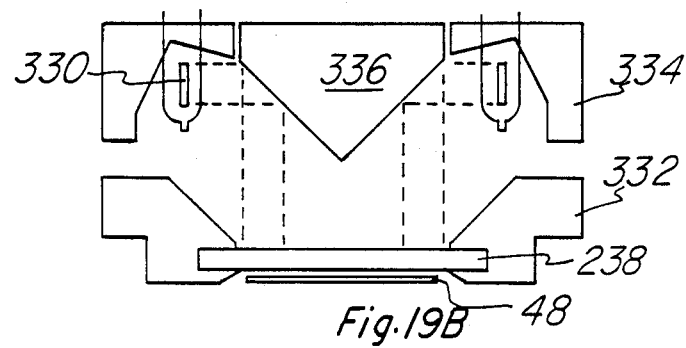
Figure 19C:
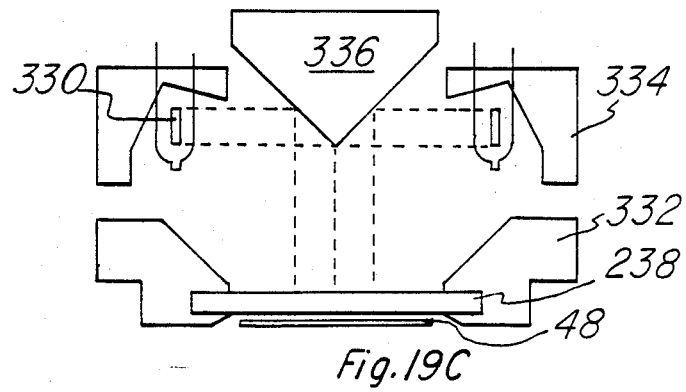
Figure 20:
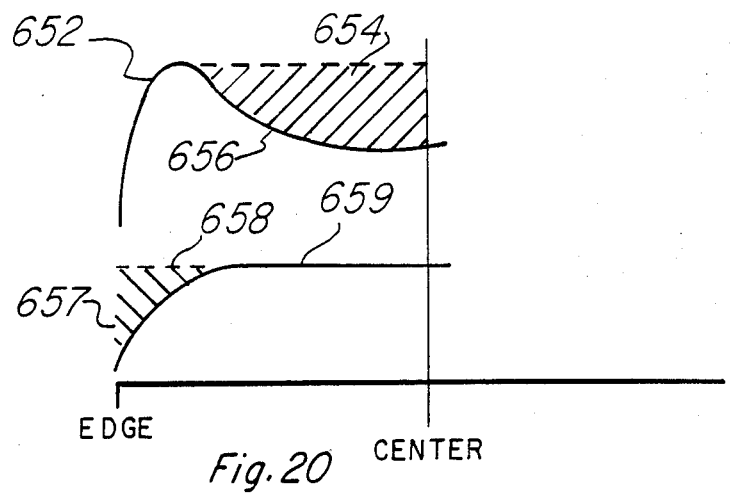
FIG. 20 shows sample plots of heating across a wafer diameter under the conditions of FIG. 19B and 19C.

A movable upper reflector 336 (FIG. 18) is controllably movable vertically by drive 344. The reflector 336 is located within a circular opening in the center of upper fixed reflector 334. The movement of reflector 336 permits the area distribution of one component of the radiant heating pattern to be controlled, as shown in FIGS. 19B and 19C, to result in heat flow distributions as shown in FIG. 20. The drive 334 is located above the reflector 336 as shown in FIG. 18.

As shown in FIG. 20, the upper curve 652 shows the distribution of the heat energy from the edge of the wafer 48 in FIGS. 19A, 19B, and 19C (at the left as in FIG. 20) to the center of the wafer 48 (at the right in FIG. 20). The area between the dotted line 654 and solid line 656 is the contribution of the reflector 336 with the area below the solid line 656 being the contribution of the fixed reflectors 332 and 334. This represents the relative distribution of the thermal energy when the reflector 336 is in the up position as shown in FIG. 19C. The curve 659 of FIG. 20 shows the relative distribution of the thermal energy when the reflector 336 is in the down position as shown in FIG. 19B. The area under solid line 657 of curve 659 shows the contribution of the fixed reflectors and the area between solid line 657 and dotted line 658 is the contribution of reflector 336.

When the movable upper reflector 336 (which has a shape at its tip somewhat similar to a cone with a 90 degree tip angle) is its lower position, as in FIG. 19B, additional heating is provided to the edge of the wafer, but when the movable uper reflector 336 is in its up position, as in FIG. 19C this component of radiation will not be preferentially coupled to the edge of the wafer, so that the center of the wafer receives additional heating. For clarity, FIG. 19B and 19C trace only the component of optical radiation which is emitted parallel to the lamp filament; but it may be seen, in FIG. 19B, that light emitted over a significant range of angles will be similarly deflected.

Reflectors 332 and 336 are, for example, made of aluminum coated with gold, and can be cooled by water flowing in passages within the reflectors. Reflector 334 could be coated with any suitable reflective material as desired.

Figure 31:
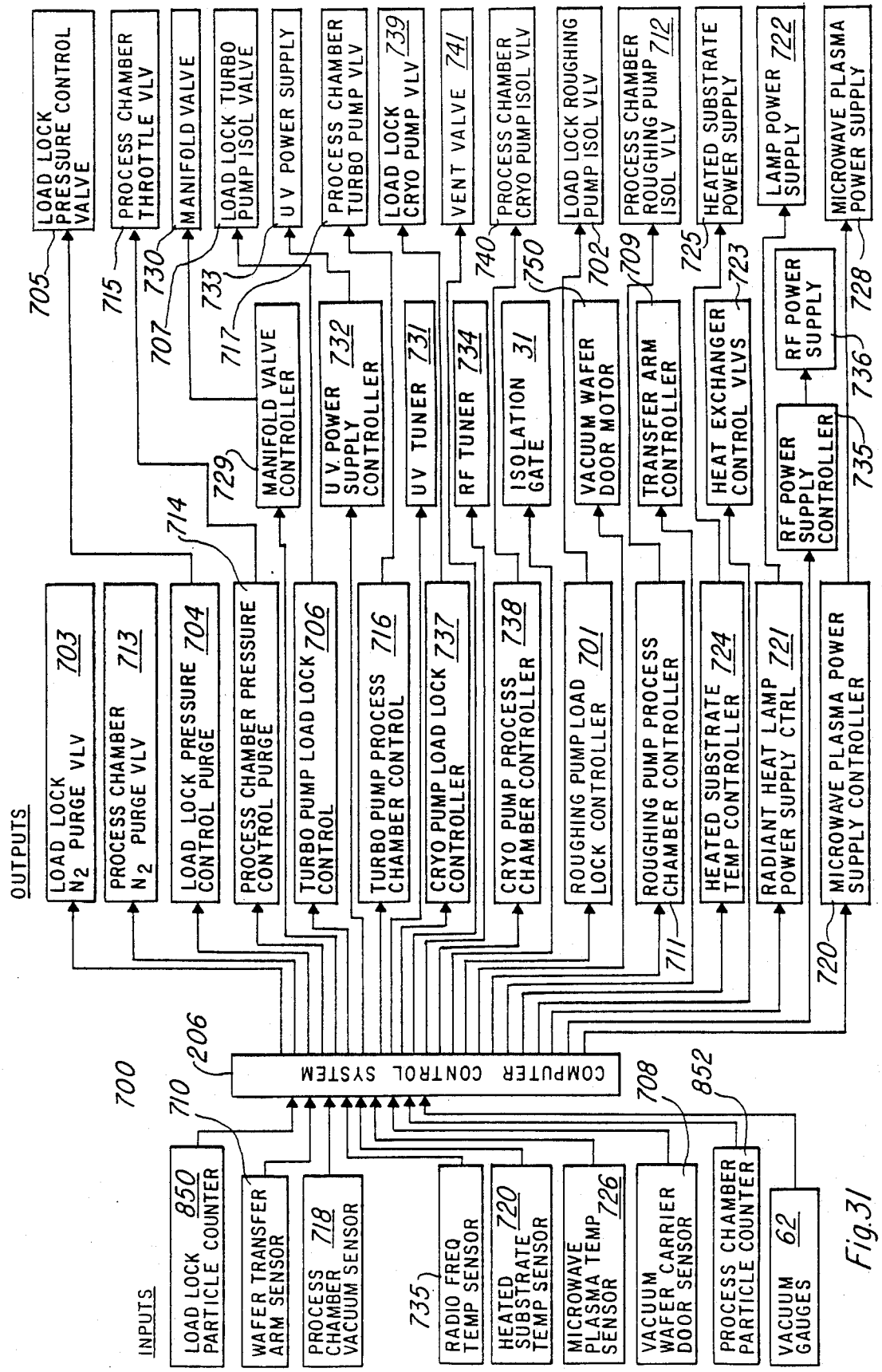
FIG. 31 is a block diagram of a computer control system.

The power input to these high-temperature incandescent lamps 330 is controlled by one of the control signals provided by the computer control system 206 (FIG. 31). Generally, power on the lamps is ramped at a high rate to a high power level (e.g. 40% of full power) and held there for some period of time depending on the process (e.g. 15 seconds). Power is then ramped back to a lower steady state level until the process is complete (e.g. to 16% of full power).

As another example, if the particular process being run requires the wafer to be held at a temperature of 600 C durig processing, the lamp power would be turned on at (for example) 30% of full power (i.e. at 5400 Watts total), and held at that level until the wafer reaches approximately the desired processing temperature, at which time the power is ramped back down to a level which will maintain the wafer at the desired processing temperature until the process is complete.

In a sample system where 18 1000 Watt incandescent lamps are position in a ring in a reflector (made of gold-plated aluminum) with a 6 inch diameter which faces a 6 inch quartz plate. The exposed portion of the quartz plate provides the transparent vacuum wall 238 and has an opening just large enough to permit radiant heating of the backside of a 4 inch wafer which is held close to the wall 238.

In a sample process embodiment, with the lamp powers just given, the wafer is held at 600 C while process gas flows of 40 sccm $H_2$ plug 8 sccm of $WF_6$ are applied to its front side at a total pressure of 500 milliTorr. This chemistry has successfully demonstrated high-quality conformal deposition of thin films of tungsten at 2000Å per minute.

In one embodiment, a combination of stationary reflectors, and lamps are used to heat the wafers rapidly to approximately 900° C. The wafers heated to approximately 1100° C. at at least 200° C. per second without any slip being introduced into the crystalline structure. The heating device is a hynamic radiant heat source, described in further detail below.

Both the intensity and the radial distribution of the incident radiant energy 22 can be adjusted. The adjustment of the power input to the lamps can be used to adjust the temperature of the wafer. This embodiment utilizes a temperature measuring device (such as an optical permitter) to detect the temperature changes in the wafer being processed. In order to achieve the appropriate radiant energy distributions across the wafer during heat-up and cool-down, the movable reflector 336 need only be moved a total distance of approximately 1½ inches. For example, curve 652 represents the distribution during heat-up and curve 659 represents the distribution during cool-down.

The embodiment shown in FIG. 18 has successfully demonstrated control such that temperature variations across the radius of the wafer were held to less than 1% during ramping of the temperature of the wafer at a rate of, for example, 200° C. per second, to a final temperature of 1100° or greater.

After the desired processing operation has finished, the gas supplies are cut off or optionally switched over to inert species, and a holding time may be optionally interposed for a controlled cool down of the partially fabricated integrated circuit wafer, or for the settling of possible suspended particulates, before the process chamber is opened. A gas purge could also be performed if desirable.

Figure 21C:
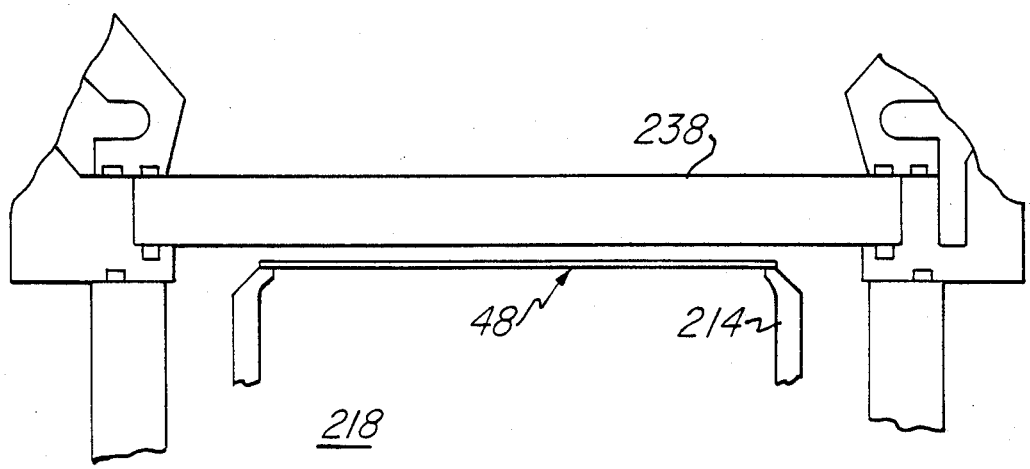
FIG. 21C shows a third way to minimize this conductive heat transfer.
Figure 21D:
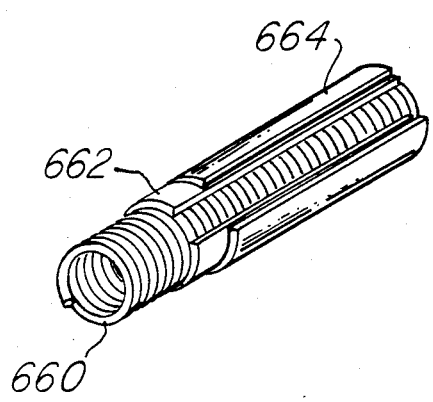
FIG. 21D shows a sample vacuum seal which may be used with a transparent vacuum wall which is subject to wide temperature variations in a rapid thermal processing environment.
Figure 21A:
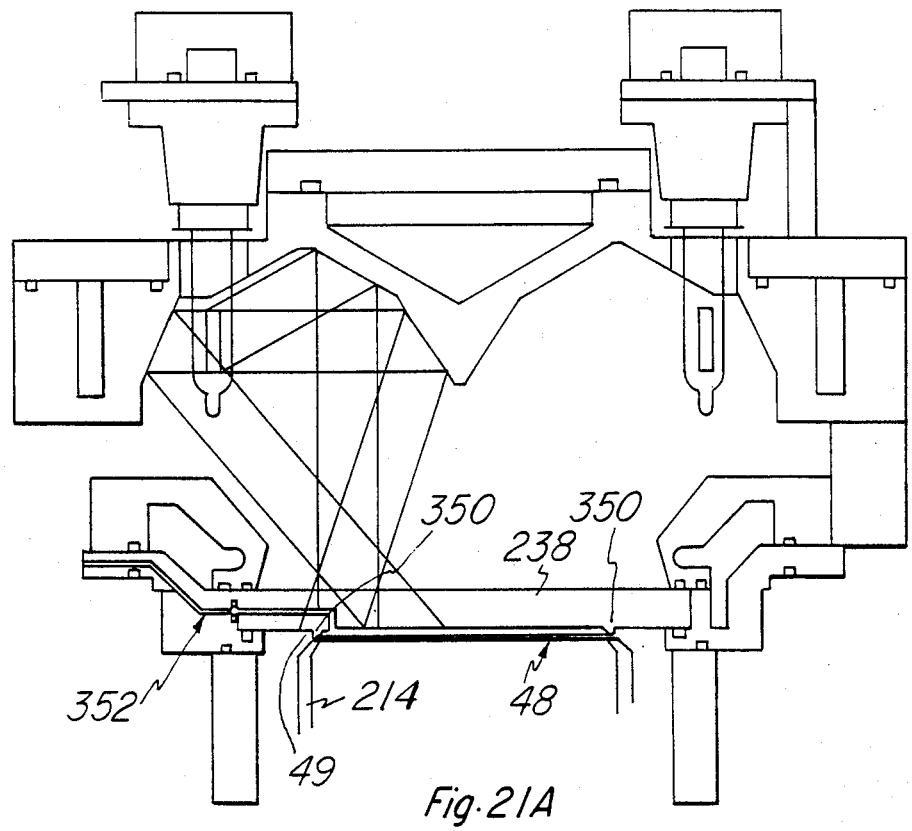
FIGS. 21A and 21B show two structures for reducing conductive heat transfer between a wafer and a transparent vacuum window in rapid thermal processing embodiments, including sample gas flow connections to supply a purge gas to the void between the wafer and the transparent vacuum wall.
Figure 21B:
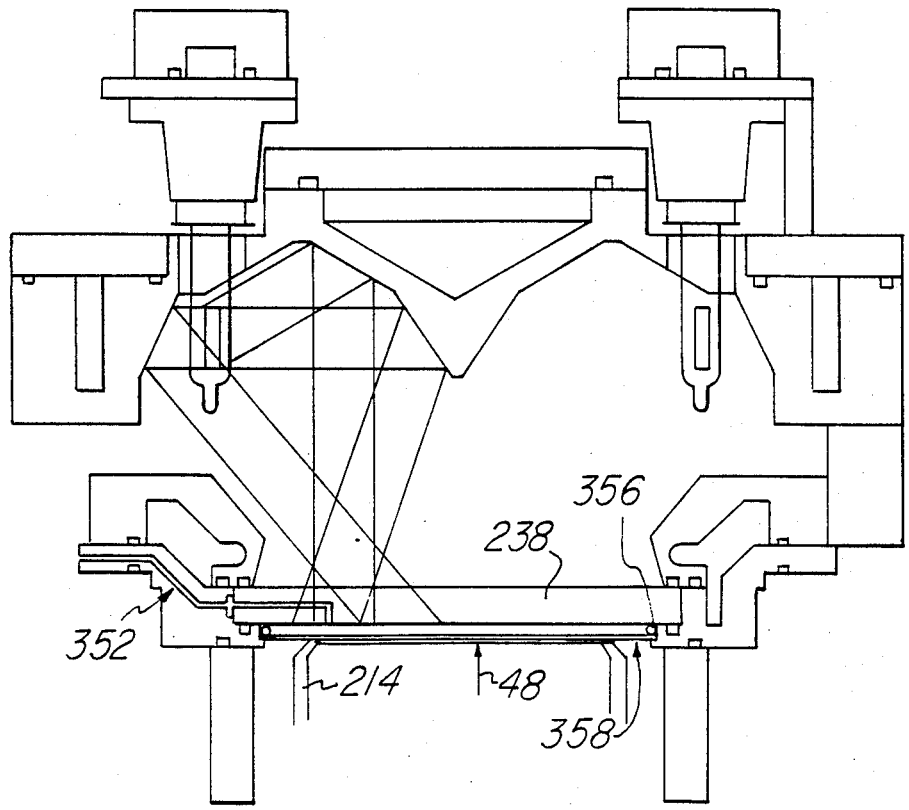

FIGS. 21A and 21B depict two modifications which reduce conductive thermal coupling between the wafer 48 and a transparent vaccum wall 238 in a vacuum processing system with rapid thermal processing capability. Note that the reflector configuration shown in these Figures is shaped differently than that shown in FIG. 18.

FIG. 21A shows an example of an embodiment wherein most of the surface area of the wafer 48 does not make contact with the transparent vacuum wall 238. Instead, the transparent vacuum wall 238 is formed to include a downwardly extending ring 350 which makes contact with wafer 48 close to the circumference 49 of the wafer 48 when the wafer 48 is raised by the three support fingers 214. A purge gas line 352 permits a purge gas (e.g. Ar, Argon) to be supplied to the backside of the wafer 48.

FIG. 21B shows an example of an embodiment wherein the wafer 48 does not make direct contact with the transparent vacuum wall 238 at all. Instead, a second transparent plate 358, which is thinner than the vacuum wall 238, contacts the wafer 48 when the it is pushed against it by fingers 214. The plate 358 is located below wall 238. Since the second transparent plate 358 is substantially thinner than the transparent vacuum wall 238, conductive coupling to it exerts less thermal loading on the wafer than full contact with the transparent vacuum wall 238 would. In the sample embodiment, the vacuum wall is 0.5 inches thick, and the second transparent plate 358 is 0.06 inches thick. Again, a purge gas line 352 permits a purge gas (e.g. Ar) to be supplied to the backside of the wafer 48. It is useful to have the second transparent plate 358 is spaced away from the transparent vacuum wall 238.

The purge gas supply used in both these embodiments helps in achieving a uniform temperature distribution across the wafer. In addition, purge gas supply to areas near the transparent vacuum wall helps prevent deposition or etching effects from accumulating to degrade transparency or generate particulates.

FIG. 21C shows yet another technique for reducing conductive thermal coupling between wafer 48 and a transparent vacuum wall 238 in a vacuum processing system with rapid thermal processing capability. The wafer 48 is supported by three support fingers 214 at a height such that, when the top chamber 218 is closed, the wafer is a small distance (e.g. 1 mm) away from the vacuum wall 238.

The techniques for reducing conductive thermal coupling shown in FIGS. 21A, 21B, and 21C are useful for wafer processing they could be applied to other types of work pieces.

Since the transparent vacuum wall 238, which can be made of quartz, experiences large temperature swings and must maintain a vacuum seal to a chamber which is generally fabricated out of metal, which has a quite different coefficient of thermal expansion, it may be advantageous to use a specialized vacuum seal like that shown in FIG. 21D between the transparent vacuum wall 238 and the reactor body. Such seals (which are known commercially as Helicoflex (TM) seals) include an Inconel (TM) helix 660 enclosed in a stainless steel jacket 662, with a soft metal jacket 664 (e.g. aluminum) surrounding the sealing surface of stainless steel jacket 662. When the seal is tightened down. The plastic deformation of the soft metal jacket 664 provides a leak free seal. Elastic deformation is primarily provided by the stiff Inconel helix 660.

Such seals have been suggested for use in ultra high vacuum systems (which are periodically baked out, at temperatures of, e.g., 600 degrees F) as indicated in: I. Sakai et al., "Sealing Concept of Elastic Metal Gasket 'Helicoflex'", 32 *Vacuum* 33 (1982); Hajime Ishimaru et al., "Bakable Aluminum Vacuum Chamber and Bellows with an Aluminum Flange and Aluminum Seal for Ultra High Vacuum", 26 *IEEE Transactions on Nuclear Science* 4000 (1979); R. B. Fleming et al., "Development of Bakable Seals for Large Non- Circular Ports on the Tokamak Fusion Test Reactor", 17 *Journal of Vacuum Science and Technology* 337 (1980); Hajime Ishimaru et al., "Bakable Aluminum Vacuum Chamber and Bellows with an Aluminum, Flange and Aluminum Seal for Ultra High Vacuum", 15 *Journal of Vacuum Science and Technology*, 1853 (1978); all of which are hereby incorporated by reference. Applicants believe that such seals were originally marketed for their ability to tolerate high pressure differentials at relatively high temperatures (e.g. 600 degrees F) and still maintain a vacuum seal, but it is not known that such a seal has ever been suggested to provide a vacuum seal between two dissimilar materials in rapidly changing temperature environments, nor specifically for rapid thermal processing in vacuum processing systems.

It should be noted, however, that applicants' experimental results have shown that an elastomer seal will generally serve satisfactorily, as long as the elastomer seal material is not exposed to the radiant heating.

Figure 22:
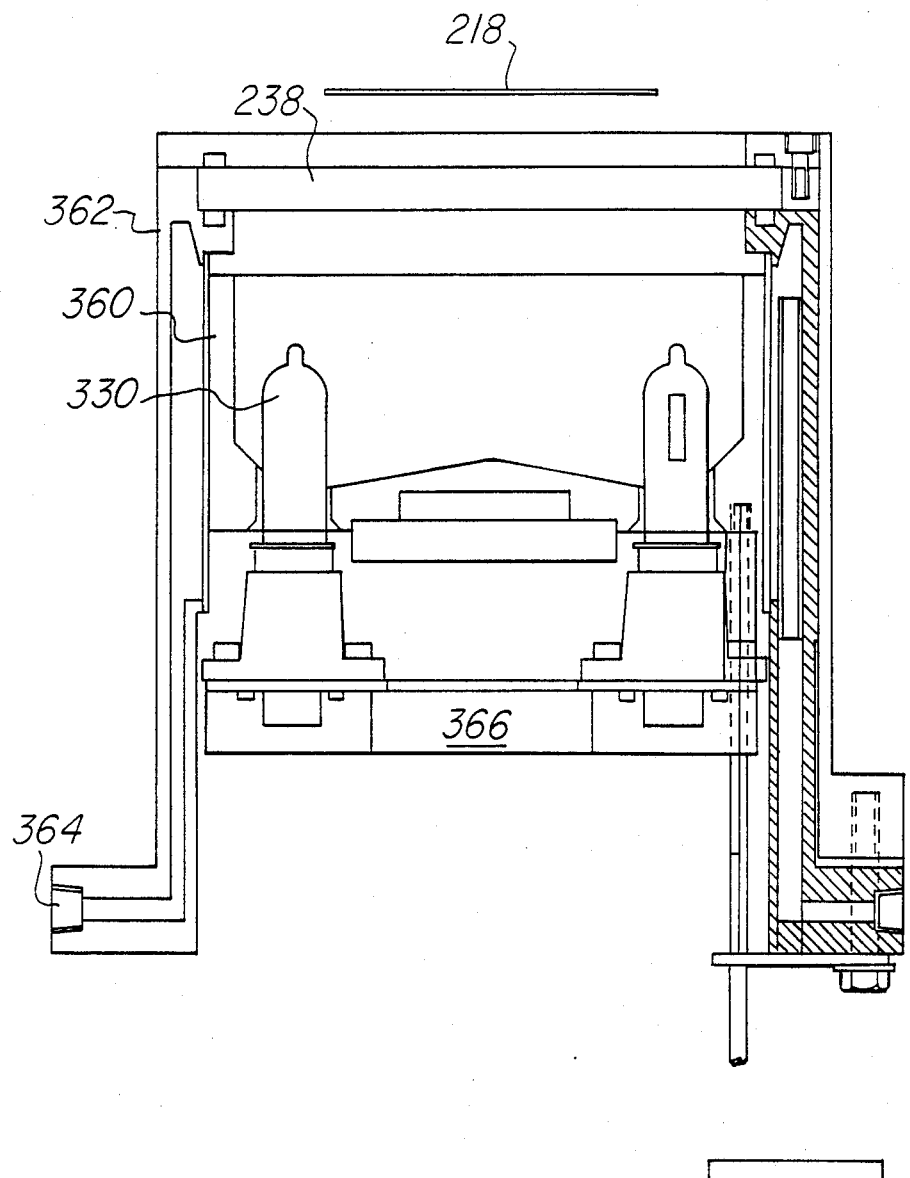
FIG. 22 shows another configuration of a heat source for rapid thermal processing, in which the overall width of the heat source is minimal.

As mentioned above, the radiant heating modules usefully include cooling passages, since the power levels typically used (12–50 kW lamp power) are such as to promptly melt even a gold-coated aluminum reflector. However,, FIG. 22 shows an alternative structure, wherein this is achieved indirectly. Part of the reflector 360 does not include cooling passages, and therefore the overall width of this embodiment of the radiant heating module is less than it would otherwise be. Cooling is achieved by choosing a size for the sidewalls of reflector 360 such that the radiant heating module is a slip fit into the inside diameter of housing assembly 362, which includes cooling passages 364. Thus, when the lamp power is turned on, the reflector 360 will heat up and expand until its sidewalls make good contact to the housing assembly 362; but at that point thermal conduction into housing assembly 362 will provide efficient cooling, so that the heating of reflector 360 is inherently self-limiting. The base 366 of the radiant heating module has its own cooling passages (not shown), but these passages and their connections do not increase the overall width of the heating module. Thus, the example shown in FIG. 22 provided a heating module which fit into a standard 10-inch vacuum flange, while providing a radiant heat source almost 10 inches wide. The depth of seating if of course chosen so that efficient radiative coupling through transparent vacuum wall 238, behind which lies top chamber 218. The enhanced vacuum flange compatibility makes this embodiment particularly advantageous for use in combination with an ultra-high vacuum process station (i.e. a process module which operates at pressures of $10^{-9}$ Torr or less).

The process module shown in FIG. 22 has separate energy sources for internal remote microwave plasma generation, RF in situ plasma generation, and radiant heat applied to the same process chamber within the module. The energy sources can be separately controlled either singly or in any combination. The process module provides dry in situ cleanup, high temperature native oxide removal, enhanced film deposition utilizing Radiant Heat. It is also capable of lower temperature epitaxial film growth with a remote plasma source combined with radiant heat. Furthermore, it is capable of dry etch, including isotropic and anisotropic processes, by using in situ RF and remote plasma in combination. Pre-etch, etch, and post etch processes, direct react and/or rapid thermal processes can also be performed. The process module can, therefore, sequentially perform several different process without moving the wafer.

As shown in FIG. 23, a wafer 48 is shown below a transparent vacuum wall 238 which is located above and spaced a short distance away. A purge gas line 352 is provided to supply gas to the face of wafer 48 which is closest to wall 238. The arrangement of the wafer 48, wall 238, and the heating module is similar to that in FIGS. 21A and 21B. However, in FIG. 23 a silicon electrode 670 is provided between wall 238 and wafer 48. It is the silicon electrode which will be heated directly and the wafer will be heated by thermal conduction. The silicon electrode 670 through RF conductor ring 672. The wafer 48, silicon electrode 670, and RF conductor ring 672 are all electrically coupled. FIG. 23 shows a process module 675 which can have both remote (supplied by a gas distributor such as feed 250 in FIG. 16) and in situ plasma (through a gas distributor such as distributor 212 in FIG. 16).

FIG. 23 has four separate energy sources, internally generated ultraviolet energy, remote MW (microwave) plasma generation, RF in situ plasma generation, and radiant heat. Each source is separately controllable and can be used singly or in any combination. Process module 675 can provide dry in situ cleanup. Process module 675 can be used for high temperature native oxide removal, enhanced film deposition utilizing ultraviolet light and radiant heat simultaneously, or any other combination of energy sources desired, low temperature epitaxial film growth with remote MW (Microwave) plasma source combined with radiant heat, or any other combination of energy sources desired, dry etch, including isotropic and anisotropic processes, by using in situ RF and remote MW (Microwave) plasma in combination, or any other combination of energy sources desired Pre-etch, etch, and post etch processes, and direct react and/or rapid thermal processes.

Figure 24:
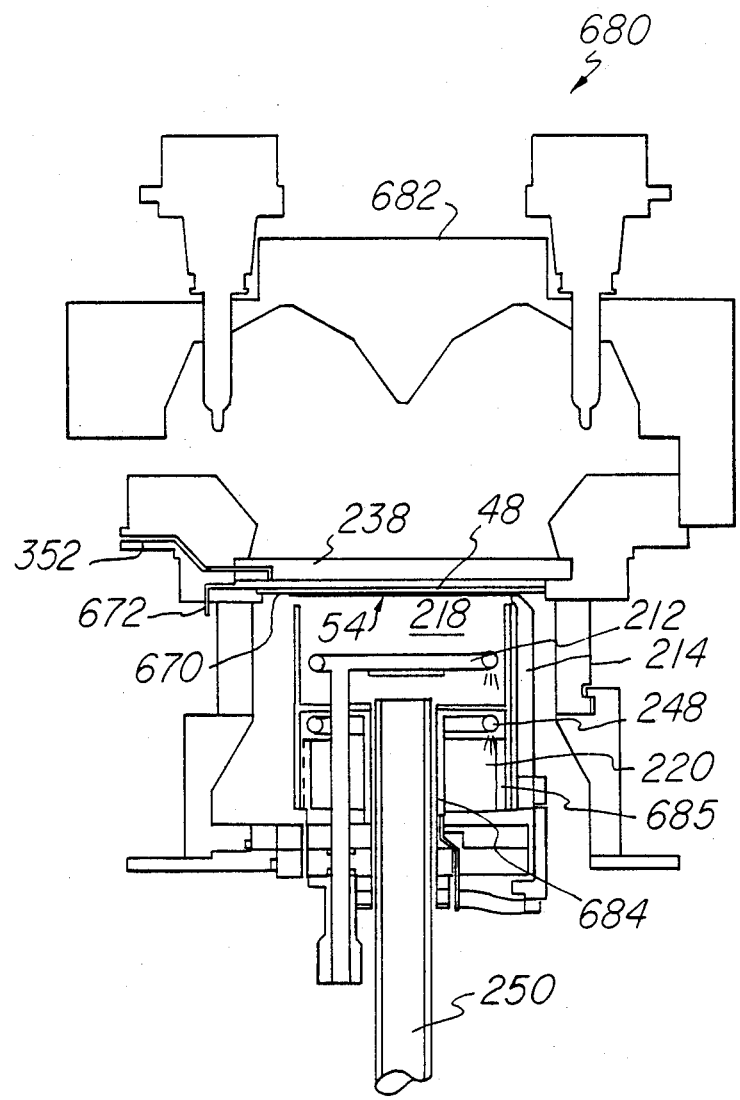
FIG. 24 shows a process module, which provides combined capabilities for high-temperature processing (and cleanup), plasma bombardment, provision of remotely generated activated species to the wafer face, and illumination of the wafer face by intense ultraviolet light generated in situ.

The process module 680 shown in FIG. 24 is similar to process module 675 of FIG. 23 but with the inclusion of an additional source of ultraviolet light. The lamp module 682 is located is located above transparent vaccum wall 238. A wafer 48 is shown located below wall 238. A silicon electrode 670 is located between wall 238 and wafer 48. The silicon electrode 670 is spaced from wall 238 and in contact with wafer 48. A RF conductor ring 672 is in contact with the silicon electrode 670 to supply RF power for the formation of in situ plasma adjacent face 54 of wafer 48 in top chamber 212. Gas purge feed 352 performs the same function as described above. Remote plasma is provided through feed 250. Process gas distributor 212 provides process gas adjacent the face of the wafer 48. Quartz baffle 232 is H-shaped in cross-section. Fingers 214 support the wafer 48 against electrode 670. Gas distributor 248 supplies gas for ultraviolet plasma space 220. Electrodes 684 and 685 provide arranged along the inner and outer vertical walls of space 220 provide the necessary voltage for the formation of plasma within space 220. In general, the lower portion of the module 680 is similar to module 620.

One process which has been successfully demonstrated permits etching copper-doped aluminum (Al:Cu) films, for example, heavily copper-doped aluminum. RF power is used to generate a plasma and provide plasma bombardment at the wafer face, and the feed gas mixture includes $BCl_3$, chlorine, and a hydrocarbon source (e.g., an alkyl, such as methane). Depending on the underlying material, a post-etch stage at lower pressure may be used to remove low-volatility residues.

A sample embodiment of the process discussed has been successfully demonstrated as follows: The starting structure included a 5000Å thick layer of aluminum doped with 2% copper. Initial gas flows included 60 sccm of $BCl_3$, 20 sccm of $Cl_2$, and 5 sccm of $CH_4$, at a total pressure of 100 milliTorr and an applied RF power level of 350 Watts, in a single wafer reactor wherein the wafer is held in a face-down position. In general, the power supplied could be between 300 and 1000 watts. In an example, of how the flow rates can vary, $Cl_2$ could have flow rates with the range of 10 to 100 sccm, $BCl_3$ within the range of 60 to 250 sccm, and $CH_4$ between 0 to 15 sccm. The upper limit of the pressure is about 0.5 Torr.

In a first embodiment, it was found that these conditions would provide clean removal of Al:Cu over oxide. In a second embodiment, it was found that, when a copper-doped aluminum film over tungsten was etched with these conditions, some copper residue would remain. In this second embodiment, a post-etch was used, in which, for 120 seconds, the gas flows were changed to 90 sccm of $BCl_3$ and 15 sccm of $Cl_2$ at a total pressure of 40 millliTorr and an applied RF power level of 250 Watts. The resulting structure showed nearly vertical etched sidewalls, little or no line width erosion, and approximately 2.5 to 1 selectivity to photoresist, and left a clean surface (without any copper residues).

While this embodiment provides tremendous advantages, however, another embodiment provides yet further advantages. The reactor used is one like that shown in FIG. 23 and 24, which permits both radiant heating and plasma bombardment to be applied to the wafer face. During the etch, the wafer is heated to (e.g.) about 200 C, which prevents copper residues from remaining in place.

A further advantageous use of the radiant heating capability in this embodiment is to enhance removal of residues from the chamber walls. For example, a very efficient chamber cleanup can be performed, after the wafer has been removed, by heating the susceptor to a significantly higher temperature than the processing temperature (e.g. 700 C). Since the processing chamber is so small, the chamber walls will all be at least somewhat thermally coupled to the susceptor by radiant heat transfer. A feed gas which will produce very active dissociation products in a plasma can be flowed in, and the combination of the high temperature and the active species will remove residues very fast. Suitable feed gases would include a chlorine source such as $BCl_3$, or a fluorine source such as $SF_6$.

In an alternative embodiment, radiant heating is used to heat the wafer to temperatures of, e.g., several hundred degrees during the process. This process can provide rapid etching of heavily copper-doped aluminum (e.g. 2% copper) without leaving copper residues on the wafer. Oxygen would also have to be utilized in the cleanup operation.

Figure 25A:
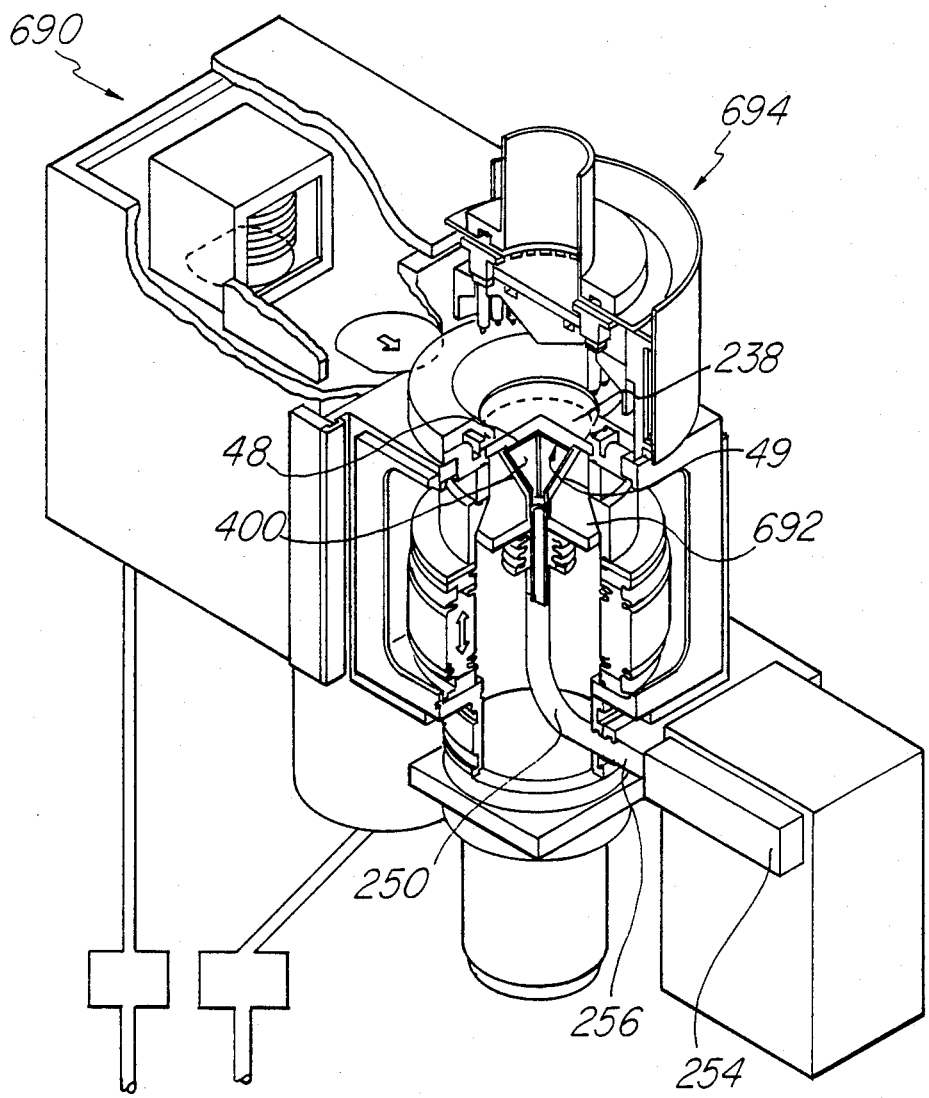

FIG. 25A shows an overview of a module for edge-preferential processing for photoresist edge bead removal and for simultaneous photoresist bake, but the concepts described here are also applicable to systems for accomplishing other process steps. FIG. 25A shows a process module 690 which is connected, in this embodiment, by a quartz outlet tube 256 to a remote plasma chamber 254 which generates activated species in the process gas flow, as discussed above. A conical baffle 400 is used to provide enhanced reaction rates at the edge of the wafer. The baffle 400 and the support 692 for a channel which is V-shaped in cross-section. The gas from feed 250 connected to tube 256 is directed upward and outward by the channel formed between the baffle 400 and support 692. The gas exits the channel near the circumference 49 of wafer 48. The wafer 48 is located between the top of baffle which has its cone pointed downward and a transparent vacuum wall 238. A heating module 694 is located above the wall 238.

FIG. 25B shows a more detailed view of a process module 695 which is somewhat similar to that of FIG. 25A. These two embodiments differ primarily in that the wafer is heated, in FIG. 25A, by a radiant heating module which illuminates the wafer through the transparent vacuum wall 238 or alternatively, which illuminates a silicon susceptor which the wafer is pressed against, whereas in FIG. 25B it is simply a resistively heated susceptor 252.

In FIG. 25B, the gas flow of activated species from remote plasma chamber 254 (FIG. 25A) is connected to a funnel shaped gas distributor 416 by a slip-fit joint 258 (similar to that shown in FIG. 9) between the funnel shaped gas distributor 416 and the feed 250. The slip-fit 258 is provided to accommodate the upward and downward movement of the process module 295 which open and close the process chambers of the various modules disclosed herein. The feed 250, which is an extension of tube 256, can be, as described above, a quartz tube which does not move as the reactor opens and closes. A bellows 414 encloses the slip-fit joint, to make it effectively gas-tight without requiring any sliding joint which might introduce particulates, but alternatively a slip-fit joint like that shown in FIG. 14 which is merely vented to the exhaust space could be used instead.

The generally conical baffle 400 is supported inside the funnel shaped gas distributor 416 by small protrusions (not shown) to defien a channel or flow path 408 which is about 1 mm thick. Spring pins 406, mounted on the funnel shaped gas distributor 416, hold the wafer 48 against the heated susceptor 252, which is preferably shaped to include a recess 412 which is about 0.5 inch deep around the circumference 49 of the wafer 48. This recess 412 facilitates removal of the backside bead. When photoresist is spun on (i.e. deposited as a liquid onto a spinning wafer), the resulting edge bead will normally extend around the whole edge of the wafer, front and back, even though resist is not coated onto most of the area of the backside, and removal of this backside bead is a significant difficulty in dry processing methods for edge bead removal. A ring-shaped protrusion 404, surrounding the recess 412 in the susceptor, further assists in enhancing the dwell time of activated species near the circumference 49 of the wafer. This edge bead is a source of particles during handling and processing.

The choice of temperature is determined by the type and state (baked or unbaked) of the photoresist. Higher temperatures yield faster rates. Changing the process chemistry can, however, significantly compensate for lower temperature processing. For processing patterned, unbaked resist films of conventional type, it was found that the maximum temperature for operation was 100 C. Above this temperature the resist began to flow, ruining pattern definition.

The flat or base side 420 of the conical baffle 400 is held close to the wafer 48 during the processing operations. The radius of the base side 420 of conical baffle 400 is about 1 mm less than the radius of the wafer 48. The conical baffle 400 is usefully fabricated from aluminum which has been hard anodized over its entire surface except for its flat base side 420. This flat base side 420 is reactive enough to help getter activated species which diffuse in past the edge of the flat base side 420 and which therefore might erode the resist material in more central parts of the wafer 48.

Even with the native oxide present this aluminum face still has substantial ability to scavenge oxidizing species such as ozone or monatomic oxygen which diffuse in past the edge of the distributor, so that the edge-preferential selectivity of the operation is improved.

Edge selectivity is further enhanced by bleeding a purge gas supplied at connection 410 through vent line 402, which runs through the conical baffle 400 to exit in the narrow space e.g., about 1 mm high) between the base side 420 of the conical baffle 400 and the wafer face 54.

To accelerate the reaction rates, the susceptor 252 is heated to a temperature of at least 100 C. Temperatures of 120°–130° C. are useful for conventional resist materials, but the choice of temperature will depend on the particular process conditions. For example, resist materials which have a higher reflow temperature will generally permit a higher temperature.

Edge bead removal may also be useful, in some processes, as a step performed after ashing has removed the resist from most of the wafer's face where total removal of resist is the desired end, and a particularly stubborn edge bead remains after the rest of the resist has been removed, the structure of FIG. 25B may optionally be operated at high temperatures such as 300 C.

A sample process recipe which has successfully demonstrated photoresist edge bead removal is as follows: in a reactor configuration like that shown in FIG. 25B, a process gas flow of 1000 sccm $O_2$ plus 200 sccm $H_2$ and 1 Torr total pressure was activated by a 400 W microwave discharge upstream of the wafer, while the susceptor 252 was held at 100 C. In 120 seconds this sample process embodiment successfully removed the edge bead (estimated to be about 3 microns thick) which resulted from spinning on a 2 microns thick coat of photoresist. The heat applied during this time also accomplished the "soft bake" which is well known as a useful step in photoresist processing.

Figure 26A:
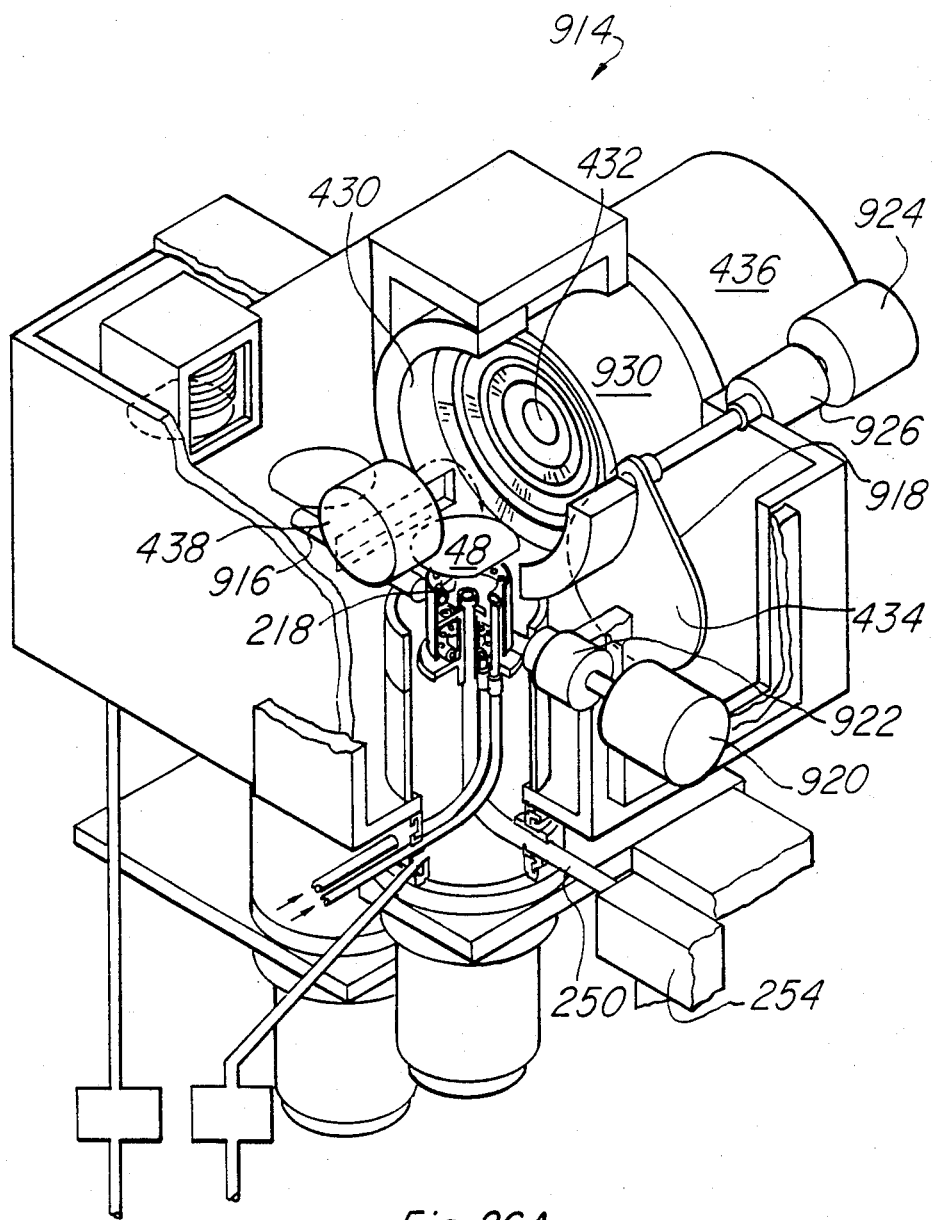
FIG. 26A shows a process module which permits cleanup and sputter deposition.

FIG. 26A shows a sample embodiment for a single wafer sputtering system with in situ cleanup for wafers 48, which includes, unlike any of the embodiments described thus far, not only the top chamber 218 below the wafer 48, but also an upper process space 430. The top chamber 218 is used for in situ cleanup, and the upper process space 430 is used for sputter deposition, but other uses of this system's capability are possible.

Figure 26B:
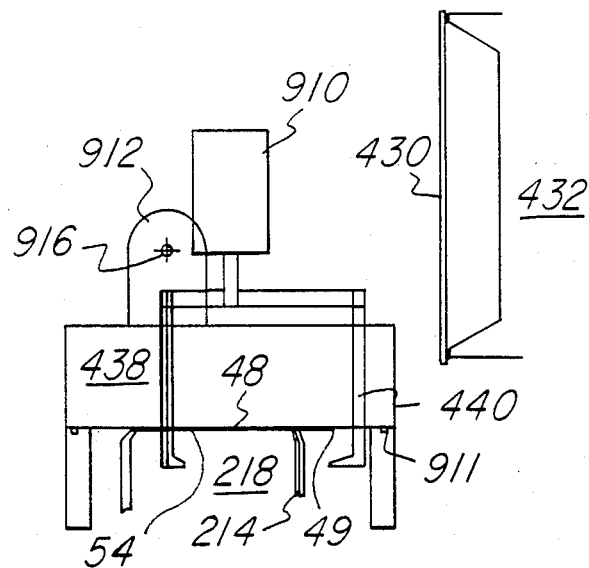
FIG. 26B and 26C show details of the module of FIG. 26A, including a system for wafer transport within the module.
Figure 26C:
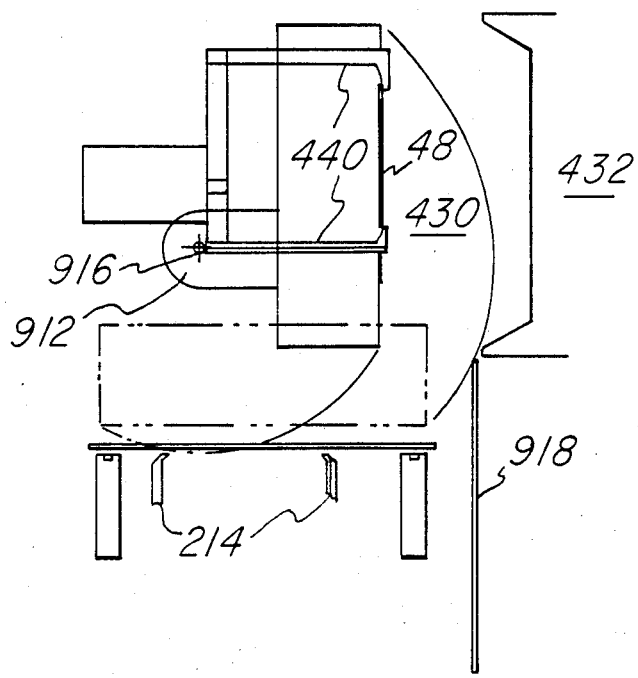

This sample embodiment also differs somewhat in the wafer transport used. The wafer transfer arm 28 places the wafer 48 down onto three support fingers 214 (only two of which are shown in FIG. 26B and FIG. 26C) which are mechanically supported from below, such as the three support fingers 214 (FIG. 12). The wafer 48 would have been placed onto fingers 214 by the arm 28 as discussed above. The fingers 214 are then moved upward until the wafer 48 contacts the susceptor 438 and the chamber is sealed. One or more seals 911 is located between the the susceptor 438 and the top of vertical exterior wall 913 (as shown in FIG. 26B) of chamber 218. A process step can then be carried out in the top chamber 218 (FIG. 26A) is desired. Three fingers 440 (only two of which are shown in FIG. 26B and 26C. The fingers 440 extend downward (as shown in FIG. 26B) around the pivotable susceptor 438. The fingers 440 could alternatively extend through the susceptor 438. The fingers 218 and 440 would be spaced at 120 degree intervals about the same vertical axis although the fingers 218 and 440 would be offset from each other about the axis. When motor or solenoid 910 is actuated the fingers 440 move upward along the vertical axis and engage the wafer 48 at locations adjacent is circumference 49. Face 54 of the wafer 48 is facing downward and the fingers 440 engage the face 54 close to the circumference 49.

A support 912 (FIGS. 26 B and C) is attached to susceptor 438 and to another motor 920 (FIG. 26A). The motor 920 is mounted on the outside of the process module 914 and is connected through a vacuum seal 922 (FIG. 26A) to support 912. Thus, support 912 is rotatably attached to the general support structure of process module 914 (FIG. 26A) and rotates about the axis 916 (FIG. 26A). When support 912 rotates about axis 916 in a counterclockwise direction as shown in FIG. 26B it moves the position shown in FIG. 26C which is 90 degrees form the position shown in FIG. 26B. The susceptor 438, solenoid 910, and afer 48 are also rotated. A shutter 918 is located to selectively cover the sputter target 432. The shutter 918 is shown in the close position in FIG. 26B and in the open position in FIG. 26C and FIG. 26A. The shutter 918 is rotated by a motor 924 (FIG. 26A) between its open and closed positions. Motor 924 is mounted on the outside of process module 914 and is connected through a vacuum seal 926 to the shutter 918.

After the wafer is transferred onto fingers 214 by arm 28 and the arm is retracted, the fingers 214 are moved upward to clamp wafer 48 to susceptor 438. This is the position shown in FIG. 26B. While the wafer is in the horizontal position shown in FIG. 26B, a cleanup operation, for example, can be performed, e.g. by flowing a $CF_4$ plus $O_2$ mixture through a remote plasma and also optionally providing ultraviolet illumination in situ from a plasma which is remote from the wafer face, as discussed above.

After the above operation, the fingers 440 move upward and clamp wafer to susceptor 438. The fingers 214 are then lowered and the top chamber 218 opened. The susceptor is rotated counterclockwise from the somewhat horizontal position shown in FIG. 26B to the somewhat vertical position shown in FIG. 26C by motor 920 (FIG. 26A). The wafer 48 is transferred to process space 430 by pivoting the susceptor 438 using motor 920. After the wafer is in its upper or vertical position, as shown in FIG. 26C, a shutter 918, which, for example, can be pivoted on another axis, at right angles to the axis on which the pivotable susceptor 438, is used to ensure isolation from the top chamber 218.

After the wafer 48 is rotate to the vertical position shown in FIG. 26C, the sputter module 930 can be powered up momentarily to clean the target by sputtering onto the shutter 918, while the shutter 918 is in its closed position as shown in FIG. 26B. The shutter 918 is then retracted to its open position as shown in FIG. 26C. Sputter deposit accomplished under fairly conventional conditions. The upper chamber is then held at a pressure of less than 100 mTorr (e.g. 30 mTorr), the shutter 918 is rotated to uncover the sputter target 432, and a potential of 1000 V is applied between the cathode 436 (FIG. 26A) and the sputter target 432. To enhance deposition efficiency, a smaller bias (e.g. 200 V) can be applied between the wafer 48 and the sputter target 432. After the sputter operation is completed the shutter is closed and the susceptor 438 and wafer 48 are rotated to the position as shown in FIG. 26B.

If it is desired to perform a process in the top chamber 212, the fingers 214 are raised and the top chamber 212 is closed. Then the fingers 440 are lowered. The desired process is performed, for example, a cleanup process. The wafer can then be transferred from the process module 914 by an arm 28 as described above in connection with FIGS. 1, 3, and 4.

In the alternative the wafer can be transferred from the process module 914 transfer arm 28 can enter into the process module 914 after the susceptor 438 is rotated clockwise to the position in FIG. 26B. The arm can after being positioned below the wafer 48, be moved vertically until the pins 50 (FIGS. 1 and 3) are i contact with the wafer 48. The fingers 440 are then lowered and the arm 28 lowers slightly and exits the process module 914. The pressure during the sputter should be less that 200 mTorr.

Figure 27:
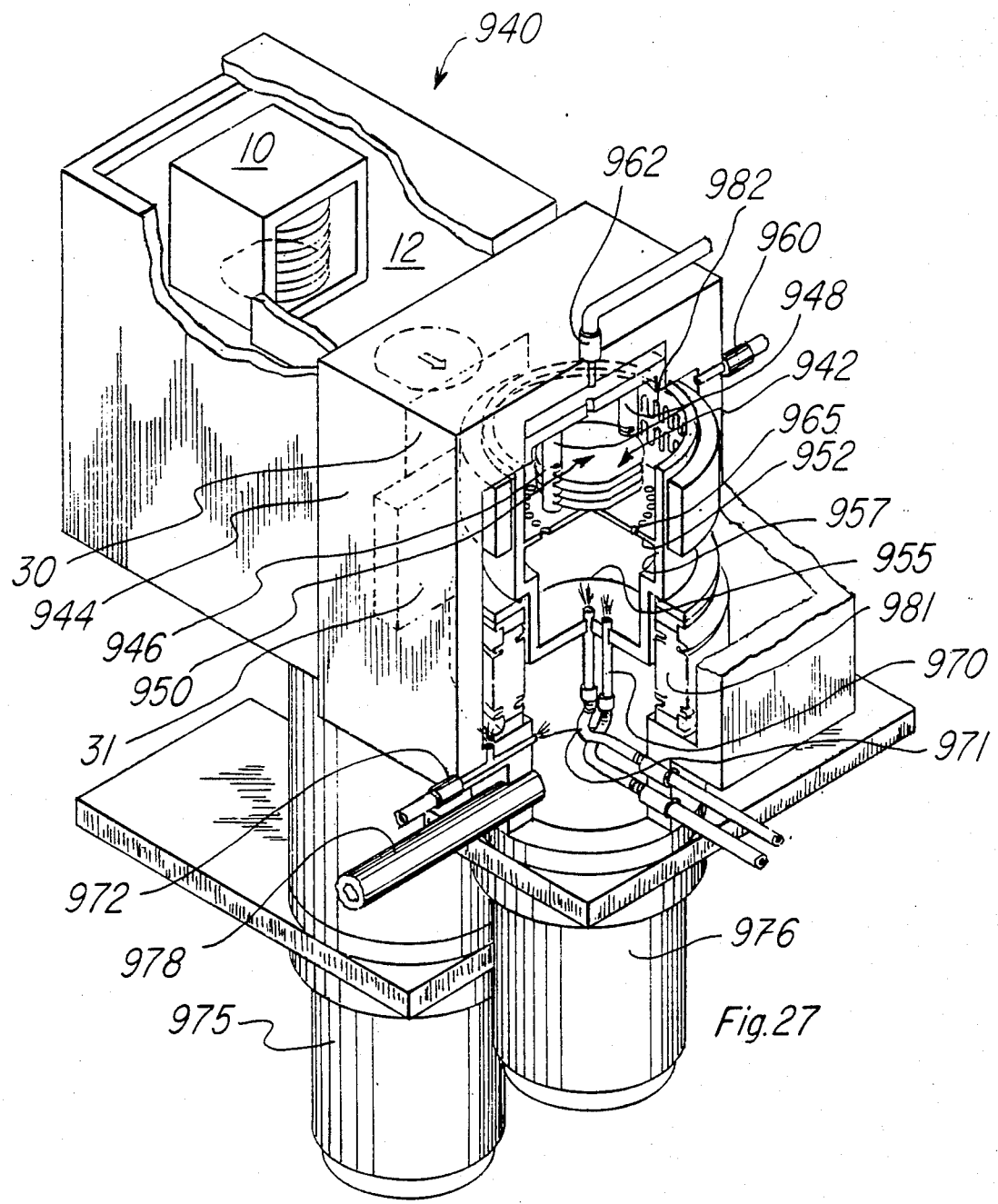
FIG. 27 shows a process module, compatible with a vacuum processing system, wherein multiple wafers are simultaneously processed under high pressure (or optionally under low pressure).

FIG. 27 shows a process module 940, which has the capability of processing several wafers 942, similar to wafer 48, simultaneously. A chamber 12 and an arm 28 as discussed in FIGS. 1,3, and 4 transfer the wafers from a carrier shown in FIG. 1 to the process module 940. The process module 940 has a steel outer jacket 944, which is adapted to with stand high pressure, for example, 100 atmospheres. The jacket 944 can be made, for example, of 300 series stainless steel. The wafers 942 are placed into the process module 940 by an arm (not shown) similar to arm 28 (FIGS. 1, 3, and 4). The wafers are places into slots 946 of quartz rods 948. The quartz rods 948 extend vertically through the top chamber 950. Although only two rods 948 are shown in FIG. 27, additional rods can be provided, for example, a rod positioned on the right side of the chamber 950 to engage the wafers 942 as positioned in FIG. 27. The distance between the slots 946 can be sufficient to allow the arm to reach into the stacked wafers 942 to extract. In the alternative, the bottom slot of slots 946 can be a sufficient distance from the bottom 952 of chamber 950 that the arm can place the bottom most wafer. The wafers 942 can then be placed from the top slot into each of the intermediate slots with the bottom slot filled last.

The interior wall 957 of chamber 950 and lower chamber 955 are made of quartz. The space between the jacket 944 and interior wall 957 is equalized with the pressure in chamber 950 during the high pressure operation in order to minimize the stress on the interior wall. Controlled check gas valves 960 and 962 which are connected to the space between the jacket 944 and interior wall 957, and chamber 950, respectively are used by the computer control system 206 to control the pressure so that the stress of the pressure differential on the interior wall 957 does not become too great by venting excess pressure as required. For example, if the pressure within chamber 950 becomes greater than the pressure in the space between jacket 944 and the interior wall 957, the system 206 operates valve 962 and releases pressure until the pressures are at an appropriate level, for example, about equal.

Bottom 952 has a plurality of holes 965 which allow gas supplied to the lower chamber 955 to move upward into chamber 950 above. The gas to the lower chamber 955 is supplied through pipes 970 thru 972. The pipes 970-972 can be made of any suitable material. Pipes 970 and 971 supply process gases at high pressure (100 atmospheres) to lower chamber 955 which are used within chamber 950 to perform the desired process. Pipe 972 supplies a purge gas to the space between the jacket 944 and interior wall 957. The necessary vacuum is supplied to chamber 12 by pump 975, chamber 955 by pump 976, and chamber 955 by another pump (not shown) through pipe 978. The process chamber 950 of process module 940 unlike other other process modules shown herein does not seal by moving the wafer upward into a top chamber. In module 940 the process chamber 950 is sealed and unsealed by moving a vertical section 980 of the interior wall 957 upward and downward utilizing bellows 981. In the open position for transfer arm 28 similar to arm 28 has access to chamber 950 to transfer wafers 942 through port 30 when gate 31 is open (as shown in FIG. 27). The processing takes place when the chamber 950 is closed. A heater 982 is located on the interior wall 957 within the chamber 950 to apply heat for the process being conducted within chamber 950.

In operation, carrier 10 is opened and the wafers 947 are transferred from from carrier 10 into chamber 950 under vacuum (as discussed above with reference to FIGS. 1, 3, and 4). The gate 31 is then closed. Gas is supplied into the space between the jacket 944 and the interior wall 957 and the chambers 950 and 955 from pipes 970 and 971. The chamber 950 is then closed and the processing is performed at high pressure with gas supplied through pipes 970, 971 and 972 which can be, for example, $O_2$, Hydrogen, and Nitrogen, respectively. Heat from heater 982 can be applied as desired. After the processing over and the gas from pipes 970 and 971 is discontinued, the chamber 950 is purged by gas from pipe 972, for example $N_2$. The chamber 950 is then brought to the desired vacuum. A vacuum process can then be performed is desired. The chambe 950 is opened and the wafers transferred through port 30 to carrier 10. The carrier 10 will be closed as discussed above with reference to FIG. 1, 3, and 4. Although the module 940 is shown as capable of accepting 5 wafers the module can be adpated to provide for more or less. Less than 5 wafers can be processed at a time, for example, one wafer.

A high pressure process module which is compatible with a system wherein integrated circuit wafers are largely transported and processed under vacuum. The pressure vessel can be extremely small, for example, 0.2 liters i.e. has a total pressurized volume of which almost all interior points are within one or two centimeters of one of the wafers which may be loaded into the chamber.

The module 940 has other uses such as slow processes which are reaction limited such as oxide growth where it is useful to have several wafers processed simultaneously. This can be done as desired without the gas being aplied from pipes 970-972. Thus this module 940 is adapted to process Application specific Integrated Circuits.

The mechanical strength constraints of high pressure operation are easier to design for. This also means that pressurization and vent down of the high pressure module can be performed more rapidly. Also, the capability to perform high pressure processing (e.g. high pressure oxidation) in a module compatible with a vacuum processing system, increases throughput and eliminates the need to perform necessary oxidation steps external to a vacuum processing system.

This class of embodiments provides the capabilties of a conventional furnace (which is normally a high-particulate operation), while advantageously allowing compatibility with a low-particulate vacuum processing system. Moreover, this class of embodiments advantageously provides the capabilities of a conventional furnace (which normally requires a relatively large amount of floor space and plumbing) in a very compact area.

In an example of the use of process module 940, HgCdTe can be processed to form passivation layers using gas phase oxidation or sulfidization at high pressure. The HgCdTe substrates are heated to 50 between 150 degrees C and a thin oxide film formed. A source of sulfur, for example, $H_2S$ can be supplied from pipe 970 at, for example, 100 sccm at a pressure of 50 to 100 atmospheres. A thin sulfide insulating film would be formed, It is also possible to provide oxidation by using oxygen at, for example, 100 sccm and hydrogen at 40 sccm, for example, to produce a water vapor/oxygen mixture at a pressure of 10 to 100 atmospheres.

Figure 28:
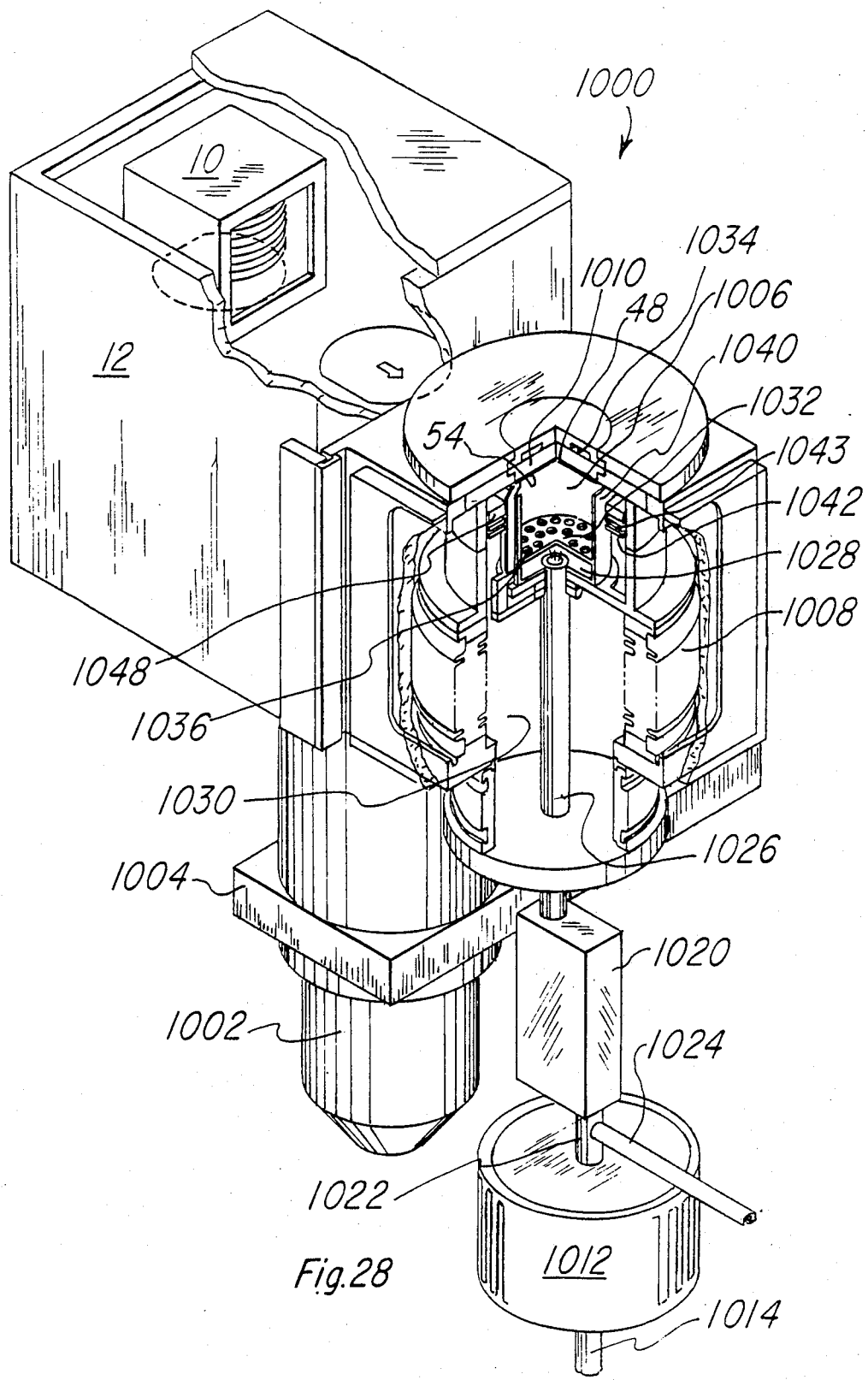
FIG. 28 shows a sample embodiment of an ion implanter process module which is compatible with a vacuum processing system.

FIG. 28 show a process module 1000 which is adapted for use as an implanter. An implanter is utilized to place or implant dopants into the surface of a wafer, for example, wafer 48. The wafer 48 is placed into the module 1000 by an arm (not shown) similar to arm 28 discussed above with reference to FIGS. 1, 3, and 4. The chamber 12 and carrier 10 are utilized above as discussed with reference to FIGS. 1, 3, and 4. A vacuum pump 1002 and a valve 1004 are connected to the interior of module 1004 to provide the required vacuum. Other pumps and valves can be provided as necessary.

The wafer 48 is placed into the top chamber 1006 by the arm (not shown) from carrier 10 through chamber 12 and a port (similar to port 30 in FIG. 3). The wafer is placed onto fingers 214 which can be constructed from hard-anodized aluminum or silicon so that the fingers are conductive. The top chamber 1006 is closed by the upward vertical movement of a bellows 1008. The fingers 214 raise the fingers 214 until the wafer contacts an electrode 1010 in the upper portion of chamber 1006. This is the position of wafer 48 show in FIG. 28. Gas, which contains the substance to be implanted into the downward face 54 of wafer 48, enters a heating chamber 1012 thru a pipe 1014 from a gas source (not shown), for example, As. Within the heating chamber 1012 the gas from pipe 1014 is heated to the appropriate temperature for the particular dopant, for example, 350 degrees C for Arsenic and 280 degrees for Phosphorus. The gas then flows upward into a microwave cavity 1020 through a pipe 1022. An additional gas can be introduced into the cavity 1020 through a pipe 1024, for example, He or Ar. also additional gases, for example, BF₃ for use as a p-type dopant can be feed through pipe 1024. The gas is subjected to microwave energy within cavity 1020. The gas becomes free radicals within cavity 1020 with a pressure of, for example, 0.1 Torr. The gas exits the cavity 1020 and passes through a pipe 1026 into a lower chamber 1028 located below top chamber 1006. The pipe 1026 passes through the central portion of a chamber 1030 below lower chamber 1028. The chamber 1028 is partially surrounded along its vertical axis by bellows 1008.

The gas passes upward from the lower chamber 1028 through a quartz shower head 1032 into top chamber 1006. Shower head 1032 extends horizontally between top chamber 1006 and and lower chamber 1028. The shower head has a number of openings 1036 which allows the gas in lower chamber 1028 to pass into chamber 1006. The shower head is a part of a quartz baffle 1040. The baffle 1040 is a cylindrical shape with its axis extending vertically through the central portion of chamber 1006 and 1028 with the shower head 1032 extending horizontally. The shower head 1028 can be of the type shown in FIG. 30C, if desired. Within chamber 1006, the gas is accelerated toward wafer 48 to implant the substance in the gas into the face 54. The ion current must be adjusted according to the pressure within the chamber 1006. Two bias plates 1042 and 1043 are located around the baffle 1040 outside chamber 1006. The plates 1042 and 1043 have negative and positive voltages, respectively, applied. Plate 1042 is located below and is separated from plate 1043. A magnet 1048 is located just above the plate 1043. Generally, the magnetic field needs to be of sufficient strength to repel the free electrons from the wafer surface 54. A positive voltage is applied to electrode 1010, for example, 100 to 10,000 volts. The free radicals are controlled within the chamber 1006 and are accelerated toward and into the wafer 48. The electrode 1010 can be cooled by passing fluid through openings 1034, if necessary.

The process module 1000 which is compatible with a system using vacuum wafer transport in which wafers are generally transported and processed in a face down position under vacuum.

The process gas lines 32 and the other feeds, gas lines, and pipes such as pipes 970 thru 972 shown herein are formed (or coated) to have tiny grooves on their inner surfaces or riblets to reduce a particle entrainment at the surface. The use of riblets on the exterior of an air vehicle for reducing drag has been suggested by "Grooves Reduce Aircraft Drag", *NASA Technical Briefs* 5(2), page 192 (1980), and "Mission Accomplished", *NASA Technical Briefs* 11(3), page 82 (1987). However, in the present invention riblets are used to stabilize a stagnant boundary layer on the walls of the piping, and therefore reduce the chance that the gases flowing through the piping will exert sufficient pressure on a particle adhering to the walls to detach it. for any given degree of cleanliness of process gas source, this advantageously reduces the number of particles which are transported into the process chamber while entrained in the gas.

Several embodiments of the shape and size of these riblets are shown in FIGS. 29A, 29B, 29C, 29D, 29E, 29F and 29G. Although the NASA Technical Briefs cited suggest the use of riblets on the exterior of air vehicles, it is an advantage of the present invention that it utilizes these grooves of riblets to reduce the chance that gases flowing through piping will exert sufficient pressure on a particle adhering to the walls to detach it.

The NASA publications indicate that the grooves confine incipient bursts of turbulence so that they cannot expand and disrupt the boundary layer surrounding a moving aircraft. As shown in FIGS. 29A-G, most embodiments of the grooves are generally V- shaped, but they may take a variety of configurations. For example, they may have rounded or sharp peaks in symmetrical or asymmetrical cross sections. Asymmetrical grooves of various cross sectional geometries may be arranged in some regular sequences to optimize the aerodynamic performance. Thus, in the present invention, these grooves or riblets are used to stabilize a stagnant boundary layer on the wall sof the piping. For any given degree of cleanliness of process gas source, this advantageously reduces the number of particles which are transported into the process chamber while entrained in the gas. Although only one or two grooves or riblets is shown in each of the drawings 29A-29G, many such grooves or riblets would be included as a part of the interior wall of the pipes, feeds, distributors etc. shown in connection with the process modules disclosed herein.

Figure 29A:
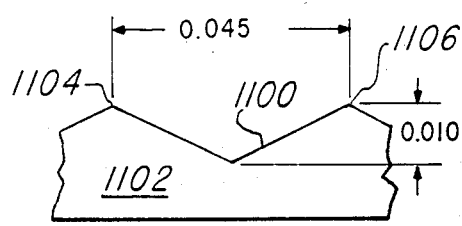
FIGS. 29A through 29G are magnified sectional views of the inner walls of process gas piping, in several sample embodiments which provide advantages in a semiconductor process modules.

FIG. 29A shows a V-shaped groove 1100 in the wall of pipe 1102. Only a part of the pipe 1102 is shown in a cross-section taken across a part of the interior wall of the pipe, which is true of the other pipes in FIGS. 29A thru G. The groove 1102 can be 0.010 inches deep and 0.045 inches wide from peak 1104 (on the left in FIG. 29A) to peak 1006 (on the right in FIG. 29A).

Figure 29B:
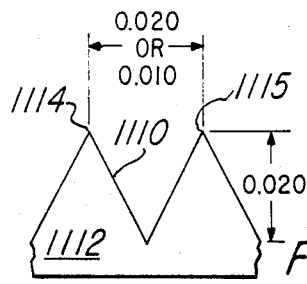

FIG. 29B shows another V-shaped groove 1110 in the wall of pipe 1112. Groove 1110 is in the range of 0.010 to 0.020 inches wide between peaks 1114 (left) and 1115 (right) and has a depth of about 0.020 inches.

Figure 29C:
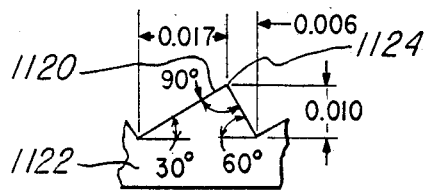

In FIG. 29C, a protrusion 1120 extends from the interior wall of pipe 1122. The protrusion 1120 has a triangular cross-section with a 90 degree angle at the peak 1124 and a 30 degree angle at its base on the left and a 60 degree angle at its base on the right. The distance from the pea 1124 to the base can be, for example, 0.01 inches and the distance across the base can be, for example 0.023 inches. The grooves or riblets would be formed between the various protrusions. Another protrusion 1150 in a pipe 1152 is shown in FIG. 29F with the same basic shape as protrusion 1120. Protrusion 1150 has the same angles with a distance across its base of, for example, 0.046 inches and a height from the base to its peak 1154 of, for example, 0.02 inches.

Figure 29D:
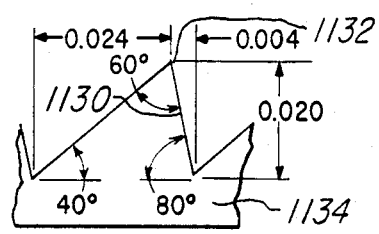

Another triangular protrusion 1130 is shown in FIG. 29D. Protrusion 1130 has a 60 degree angle at its peak 1132 and a 40 degree angle at its base on the left and an 80 degree angle at its base on the right. The protrusion extends from the interior wall of pipe 1134. The distance across the base of the triangular shape can be about 0.028 inches with the distance from the base to the peak 1132 about 0.020 inches. Another protrusion 1160 in a pipe 1162 is shown in FIG. 29F with the same basic shape as protrusion 1130. Protrusion 1160 has the same angles as protrusion 1130 with a distance across its base of, for example, 0.028 inches and a height from the base to its peak 1164 of, for example 0.02 inches.

Figure 29E:
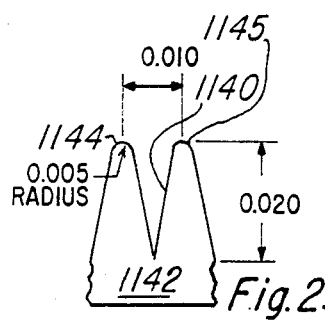
Figure 29F:
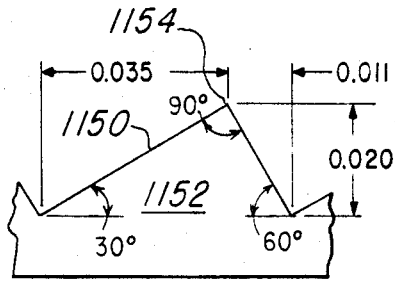
Figure 29G:
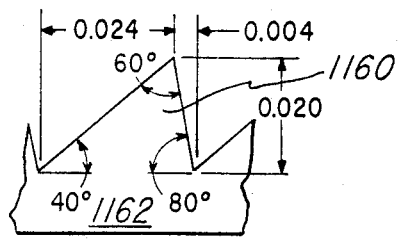

FIG. 29E shows a V-shaped groove 1140 in the interior wall of pipe 1142. The distance between the peaks 1144 (left) and 1145 (right) can be, for example, about 0.010 inches. The peaks 1144 and 1145 are rounded. The groove 1140 can be, for example 0.020 inches deep.

One class of processes which has shown very significant success in reactors of the kind described above is anisotropic fluorine etches for materials including refractory metals.

It has been found that a combination of a hydrocarbon with a bromine source, for example, HBr or $CF_3Br$, provides a very potent passivating chemistry for fluorine-based etches. A fluorine source such as $SF_6$, $NF_3$, HF, $F_2$, $CF_4$, $C_2F_6$, $BF_3$ or $SiF_4$ can be used for the fluorine-based etch. For example, one embodiment which has been successfully demonstrated is as follows: the starting structure included a thin film of rungsten. Initial gas flows included 50 sccm of $SF_6$, 5 sccm of $CH_4$, and 15 sccm of HBr, at a total pressure of 250 milliTorr and an applied RF power level of 500 Watts. After the pattern had begun to clear, an additional flow of 20 sccm of $WF_6$ was added, as will be further discussed below. The resulting structure showed nearly vertical etched sidewalls, only slight linewidth erosion, and excellent selectivity to resist. In another process, a source of Fluorine with $WF_6$ acting as a load during overetch has been found to reduce line width loss.

By increasing the fraction of $CH_4$ and also that of the bromine source, even more robust passivant action can be achieved. The following conditions produce were found, for example, to produce zero linewidth erosion: 40 sccm of $SF_6$, 15 sccm of $CF_4$, and 25 sccm of HBr, at a total pressure of 470 milliTorr and an applied RF power level of 400 Watts. The use of relatively high total pressure assists in maintaining uniformity.

If the rate of passivant deposition is increased still further, negative etch bias can be achieved. In a sample embodiment, a thin film of tungsten was etched using the following initial gas flows: 50 sccm of $SF_6$, 18 sccm of $CF_4$, and 25 sccm of HBr, at a total pressure of 470 milliTorr and an applied RF power level of 400 Watts. The resist pattern used had 2.7 micron minimum pitch (1.7 micron minimum line width and 1 micron minimum space width). The use of this chemistry was found to produce finally etched space widths of 0.6 to 0.7 microns. Thus, this chemistry provided a "negative etch bias" of approximately 0.15–0.2 micron. As an upper limit, further experiments demonstrated that increasing the flow of methane to 21 sccm, without changing the other conditions, shut down the etch entirely, i.e. the tungsten etch rate went to zero.

It has also been discovered that this class of passivating chemistries provides a highly anisotropic silicon etch. One specific sample embodiment, which was successfully demonstrated by experiment, used an etch chemistry as follows: Initial gas flows included 50 sccm of $SF_6$, 5 sccm of $CH_4$, and 15 sccm of HBr, at a total pressure of 250 milliTorr and an applied RF power level of 500 Watts.

These conditions etched 3 microns deep into silicon in 25 seconds, and produced an approximately vertical silicon sidewall while maintaining excellent selectivity to resist. However, these etch conditions are not particularly selective to oxide. Thus, this etching chemistry is extemely useful for etching trenches. The advantages of trenches in device structures have long been recognized, but they have usually been fabricated by low-pressure etching conditions which are slow and are prone to produce very undersirably etching artifacts such as retrograde bowing, grooving, or asperities on the bottom of the trench. It is also an advantage of the avoiding these difficulties of low-processing.

Another alternative family of chemistries for fluoro-etching uses a feed gas mixture which includes a fluorine source such as $SF_6$) plus a bromine source such as HBr plus a very weak oxygen source (e.g. carbon monoxide). This chemistry provides anisotropic high rate fluoro-etching with good selectivity to photoresist.

A sample embodiment of the process discussed has been successfully demonstrated as follows: The starting structure included a thin film of tungsten covered by a patterned layer of developed organic photoresist. Initial gas flows included 25 sccm of $SF_6$, 25 sccm of HBr, and 40 sccm of CO, at a total pressure of 300 milliTorr and an applied RF power level of 175 Watts. During the overetch period an additional flow of 20 sccm of $WF_6$ is usefully added. The resulting structure showed steeply sloped sidewalls, only moderate linewidth erosion, and approximately 2 to 1 selectivity over photoresist.

This chemistry could be modified by substituting another weak oxygen source for the carbon monoxide. That is, weak oxygen sources such as $N_2O$ or $CO_2$ could be used instead. In fact, it would even be possible to derive some benefit by using an extremely small flow (less than one sccm) of $O_2$ in place of the CO, but such very small flows are difficult to control reproducibly with conventional semiconductor manufacturing equipment.

Another, alternative, family of chemistries for fluoro-etching uses a feed gas mixture which includes a fluorine source (such as $SF_6$) plus a fluorosilane (e.g., $SiF_4$), plus a bromine source (such as HBr), plus a weak oxygen source such as carbon monoxide. This chemistry provides anisotropic high rate fluoro- etching with good selectivity to photoresist.

A sample embodiment of this process has been successfully demonstrated as follows: The starting structure included a thin film of tungsten, covered by a patterned and developed layer of organic photoresist material. Initial gas flows included 25 sccm of $SiF_4$, 25 sccm of $SF_6$, 25 sccm of HBr, and 30 sccm of CO, at a total pressure of 350 milliTorr and an applied RF power level of 175 Watts. During the overetch period an additional flow of 30 sccm of $WF_6$ is added to the other flows described, to avoid resist erosion. The resulting structure showed nearly vertical etched sidewalls, only slight linewidth erosion, and approximately 3 to 1 selectivity to the photoresist.

Figure 30A:
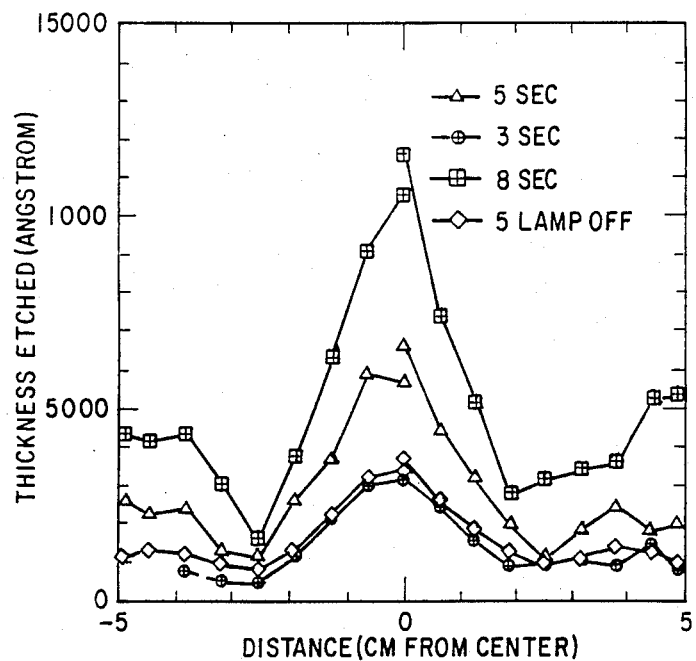
FIGS. 30A through 30E show a distributor structure, and show the improved results achieved with this structure in a descum process.

A two-stage showerhead 280 (FIG. 30C) is placed between the end of the third gas feed 250 and the top chamber 218 near the lower face 54 of wafer 48. An example of such a showerhead is shown in FIG. 30C. Two baffles 284 and 286, held horizontally in fixed relationship within a housing 282 with baffle 286 located below baffle 284. Third gas feed 250 is located below baffle 286 and the gas passes upward from the gas feed 250 through holes 290 in baffle 286 and openings 1202 in baffle 284. Both baffles are both placed to block the flow of the process gases from the third gas feed 250 into the wafer top chamber 218, and the two baffles are aligned so that no hole 288 in the second baffle 284 is directly aligned with any hole 290 in the first baffle 286. The shower head 280 can be utilized as desired with the process modules disclosed herein. The housing 282 can have several shapes and can for example have a funnel shape with the narrow portion of the funnel located around the feed 250 an the baffles located above in the cylindrically shaped portion of the funnel.

The two-stage showerhead is, in this embodiment, made of "tufram-coated" (a Teflon-impregnated (TM) anodized) aluminum. Teflon, or quartz. Successful experiments have demonstrated that some other showerhead geometries also work (e.g., a quartz tube with a circular ring, with gas dispersion holes placed away from the wafer), but the two-stage showerhead is more useful due to its high throughput and uniformity.

As remote plasma processing is relatively new, prior methods of dealing with nonuniformity are few. One manufacturer has used a single showerhead with fairly large holes (about 0.25" i.d.) in two concentric circles, with one smaller hole (about 0.15" i.d.) in the center. Although this is an improvement over no showerhead, as another another commercial photoresist stripper is set up, significant higher stripping rates still occur at the center of the wafer. The pattern of resist removal visibly copies the pattern of holes in the showerhead. A plot of resist removal across the wafer is shown in FIG. 30A. For comparison, results without any showerhead are shown in FIG. 30B.

Figure 30B:
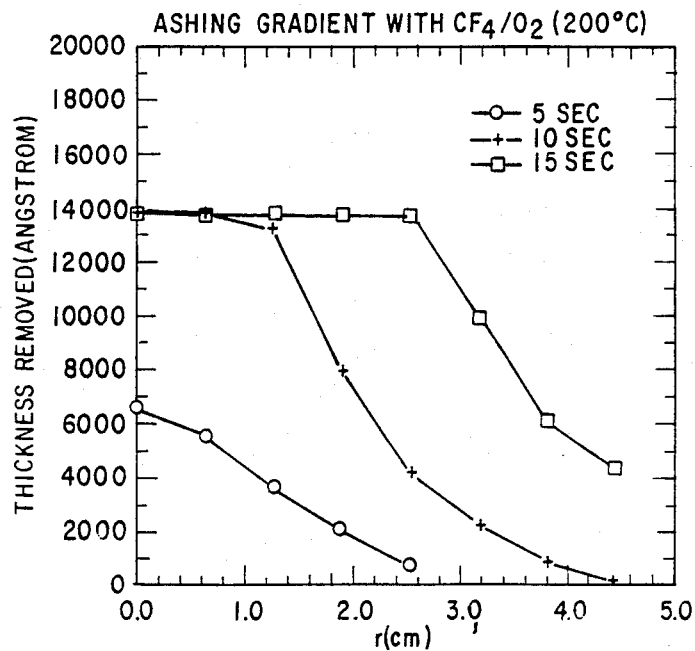
Figure 30C:
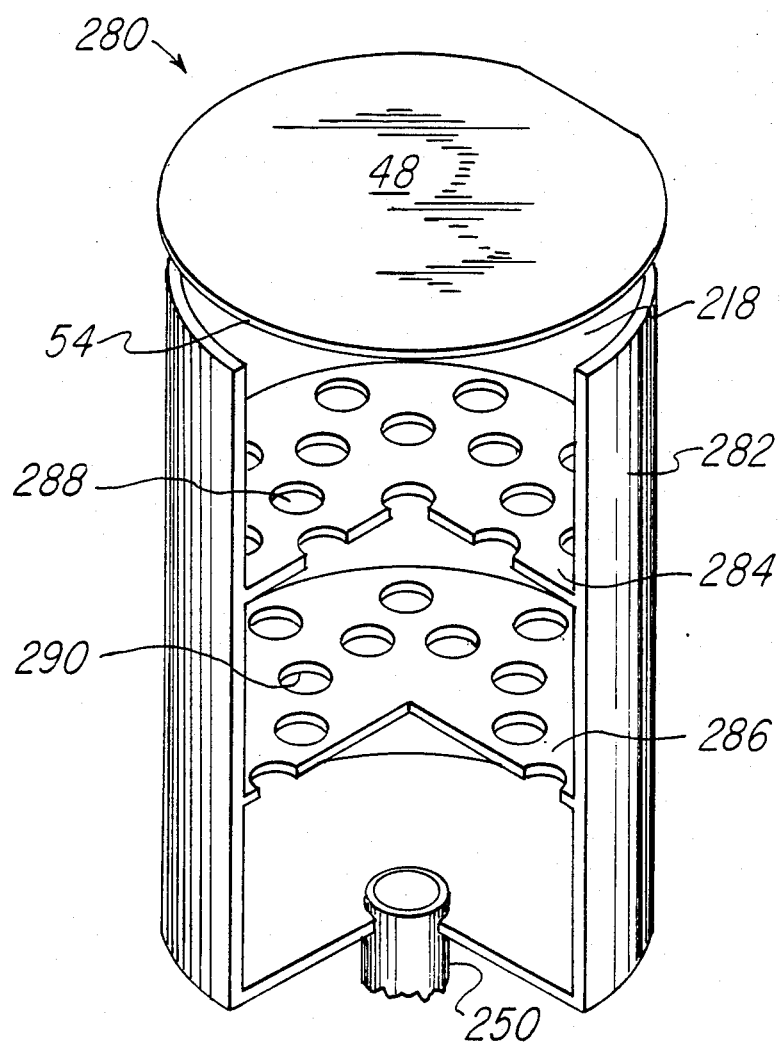

The curves in FIG. 30B show that as the distance from the center of the wafer increases the amount (thickness) of the resist removed decreases. The curves in FIG. 30A that the use of the two stage shower head greatly improves the uniformity of the resist removal.

The failure of the single showerhead is due to the nature of the gas flow in the reactor. The flow is viscous and laminar, resulting in a velocity profile across the tube that goes as $$v(r) = 2 <v> \left(1 - \frac{r^2}{R^2}\right)$$

Near the tube wall (r=R) the gas velocity is very low, while at the center of the tube (r=0) the gas is moving much faster, up to twice the average velocity, $<v>$. When gas with such a velocity distribution impinges on the wafer, more reactants will be transferred where the velocity is high, rather than where it is low. This causes the observed nonuniformity, but the embodiments disclosed here solve this problem.

The solution lies in reducing the differences in velocity from one point to another in the gas stream. This must be done downstream of the discharge tube, where the reactor cross section is large, so that the gas flow will not return to the steady state given by Equation 1 before reaching the wafer. since gas passing directly through a showerhead hole will not have its velocity significantly changed, no gas parcel may be allowed a direct or "line-of-sight" passage from the discharge tube to the wafer. If an line-of-sight passages remain, gas will pass preferentially through them.

To prevent line-of-sight passage, a second showerhead or baffle is required. The essential feature of this baffle is that it block direct flow of gas from the discharge tube through the lower showerhead, as shown in FIG. 30C. By doing so, gas parcels will become sufficiently mixed so that a relatively uniform velocity profile will emerge below the lower baffle. The first showerhead component encountered by the flowing gas may consist of (1) a number of connected baffles to block direct passage of gas through the second showerhead component; or (2) a single solid baffle to completely arrest forward motion, forcing velocity vectors to change from the axial direction to the radial, before encountering the second showerhead component; or (3) a structure intermediate between (1) and (2).

Figure 30D:
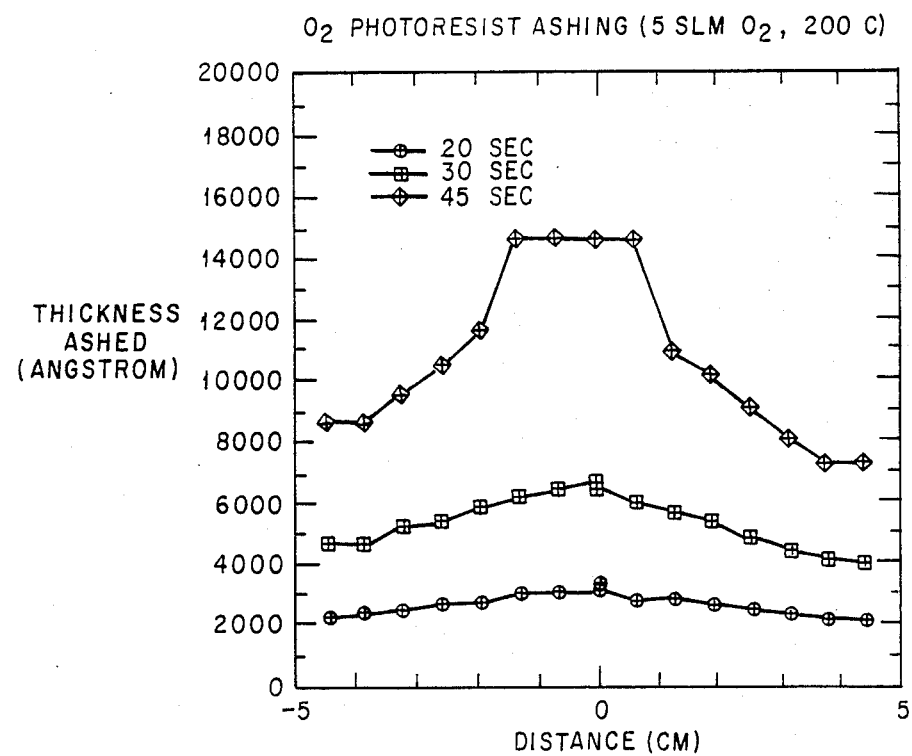

The results of using another shape for the baffles and housing is shown in FIG. 30D. The curves in FIG. 30D shows the improved, but not yet optimized, ashing uniformity that resulted from an implementation of the two-stage showerhead concept, where the first showerhead consisted of a conical baffle just covering the central hole in the second showerhead. This can be compared to FIG. 30A, which was obtained using the second showerhead without the baffle even through the specific chemistry employed was different. This shower head can have a baffle like baffle 284 shown in FIG. 30C. It can also have a lower baffle which is a cone position just above the end of feed 250 with the point of the cone directed upward. The diameter of the cone can be just greater than the diameter of the feed 250. It is also possible to invert the cone. Other two shower head arranges are possible.

Figure 30E:
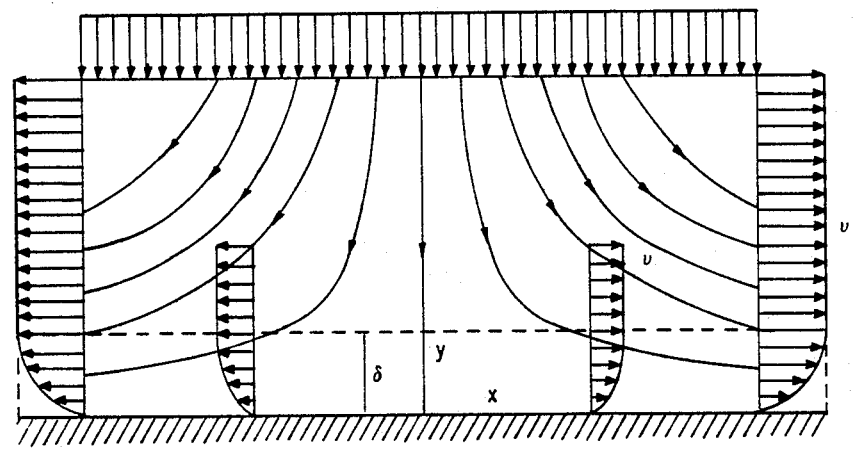

The chamber walls need to lie sufficiently far from the showerhead and wafer so that subsequent slowing of gases along the wall does not significantly affect the newly developed gas velocity distribution before the wafer is reached. The effect of this uniform velocity distribution is to create a uniformly thick boundary layer of thickness d over the surface, as shown in FIG. 30E. Taken from H. Schlichting, "Boundary-Layer Theory," (7th ed. 1979), which is hereby incorporated by reference. A uniform boundary layer will lead to uniform transport of reactants to the wafer.

The material forming the showerhead may be of ceramic, hard anodized aluminum, stainless steel, Teflon, or quartz—the choice depending on compatibility with process gases. The dimensions can be chosen to fit any wafer size, provided that the reactor wall be far enough from the wafer not to affect the uniform velocity profile. The size of holes should be reasonably large (probably 0.1"-0.25") so as to not significantly impede overall gas throughput or cause loss of reactive species on its surface, and to assist in machining. The distance between the two showerhead pieces should be at least as large as the hole diameter. The two showerhead parts may be oriented for face-down processing.

Thus, this class of embodiments provides the following advantages: (1) application to all isotropic processing in fast flowing remote plasma systems, (2) promotion of uniform processing results, (3) maintenance of high reactant throughput for high rates of etching and deposition, (4) flexible materials choice for process compatibility, (5) comprehension of face-down processing.

Some relevant background information may be found in the article by C.J. Howard at vol. 83, J. Phys. Chem., page 6 (1979), which is hereby incorporated by reference.

One process disclosed herein provides a descum process which is a process for removal of polymers and other organic residues. The process uses a remote plasma, supplied through a distributor which includes two-stage showerhead (FIG. 30C), to achieve improved results.

A general processing requirement when using photoresists is a step referred to as "descum." Normal photoresist processing does not provide a totally clean pattern after the resist has been exposed and developed. There are areas in the pattern which are desired to be cleared and still contain a significant residue of high-molecular-weight polymeric compounds. Normally, these must removed by an aggressive isotropic etch. For example, a layer of photoresist which is 1.4 microns thick in unexposed areas may still contain resist residues of 0.5 micron or more in the areas which need to be cleared. Conventionally this is done as a wet processing step, but the embodiment disclosed here provides a way to perform this function in a dry process.

In one embodiment of this process, descum of patterned photoresist was successfully demonstrated using a process mixture of 1000 sccm $O_2$, 200 sccm $H_2$ at 100 C and 1 Torr total pressure. The choice of mass flows was set to result in a high removal rate, proportional to $Oc_2$ mass flow, but retaining uniform removal across the wafer which is inversely proportional to mass flow and pressure. The reactor is set up with all gases passing through a remote plasma chamber 254 powered at 400 W.

The process chemistry can alternatively consist of $O_2$ plus one or more of the species: $N_2O$, $H_2O$, $H_2$, $CF_4$, $CHF_3$, $HCl$, $HBr$, and $Cl_2$. Of these, $H_2$ is the most useful in some instances additive gas for the following reasons: (a) the $N_2O$ additive does not enhance the rate as much as $H_2$, particularly at lower temperatures; (b) halogen-containing gases present some risk of deleteriously affecting the metals present on the substrate. If this constraint were lifted, $CF_4$ and $CHF_3$ would be very good choices, because they could provide descum rates as much as one order of magnitude faster than $H_2$. The remaining problem with $CF_4$ and $CHF_3$ is reactor materials-compatibility problems due to the presence of F atoms. This could be solved by using a Teflon (TM) showerhead.

The hydrogen species used may be participating advantageously in the reaction by assisting in the opening of unsaturated bonds in the resist material.

Selectivity is not tremendously crucial in descum processes, but in fact the process described does have good selectivity to silicon, which is an advantage.

The resist used was standard positive resist. In the test example specified. Shipley 1813 (TM) resist, which had been developed with an MF-314 developer, was used. Patterning was performed at an i-line wavelength, for about 250 msec, to give "scum" due to underexposure. The resist was on bare Si, for the purpose of study, but in actual use the process would be carried out with photoresist on top of a film to be etched, e.g., aluminum. The sample was processed to leave a substantial amount of unexposed photoresist between desired patterns. In fact, it is estimated, by measurements of SEM pictures, that there was as much as 5000 Angstrom of photoresist remaining between desired resist patterns, which is at least an order of magnitude worse than what would likely be encountered in a real life case. In the present case, the intermeidate "scum" was removed in 6 min., according to optical microscopy. Thus, in a real case, with more like 500Å of scum typically present, processing should take less than 1 minute.

A general problem with processes which use a remote plasma to generate activated species for etching or deposition applications is poor process uniformity across the surface of the wafer. This is a consequence of gas hydrodynamics which causes the formation of a boundary layer of stagnant gas just over the surface of the wafer. The stagnant gas hampers the transfer of reactants and products to and from the wafer. The problems are exemplified in photoresist ashing, where resist removal is typically several times higher immediately under the discharge tube's entrance to the reaction chamber than at the edge of the wafer. In this instance, the poor uniformity frustrates the use of such equpment for descumming applications. The teaching in the present application of using a specially designed two-stage showerhead will as a gas distributor in remote plasma applications provides the advantage of greatly improved unformity.

Referring now to FIG. 31, there is depicted a block diagram of the electrical instrumentation and control system 700 for a vacuum processing system. This system can be controlled by a computer control system 206 which could be an 8088-based PC, or specifically, a Texas Instruments Professional Computer. The computer control system can be programmed to perform a specific processing sequence upon demand. Once the process is initiated, the computer control system 206 monitors and controls the process flow.

The system has a number of process monitoring instruments which provide input signals to the control system 206 and based upon those inputs and the preprogrammed process sequence, the control system 206 provides outputs either to controllers or directly to specific components. Each of the inputs and outputs of computer control system 206 will be described below.

After the the vacuum wafer carrier 10 (FIG. 1) has been placed in the vacuum load lock chamber 12 and shut the load lock lid 20, he then begins the automated process sequence. Keyboard interaction with the computer control system including process sequence and start is menu driven. During the initial start up sequence, before the actual processing has begun, the roughing pump, turbo molecular pump, and if necessary a cryogenic vacuum pump are all started.

The purge and pump down dunctional sequence is shown on FIG. 11 and reference is made to it where appropriate. When the process 800 is started, the computer control system sends a signal to the roughing pump controller for the load lock 701 which, as shown in step 804, sends a signal to open the roughing pump load lock isolation valve 702. The roughing pump then begins to draw a vacuum in the vacuum load lock chamber 12.

As shown in step 802, the control system 206 then sends a signal to open the load lock nitrogen purge valve 703. This begins a nitrogen purge of the load lock chamber 12 in order to blow any particulate that has contaminated the external surface of the vacuum wafer carrier 10 off of the surface and allow its removal by the vacuum system. It also allows removal of any particulate that has found its way into the vacuum load lock chamber 12 during the loading sequence.

The control system 206 then provides a pressure set point signal to the load lock pressure controller 704 which provides electrical signals to the load lock pressure control valve 705 during this nitrogen purge as indicated by step 808.

The load lock particulate sensor 202 and particle counter 850 provide an input signal to the computer control system corresponding to the number of particles which it detects during this purge process as shown in step 806. When the particle counter 850 detects no particles for a predetermined time period, as indicated by step 810, the control system 206 sends a signal to shut the load lock nitrogen purge valve 703, as shown in step 814, and to fully open the load lock pressure control valve 705, as shown in step 812, via the load lock pressure controller 704 which completes the purge process.

As indicated in step 816, the control system 206 then sends a signal to the load lock turbo pump controller 706 which opens the load lock turbo pump isolation valve 707.

The turbo molecular pump continues pumping down the load lock until the vacuum in the load lock is equal to or greater than that in the vacuum wafer carrier 10. Vacuum load lock vacuum is provided as an input to the computer control system from load lock vacuum gage 62, as shown in step 818.

After the vacuum has been sufficiently lowered, the control system 206 sends a signal to the vacuum wafer carrier door motor 707 to fully open the vacuum wafer carrier door 14, as shown in step 822. The door 14 normally remains open until the last wafer has completed the processing sequence.

Wafers 48 can then be moved from a wafer carrier 10 to the process chamber in any order desired via the transfer arm 28 which is controlled by the control system 208. Before the control system 206 will allow the transfer arm 28 to move the vacuum wafer carrier door sensors 708 must indicate that the vacuum wafer carrier door 14 is fully open. The control system 206 sends a signal to the transfer arm controller 709 to move the wafer transfer arm 28 from its home position to a position beneath and in close proximity to but not touching the wafer selected for processing, whic was input to the control system 206.

When the transfer arm 28 is positioned under the wafer, the wafer arm sensor 710 sends a signal to the control system 206 which indicates whether or not a wafer is present in that location. Wafer transfer arm sensor 710 is a capacitive proximity detector. If a wafer is detected as being present, the control system sends a signal to the transfer arm controller 709 which allows it to contiue the transfer sequence. The transfer arm 28 moves vertically upward and lifts the wafer 48 off of the ledge 60.

The transfer arm 28, now carrying the wafer on the three pins 50, as described above with reference to FIGS. 1, 3, and 4, moves horizontally out of the vacuum wafer 10. After the transfer arm 28 has cleared the vacuum wafer carrier 10, the transfer arm controller 709 positions the transfer arm 28 at the appropriate vertical position to be able to pass through the isolation gate 31 (FIG. 3) and placed atop the three tapered pins 53 in the process chamber.

If desired, at some time prior to attempting to move the wafer 48 through the isolation gate 31, and generally at the end of the last processing sequence, the process chamber has undergone a similar pump down and purge process as did the load lock chamber as described above. The control system 206 sends a signal to the process chamber pressure controller 711 which in turn sends a signal to open the process chamber roughing pump isolation valve 712. The control system 206 then sends a signal to open the nitrogen purge valve 713 and then it sends a set point signal to the process chamber pressure controller 714 which in turn controls the process chamber throttle valve 715 to maintain the appropriate vacuum in the process chamber during the nitrogen purge process. This purge process continues until the process particle counter 208 detects no particulate for a predetermined time period as monitored by the control system 206.

Once that condition is achieved, the control system shuts the process chamber nitrogen purge valve 713 and the process chamber process controller 714 shuts the process chamber isolation valve 715. The control system 206 provides a signal to the process chamber turbo pump controller 716 which then opens the process chamber turbo pump isolation valve 717. The process chamber vacuum sensor 718 provides vacuum information to the control system 206.

Once the vacuum indicated in the process chamber by the input signal from vacuum sensor 718 and the load lock vacuum as indicated by vacuum sensor 62 are less than a predetermined amount, the control system sends a signalto the isolation gate 31 to open.

Returning now to the transfer sequence, transfer arm 28 together with 28 together with wafer 48 move horizontally through the isolation gate 31 and into the process chamber. The transfer arm 28 is then lowered and wafer 48 comes to rest upon the three tapered pins 53 and the process chamber. The transfer arm 28 is lowered sufficiently such that the wafer transfer arm sensor 710 should indicate that the wafer was removed from the arm. If the wafer transfer arm sensor 710 indicates that the wafer 48 is no longer on transfer arm 28 the control system 206 sends a signal to the transfer arm controller 709 which cuases the transfer arm 28 to be removed from the process chamber through the isolation gate and back to its home position. Once that sequence is complete, the control system 206 sends a signal to the bellows air cylinder (not shown) that causes its upward motion and closes the process chamber in preparation for the beginning of the process sequence.

The control system 206 can be programmed to control any of the process operations performed, no matter which configuration of the vacuum processor is used. The control system 206 can establish the desired wafer temperature by one of several methods depending upon the configuration of the vacuum process. In one case, where the vacuum processor utilizes a resistively heated substrate, the control system 206 is provided with temperature information from the heated substrate temperature sensor 720 and provides a control signal to the heated substrate temperature controller 724 which controls the heated substrate power supply 725. In another embodiment, the control system provides an input to the radiant heat lamp power supply controller 721 which controls the amount of power and the rate of change of power input to the radiant heat lamps from the lamp power supply 722. In another embodiment, the control system 206 provides input to the heat exchanger control valves 723 which control the flow of cooling water to the substrate. In addition, when using a microwave plasma, the control system receives microwave plasma temperature information from the microwave plasma temperature sensor 726 and in turn sends a control signal to the microwave plasma power supply controler 727 which controls the microwave plasma power supply 728 to achieve proper plasma temperature.

In almost all of the processes, one or more process gases are utilized to achieve the desired results. The control system 206 sends a signal to the manifold valve controller 729 which can control which of the manifold valves 730 are used and, consequently which gases and how much flow is allowed to pass through each valve.

In several embodiments, in situ ultraviolet energy is provided to enhance wafer processing. The control system 206 to the UV tuner 731 in order to match the UV (as used herein UV is defined as ultraviolet light) chamber impedance. In addition, the control system provides a signal to the UV power supply controller 732 which in turn adjusts the UV transmitter power 733.

In some embodiments, the processor uses low power radio frequency energy to accelerate charged particles to the surface of the wafer 48. The control system 206 provides inputs to an radio frequency tuner 734 so that the impedance of the transmitter can be matched to the impedance of the RF (as used herein RF is defined as radio frequency) electrodes in the process chamber.

When RF energy is used for generating a plasma or heating a substrate in the process chamber, the radio frequency temperature sensor provides a signal to the control system 206 corresponding to the temperature of the RF electrode in the process chamber. The control system provides a signal via the RF power supply controller 736 which in turn provides a signal to the RF power supply 737 that adjusts tranmitter output power to achieve proper RF electrode temperature.

When the process is complete, the control system shuts the appropriate manifold valves 730 and shuts off the appropriate power supplies discussed above.

If desired, with the processing complete, the control system 206 initiates a process chamber purge cycle as was described above. This purge cycle can continue for a fixed period of timer or until the process chamber particle counter 208 indicates 0 particles for a predetermined time period.

The control systems 206 then shuts the nitrogen purge valve 713 and the pump down process continues as the control system monitors the differential vacuum between the load lock and the process chamber. When the process chamber vacuum sensor and the load lock vacuum sensor input signals to the control system 206 indicate that the vacuum difference between the two chambers is less than the predetermined amount, the control system sends a signal to the open process chamber by moving the bellows downward. After the process chamber is open, the control system 206 sends a signal to the transfer arm controller 709 to retrieve the wafer 48 from the process chamber and place it back in the vacuum wafer carrier.

A transfer arm controller 709 causes the transfer arm 28 to move horizontally from its home position through the isolation gate to a point beneath the wafer 48 in the process chamber. The wafer transfer arm sensor 710 will provide a signal to the control system if it senses proximity to the wafer 48. After receipt of this signal, the transfer arm 28 moves up vertically and lifts the wafer 48 off of the tapered pins 53. The transfer arm 28 then moves through the isolation gate 31 into the vacuum load lock chamber 12. The transfer arm controller 709 then causes the transfer arm 28 to move up or down vertically to the vertical position of the slot from which the wafer was originally taken.

Once the transfer arm 28 is at the appropriate vertical position, it moves horizontally into the vacuum wafer carrier 10. At this point, the wafer 48 is positioned just slightly above the ledges 60 which support it inside the vacuum wafer carrier 10. The transfer arm controller 709 then directs transfer arm 28 to move down vertically to a point which allows the wafer to rest on the ledges 60. The transfer arm 28 continues its downward motion, and then stops at a predetermined location beneath the wafer 48. The control system then samples the wafer transfer arm sensor 710 to see if the wafer is any longer in proximity to the transfer arm 28. If it is not, the transfer arm is moved horizontally out of the vacuum wafer carrier to its home position. The transfer arm can then be moved to any other wafer in the vacuum wafer carrier and begin the process of extracting it from the wafer carrier and processing it and replacing it. This evolution can be repeated for whichever wafers the the system 206, as programmed desires regardless of their psotiion in the carrier.

In an optional embodiment, for processes that require low humidity in combination with a high vacuum, the vacuum processor may utilize cryogenic vacuum pumps. These cryogenic pumps are utilized in a manner similar to that utilized for the turbo molecular pumps as described above. Their associated controllers are shown in FIG. 31 as load lock controller 737 and process chamber cryopump controller 738. These controllers control the load lock cryopump isolation valve 739 and the process chamber cryopump isolation valve 740 respectively. The cryopump is utilized to remove moisture from the gas present in the chamber. This is useful for process related to HgCdTe.

When all of the wafers have completed being processed and have been placed back in the vacuum wafer carrier, the control system signals the vacuum wafer door motor 707 to close the door 14. The control system 206 then checks the vacuum wafer carrier door sensors 708 to verify that the door 14 is in fact shut. The control system then shuts the load lock roughing pump isolation valve 702 load lock turbo molecular pump isolation valve 717 or load lock cryogenic pump isolation valve 739 using the corresponding load lock controllers 701, 706 and 737. In addition, the control system shuts the process chamber roughing pump isolation valve turbo molecular pump isolation valve or cryogenic pump isolation valve via the appropriate process chamber controller 711, 716 and 738. It also shuts the isolation gate 31. The control system then sends a signal to open the vent valves 741 which allow the load lock chamber 12 and the process chamber to return to atmospheric pressure. The lid 20 can then open the load lock lid and remove the vacuum wafer carrier 10.

Referring to FIG. 32, a process module 1300 is shown. This process module has remote and in situ plasma. The wafer carrier 10, an arm (like arm 28) and chamber 12 are utilized to transfer the wafer 48 the carrier 10 to the process module 1300 is shown with a gas distributor 1302 attached to a gas distribution ring 1304 which is located in the upper part of top process chamber 1306. The gas distributor 1304 supplies the gas for the in situ plasma thorugh the ring 1304. The ring 1304 is arranged about the vertical axis of the chamber 1306. The exits from ring 1304 through a plurality of openings 1310 in the bottom of ring 1304. The vertical walls of chamber 1306 can be made of quartz and form a cylinder about the vertical axis of chamber 1306. The bottom of chamber 1306 is an electrode 1312. The top of chamber 1306 in the closed position (as shown in FIG. 31) is an electrode 1314. A heat exchanger (not shown) can be provided for electrode 1314, if desired, for example, to maintain an ambient temperature of, for example, 25 degrees C.

The chamber 1306 is opened and closed by a bellows 1316. The bellows 1316 moves the vertical walls of chamber 1306 upward and into contact with the electrode 1314 or an adjacent portion of module 1300. A seal (not shown) can be provided at the location where the vertical wall of chamber 1306 comes into contact. The bellows moves the chamber 1306 upward to close the chamber and downward to open the chamber. In the open position the arm can transfer the wafer 48 from the carrier through chamber 12 and into the chamber 1306 onto fingers or pins 1320. These fingers 1320 are similar fingers 214 (FIG. 12) and pins 53 (FIG. 3). When the chamber 1306 is closed, the fingers 1320 move upward to place the wafer 48 into contact with electrode 1314.

The remote plasma is supplied into the bottom of chamber 1306 along the vertical axis through a pipe 1322. Pipe 1322 extends from a remote plasma generator 1326 and through electrode 1312 into chamber 1306. The pipe 1322 has a slip fit 1328 with electrode 1312 to accommodate a the vertical movement of chamber 1306 including the electrode 1312. Below electrode 1312 is located a chamber 1330 which is connected to pump 1332 and valve 1334. Thus a generally downward flow of gas through chambers 1306 and 1330 is provided. The in situ plasma is provided by the application of appropriate voltages between electrodes 1312 and 1314. The voltage would be RF to provide the desired excitation to the gas in chamber 1306. Pump 1332 and valve 1334 provide the desired vacuum within chamber 1306. This the remote plasma from generator 1326 and the in situ plasma generated within the chamber 1306 are joined in acting on face 54. The distributor 1302 also has a slip fit with electrode 1312. Distributor 302 extends along the vertical wall of chamber 1306. The process module 1300 is adapted to perform various processes.

One process which has been successfully used with the process modules having both remote and in situ plasma is etching of silicon doped aluminum, for example, Aluminum doped with 1% of silicon. A synergistic etch rate enhancement of more than double the sum of their individual etch rates was obtained for combined microwave and RF etching under the following conditions: gas flows were 80 sccm BCl₃ plus 20 sccm Cl₂ plus 1000 sccm He, at 1 Torr total pressure, 225 W RF Power (applied to generate a plasma near the face of the wafer) at a frequency of 13.56 MHz and 400 W microwave power at a frequency of 2450 MHz. The temperature used was an ambient temperature of about 25 degrees C. These results were obtained even though they are based on etch rates which were not very high since the flows had not been optimized for the particular conditions used, but they do show the synergistic advantage of combining these two effects. The gas mixture can all be introduced from pipe 1322 into chamber 1306 or a part of the gas mixture including other gas not mentioned above, can be introduced through ring 1304. Further, a source of hydrocarbon, for example, methane could introduced through ring 1304 or the methane could be a part of the remotely generated plasma.

Another process useful with process module 1300 is for the deposition of Polysilicon. A gas mixture of an inert gas and a source of silicon, for example, SiH₄ and/or Si₂H₆ is used with remote plasma and in situ plasma to produce improved deposition rate over the sum of the rates of in situ and remote plasmas used separately. As an example, the RF power is 100 watts in the process chamber at an 13.56 MHz and the remote plasma generator is operating at 400 watts at 2460 MHz. The gases are Helium at 1000 sccm and SiH₄ at 50 sccm. Argon is another example of an inert gas which can be used. The pressure can be 1 Torr and the temperature 25 degrees C. The SiH₄ is introduced into the process chamber through ring 1304 and remaining gas passes through the generator 1326. These results were obtained even though they had not been optimized for the particular conditions used, but they do show the synergistic advantage of combining these two effects. Surface damage can be reduced by increasing the pressure to greater than 1 Torr. This process results in improved results because of a synergistic effect between the remote and in situ plasmas. The surface damage is minimized while the deposition rate is improved. The remote and in situ plasmas can be separately controlled. This process can be used with silicon, GaAs, and HgCdTe substrates.

Another process useful with process module 1300 is for the deposition of silicon oxide. A gas mixture of Helium, O₂, SiH₄ is used with remote plasma and in situ plasma to produce improved deposition rate over the sum of the rates of in situ and remote plasmas used separately. As an example, the RF power is 100 watts in the process chamber at an 13.56 MHz and the remote plasma generator is operating at 400 watts at 2450 MHz. The gases are Helium at 1000 sccm, O₂ at 100 sccm, and SiH₄ at 50 sccm. The pressure can be 1 Torr and the temperature 25 degrees C. The SiH₄ is introduced into the process chamber through ring 1304 and remaining gas passes through the generator 1326. Surface damage can be reduced by increasing the pressure to greater than 1 Torr. The Temperature can be within the range of 25 to 400 degrees C. This process results in improved results because of a synergistic effect between the remote and in situ plasmas. These results were obtained even though they had not been optimized for the particular conditions used, but they do show the synergistic advantage of combining these two effects. The surface damage is minimized while the deposition rate is improved. The remote and in situ plasmas can be separately controlled. This process can be used with silicon, GaAs, and HgCdTe substrates.

Another process useful with process module 1300 is for the deposition of silicon nitride. A gas mixture of Helium, one of a group of N₂ and NH₃, and one of a group SiH₄ or SiH₂Cl₂ is used with remote plasma and in situ plasma to produce improved deposition rate over the sum of the rates of in situ and remote plasmas used separately. As an example, the RF power is 100 watts in the process chamber at an 13.56 MHz and the remote plasma generator is operating at 400 watts at 2450 MHz. The gases used were Helium at 1000 sccm, one of a group of N₂ and NH₃ at 100 sccm, and one of a group SiH₄ or SiH₂Cl₂ at 50 sccm. The pressure can be 1 Torr and the temperature 25 degrees C. The SiH₄ or SiH₂Cl₂ is introduced into the process chamber through ring 1304 and remaining gas passes through the generator 1326. Surface damage can be reduced by increasing the pressure to greater than 1 Torr. The Temperature can be within the range of 25 to 400 degrees C. This process results in improved results because of a synergistic effect between the remote and in situ plasmas. These results were obtained even though they had not been optimized for the particular conditions used, but they do show the synergistic advantage of combining these two effects. The surface damage is minimized while the deposition rate is improved. The remote and in situ plasmas can be separately controlled. This process can be used with silicon, GaAs, and HgCdTe substrates.

Another process useful with process module 1300 is for the etch of GaAs. A gas mixture of Helium, CH₄, and one of a group of CF₄ or F₂ is used with remote plasma and in situ plasma to produce improved etch rate over the sum of the rates of in situ and remote plasmas used separately. As an example, the RF power is 100 watts in the process chamber at an 13.56 MHz and the remote plasma generator is operating at 400 watts at 2450 MHz. The gases and were Helium at 1000 sccm, CH₄ at 250 sccm, and CF₄ or F₂ at 100 sccm. The pressure can be 1 Torr and the temperature 25 degrees C. The CH₄ is introduced into the process chamber through ring 1304 and remaining gas passes through the generator 1326. This process results in improved results because of a synergistic effect between the remote and in situ plasmas. These results were obtained even though they had not been optimized for the particular conditions used, but they do show the synergistic advantage of combining these two effects. The surface damage is minimized while the etch rate is improved. The remote and in situ plasmas can be separately controlled. The resultant etch is partially anisotropic. The level of anisotropy can be controlled by the relative RF plasma and microwave power levels, as well as the pressure.

Another process useful with process module 1300 is for the etch of ZnS or HgCdTe, which form at least a part of a wafer. A gas mixture of a source of atomic fluorine mixed with a inert carrier such as Helium is utilized to generate a remote plasma. An in situ plasma is generated from at least the products of the remote plasma and an alkyl-bearing species. The powers used to generate the remote plasma and in situ plasma are separately controlled to produce improved etch rates. The remote and in situ plasmas produce an etch rate which is greater than the sum of the rates of in situ and remote plasmas used separately. Relative low power RF is used to generate an in situ plasma in conjunction with the remote plasma to provide an partially anisotropic etch with a relative high etch rate. Since the reote plasma and in situ plasma can be separately controlled, improved profile control and etch selectivites can be achieved. An in situ descum can be performed before the etch and a post-etch ashing utilizing a remote plasma formed from a source of oxygen. The alkyl-bearing process can be, for example, methane, ethane, mehtylfouoride, methylchlorides, methyliodide, or methylbromide. The source of atomic fluorine can be, for example, fluorine, $CF_4$, $SF_6$, $NF_3$, $C_2F_6$ or any other gaseous fluorine compound which releases its fluorine atoms in the presence of a plasma. The power used can be, for example, 250 watts or less for the RF and 400 watts for the MW. The flow rates can be 100 sccm for $CF_4$, 125 sccm for $Ch_4$, and 1000 sccm for Helium. The pressure can be, for example, 0.8 Torr. The surface damage is minimized while the etch rate is improved. The remote and in situ plasmas can be separately controlled. The resultant etch is partially anisotropic. The level of anisotropy can be controlled by the relative RF plasma and microwave power levels, as well as the pressure.

Another process useful with process module 1300 is for the ashing of photoresist. A gas mixture of Oxygen and an ashing enhancement gas, for example, one or more of the group of $CF_4$, $CHF_3$, $H_2$, $H_2O$, HCl, HBr, $Cl_2$, and $N_2O$, is used with remote plasma and in situ plasma to produce improved ashing rate over the sum of the rates of in situ and remote plasmas used separately. As an example, the RF power is 226 watts in the process chamber at an 13.56 MHz and the remote plasma generator is operating at 400 watts at 2450 MHz. The gases used were $CF_4$ at 43 sccm and Oxygen at 996 sccm. The pressure can be 0.63 Torr and the temperature 25 degrees C. All of the gas can be passed through the remote plasma generator 1326. This process results in improved results because of a synergistic effect between the remote and in situ plasmas. These results were obtained even though they had not been optimized for the particular conditions used, but they do show the synergistic advantage of combining these two effects. The surface damage is minimized while the ashing rate is improved. The remote and in situ plasmas can be separately controlled. The resultant ashing is partially anisotropic. The level of anisotropy can be controlled by the relative RF plasma and microwave power levels, as well as the pressure.

Another process useful with process module 1300 is for the etch of Silicon Nitride. A source of Fluorine and Helium were used with remote plasma and in situ plasma to produce improved etch rate over the sum of the rates of in situ and remote plasmas used separately. As an example, the RF power is 225 watts in the process chamber at an 13.56 MHz and the remote plasma generator is operating at 400 watts at 2450 MHz. The gases used were fluorine gas source, for example, $CF_4$ at 200 sccm and Helium at 1000 sccm. Other sources of Fluorine can be $F_2$, $CHF_3$, $C_2F_6$, $SF_6$, or $F_3$, singly or in any combination with $CF_4$. The pressure can be 0.7 Torr and the temperature 25 degrees C. This process results in improved results because of a synergistic effect between the remote and in situ plasmas. These results were obtained even though they had not been optimized for the particular conditions used, but they do show the synergistic advantage of combining these two effects. The surface damage is minimized while the etch rate is improved. The remote and in situ plasmas can be separately controlled. The resultant etch is partially anisotropic. The level of anisotropy can be controlled by the relative RF plasma and microwave power levels, as well as the pressure.

A further process useful with process module 1300 is for the etch of polysilicon. A source of Fluorine and Helium were used with remote plasma and in situ plasma to produce improved etch rates of twice the sum of the remote and in situ plasmas alone. As an example, the RF power is 225 watts in the process chamber at an 13.56 MHz and the remote plasma generator is operating at 400 watts at 2450 MHz. The gases used were fluorine gas source, for example, $CF_4$ at 200 sccm and Helium at 1000 sccm. Other sources of Fluorine can be $F_2$, $CHF_3$, $C_2F_6$, $SF_6$, or $NF_3$ singly or in any combination with $CF_4$. The pressure can be 0.7 Torr and the temperature 25 degrees C. This process results in improved results because of a synergistic effect between the remote and in situ plasmas. These results were obtained even though they had not been optimized for the particular conditions used, but they do show the synergistic advantage of combining these two effects. The surface damage is minimized while the etch rate is improved. The remote and in situ plasmas can be separately controlled. The resultant etch of the polysilicon is partially anisotropic. The level of anisotropy can be controlled by the relative RF plasma and microwave power levels, as well as the pressure.

Another process which utilizes remote and in situ plasmas is the etching of copper doped aluminum films. The process is carried out in, for example, module 1300 or module 680 of FIG. 24. A source of Chlorine, which can be, for example, $Cl_2$, $CCl_4$, or $SiCl_4$, a source of hydrocarbon, for example, $CH_4$, and $BCl_3$ are used. The hydrocarbon can be omitted but a line width loss will occur. As an example, the RF power applied between the electrodes within the process chamber can be about 250 watts at 13.5 MHz. The remote plasma generator can be power at 400 watts with a frequency of 2450 MHz. The pressure with the process chamber, for example, chamber 1306 (FIG. 31) can be 0.15 Torr. The temperature within the process chamber can be at an ambient temperature, for example, about 25 degrees C.

The gases used can be $BCl_3$ at 80 sccm, $Cl_2$ (chlorine) at 10 sccm, and a hydrocarbon source, for example, $CH_4$ (methane) at 5 sccm. These results were obtained even though they are based on etch rates which were not very high since the flows had not been optimized for the particular conditions used, but they do show the synergistic advantage of combining these two effects. The gas from the gas distributor 1302 and the pipe 1322 can be the same or different as desired. This process allows the resultant etched surfaces to have reduced residues, for example, Copper Chloride. The etch is enhanced by the use of both remote and in situ plasma. This allows lower RF power to be used which reduces surface damage and maintains the integrity of the photoresist. The pressure should be from less than slightly above 1 Torr to less than one Torr.

Another useful process is an overetch of a tungsten material (a layer) to achieve selectivity to silicon dioxide and the desired anisotropy. A source of Fluorine, which can be, for example, $CF_4$, $C_2F_6$, HF, $F_2$, $NF_3$, or $SF_6$, a source of hydrocarbon, for example, $CH_4$, and HBr are used. The hydrocarbon and HBr can be omitted but an improved etch is provided if they are present. The hydrocarbon performs a side wall passivant during the etch which reduces the line width loss. As an example, first, the bulk of the tungsten layer is etched using, for example, one of the tungsten etch processes discussed herein. After this step, the etching continues utilizing remote and in situ plasma under the following conditions as an example. The RF power is 50 watts in the process chamber at an appropriate frequency and the remote plasma generator is operating at 400 watts. The gases can be a fluorine gas source, for example, $SF_6$, at 40 sccm, a bromine source, for example, HBr at 13 sccm, and a hydrocarbon source, for example, $CH_4$ (methane) at 5 sccm. The pressure can be 0.13 Torr and the temperature 25 degrees C. This process results in improved results because of a synergistic effect between the remote and in situ plasmas which provides an increased selectivity to silicon dioxide and photoresits. The etch is also improved by allowing the separate adjustment of microwave (MW) and radio frequency (RF) power during the plasma generation. The pressure should be from about 0.1 Torr to about 5 Torr.

It has been found that a combination of a hydrocarbon with a bromine source provides a very potent passivating chemistry for fluorine-based etches. For example, one embodiment which has been successfully demonstrated is as follows: The starting structure included a thin film of tungsten. Initial gas flows included 50 sccm of $SF_6$, 5 sccm of $CH_4$, and 15 sccm of HBr, at a total pressure of 250 milliTorr and an applied RF power level of 500 Watts. After the pattern had begun to clear, an additional flow of 20 sccm of $WF_6$ was added, as will be further discussed below. The resulting structure showed nearly vertical etched sidewalls, only slight linewidth erosion, and excellent selectivity to resist.

By increasing the fraction of $CH_4$ and also that of the bromine source, even more robust passivant action can be achieved. The following conditions produce were found, for example, to produce zero linewidth erosion: 40 sccm of $SF_6$, 15 sccm of $CF_4$, and 25 sccm of HBr, at a total pressure of 470 milliTorr and an applied RF power level of 400 Watts. The use of relatively high total pressure assists in maintaining uniformity.

If the rate of passivant deposition is increased still further, negative etch bias can be achieved. In a sample embodiment, a thin film of tungsten was etched using the following initial gas flows: 50 sccm of $SF_6$, 18 sccm of $CF_4$, and 25 sccm of HBr, at a total pressure of 470 milliTorr and an applied Rf power level of 400 Watts. The resist pattern used had 2.7 micron minimum pitch (1.7 micron minimum line width and 1 micron minimum space width). The use of this chemistry was found to produce finally etched space widths of 0.6 to 0.7 microns. Thus, this chemistry provided a "negative etch bias" of approximately 0.15-0.2 micron. As an upper limit, further experiments demonstrated that increasing the flow of methane to 21 sccm, without changing the other conditions, shut down the etch entirely, i.e. the tungsten etch rate went to zero.

It has also been discovered that this class of passivating chemistries provides a highly anisotropic silicon etch. One specific sample embodiment, which was successfully demonstrated by experiment, used an etch chemistry as follows: Initial gas flows included 50 sccm of $SF_6$, 5 sccm of $CH_4$, and 15 sccm of HBr, at a total pressure of 250 milliTorr and an applied RF power level of 500 Watts.

These conditions etched 3 microns deep into silicon in 25 seconds, and produced an approximately vertical silicon sidewall while maintaining excellent selectivity to resist. However, these etch conditions are not particularly selective to oxide. Thus, this etching chemistry is extremely useful for etching trenches. The advantages of trenches in device structures have long been recognized, but they have usually been fabricated by low-pressure etching conditions which are slow and are pronte to produce very undesirable etching artifacts such as retrograde bowing, grooving, or asperities on the bottom of the trench. It is also an advantage of the avoiding these difficulties of low-pressure processing.

Another, alternative family of chemistries for fluoro-etching uses a feed gas mixture which includes a fluorine source such as $SF_6$) plus a bromine source, such as HBr, plus a very weak oxygen source (e.g., carbon monoxide). This chemistry provides anisotropic high rate fluoro-etching with good selectivity to photoresist.

A sample embodiment of the process discussed has been successfully demonstrated as follows: The starting structure included a thin film of tungsten covered by a patterned layer of developed organic photoresist. Initial gas flows included 25 sccm of $SF_6$, 25 sccm of HBr, and 40 sccm of CO, at a total pressure of 300 milliTorr and an applied RF power level of 175 Watts. During the overetch period an additional flow of 20 sccm of $WF_6$ is usefully added. The resulting structure showed steeply sloped sidewalls, only moderate linewidth erosion, and approximately 2 to 1 selectivity over photoresist.

This chemistry could be modified by substituting another weak oxygen source for the carbon monoxide. That is, weak oxygen sources such as $N_2O$ or $CO_2$ could be used instead. In fact, it would even be possible to derive some benefit by using an extremely small flow (less than one sccm) of $O_2$ in place of the CO, but such very small flows are difficult to control reproducibly with conventional semiconductor manufacturing equipment.

Another, alternative, family of chemistries of fluoro-etching uses a feed gas mixture which includes a fluorine source (such as $SF_6$) plus a fluorosilane (e.g., $SiF_4$), plus a bromine source (such as HBr), plus a weak oxygen source such as carbon monoxide. This chemistry provides anisotropic high rate fluoro- etching with good selectivity to photoresist.

A sample embodiment of this process has been successfully demonstrated as follows: The starting structure included a thin film of tungsten, covered by a patterned and developed layer of organic photoresist material. Initial gas flows included 25 sccm of SiF$_4$, 25 sccm of SF$_6$, 25 sccm of HBr, and 30 sccm of CO, at a total pressure of 350 milliTorr and an applied RF power level of 175 Watts. During the overetch period an additional flow of 30 sccm of WF$_6$ is added to the other flows described, to avoid resist erosion. The resulting structure showed nearly vertical etched sidewalls, only slight linewidth erosion, and approximately 3 to 1 selectivity to the photoresist.

Another process which is adapted for use with process module 1300 is a low pressure silicon nitride etch. This etch utilizes a remote plasma gas mixture of SF$_6$ flowing at 100 sccm and He flowing at 5000 sccm. The substrate has a temperature of 25 degrees C. RF plasma was not generated. The etch rate of the silicon nitride was 37 angstroms per minute. The silicon dioxide was observed not to hae etched. An addition source of Fluorine could be used such as F$_2$, CF$_4$, or C$_2$F$_6$. These additional sources may reduce the selectivity of the etch to silicon oxide. The etch rate can be increase by the additional use of RF in situ plasma. This process is also useful for GaAs and HgCdTe processing.

In another process, after one of the tungsten etches described above has etched most of the tungsten film the present process is utilized to provide an etch which is both anisotropic and selective to silicon dioxide and photoresist by utilizing both remote and in situ plasmas. The gas mixture used was comprised of SF$_6$ at 40 sccm, HBr at 13 sccm, and a source of hydrocarbons, for example, CH$_4$ (methane) at 5 sccm. The pressure and temperature used were 0.13 Torr and 25 degrees (ambient) C, respectively. The RF and W power used to produce the in situ and remote plasmas were 40 and 400 watts, respectively. The in situ and remote plasmas produce a synergistic effect which results in improved etch characteristics, including selectivity and anisotropy. This includes the separate control of the generation of the remote and in situ plasmas.

Figure 33:
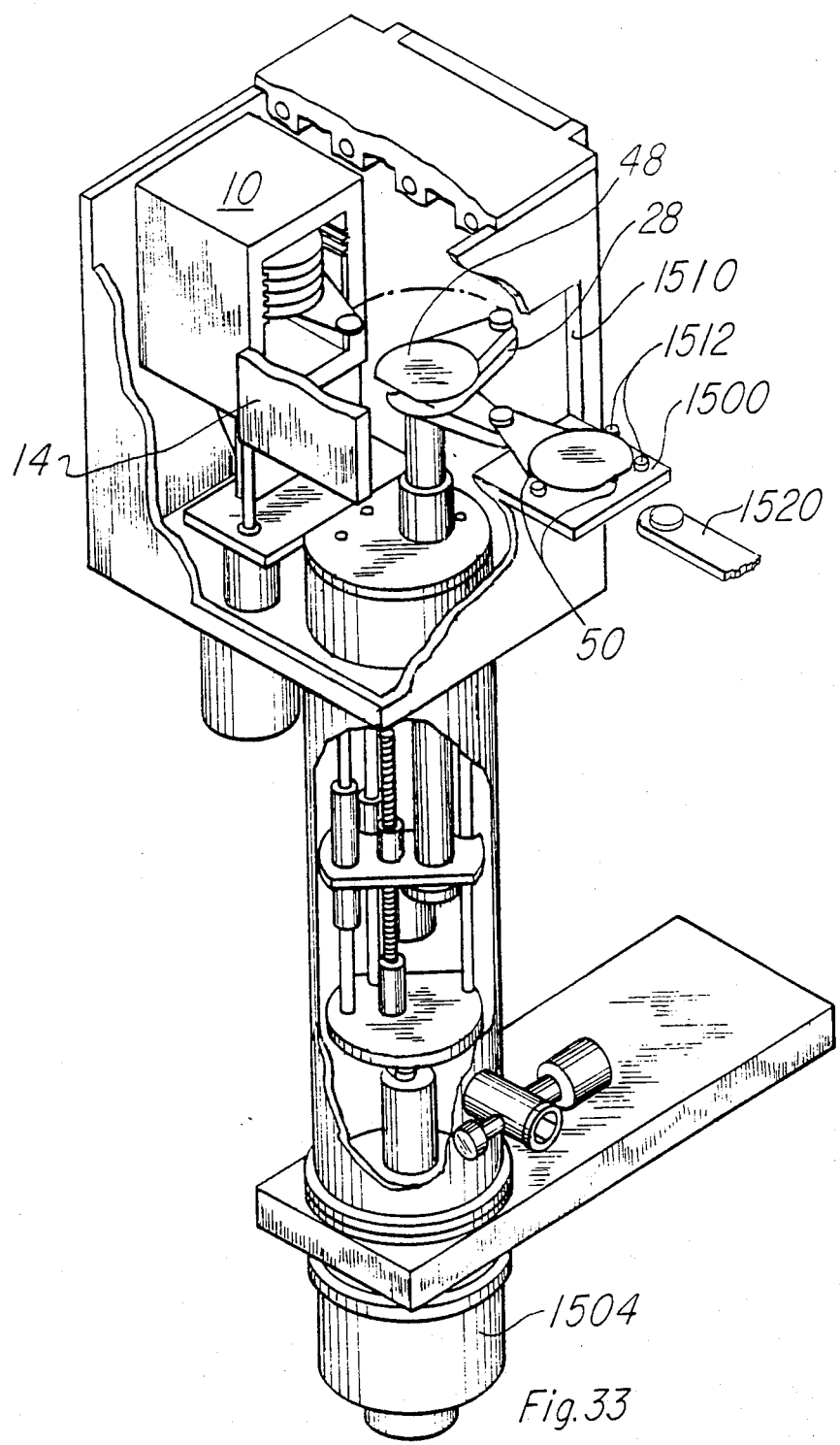
FIGS. 33 and 34 show load lock chamber adapted to transfer wafers between a vacuum carrier and ambient.

In FIG. 33, a wafer carrier 10 is shown with its door 14 is open. Transfer arm 28 is shown transferring a wafer 48 between carrier 10 and a platform 1500. The arm 28 acts as discussed above in connection with FIGS. 1, 3, and 4. The arm 28 is located within a load lock chamber 1502, which is similar to chamber 12. The platform 1500 can be hinged to rotate along its bottom side from vertical position to the horizontal position shown in FIG. 33. The platform would form a seal with the chamber 1502. This would allow a vacuum to be formed by pump 1504 within chamber 1502. Alternatively, a door or isolation gate (not shown) can be included to provide an sealable opening through chamber 1502 for arm to extend to platform 1500. The carrier 10 which contains wafers in vacuum is placed into chamber 1502. The chamber 1502 is pumped down to the desired vacuum by pump 1504. A particle counter, similar to counter 850, can be used to monitor the particles within chamber 1502. The door 14 would not be opened until the desired particle conditions are obtained as discussed herein with reference to the various Figures including FIGS. 11 and 31. A purge can be conducted if desired. Once the desired vacuum is established the door 14 is opened. The chamber 1502 is then vented to ambient pressure by introducing a clean gas, for example, N$_2$ (nitrogen). The platform, door, or isolation gate is opened. The arm 28 can reach into carrier 10 under a wafer 48. The arm is raise slightly to lift the wafer. This is the leftmost position in FIG. 33. The arm is the moved out through opening 1510 in chamber 1502. The wafer 48 contacts at its circumference 49 three pins 50 (only two are shown in FIG. 33). The wafer 48 is shown with its face 54. which is to have devices or integrated circuits constructed therein and/or thereon. In the rightmost position in FIG. 33, arm 28 is shown positioned over platform 1500. The platform 1500 has three pins 1512 (only two are shown in FIG. 33) similar to pins 53 in FIGS. 1, 3, and 4. The arm is lower slightly to place wafer 48 onto the pins 1512.

The wafer 48 can then be picked up by another transport mechanism 1520. The transport mechanism 1520 can be another transport arm similar to arm 28 or appropriate mechanism. All of the wafers could be transferred to the platform 1500 one wafer at a time. In the alternative, one wafer could be processed within a non-vacuum processing system (not shown) after transport thereto by mechanism 1520, returned to platform 1500, and then to carrier 10. The next wafer could then be transferred to platform 1500 form carrier 10. When it desired to close carrier 10, it is necessary to close the platform, door, or isolation gate. Vacuum is applied to chamber 1502 and the chamber is again purged using a gas, for example, N$_2$. The particular counter can be monitored by computer control system 206 and the door 14 closed after the desired conditions are met. The wafers can be transferred by arm 28 face down as described herein. The computer control system 206 (FIG. 10 and 31) would provide the necessary control to arm 28 and chamber 1502.

Figure 34:
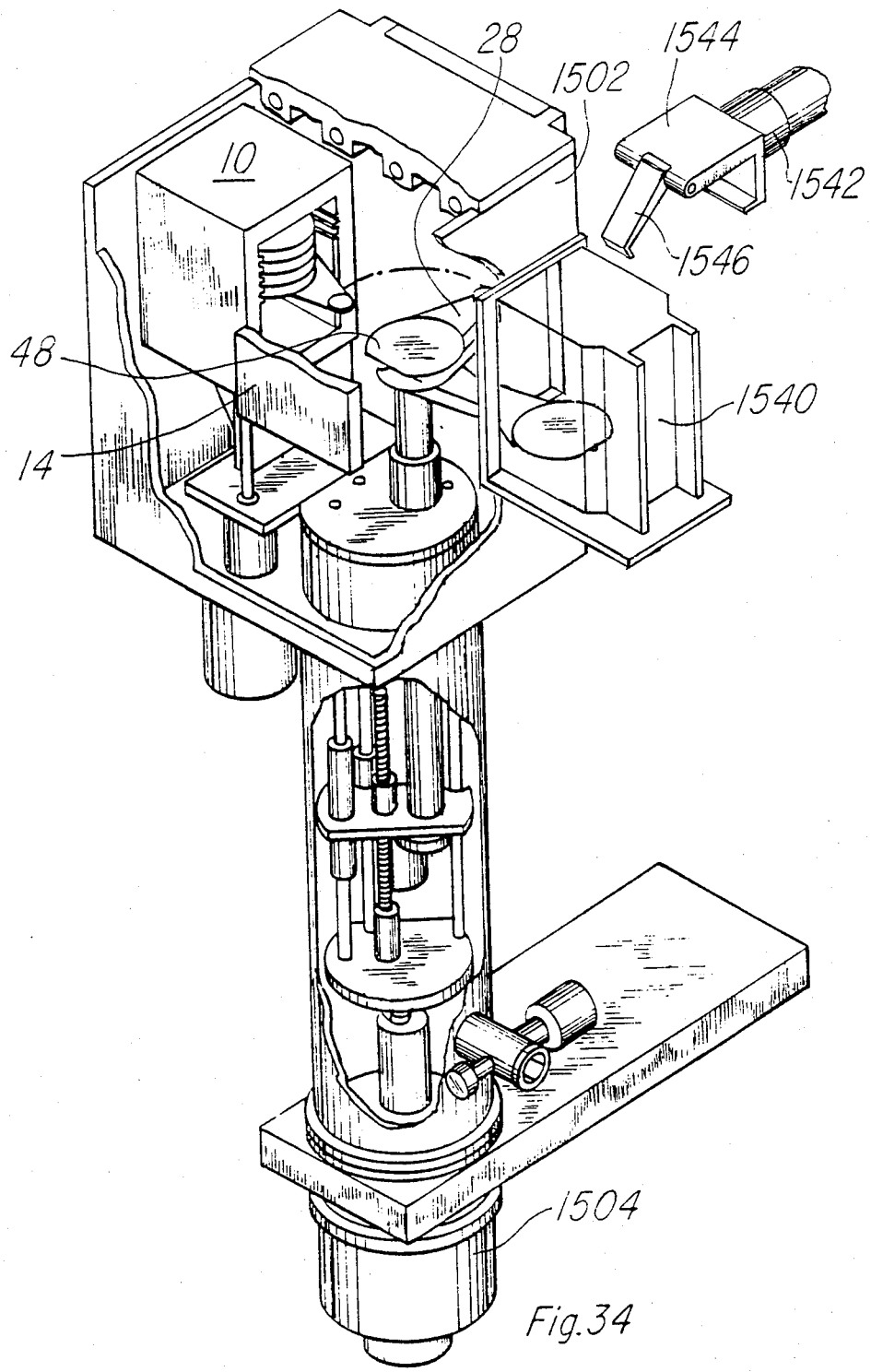

The general configuration shown in FIG. 34 is similar to that in FIG. 33. However, the wafers, for example, wafer 48 are not placed on a platform but rather are placed into a non-vacuum carrier 1540 by arm 28. One or more wafers (or all) can be placed into carrier 1540. The carrier 1540 is located on a support, for example, extending from chamber 1502. A transport mechanism 1542, which can be a robotic arm, has a hand 1544 and a claw 1546 which is adapted to grip and move carrier 1540 to the non-vacuum processing equpment (not shown) which could be, for example, for photolithography. The carrier 1540 can also be moved and replaced by other means,f or example, manually. The pump down sequence and the general operation has been discussed above in connection with FIG. 33.

Figure 35:
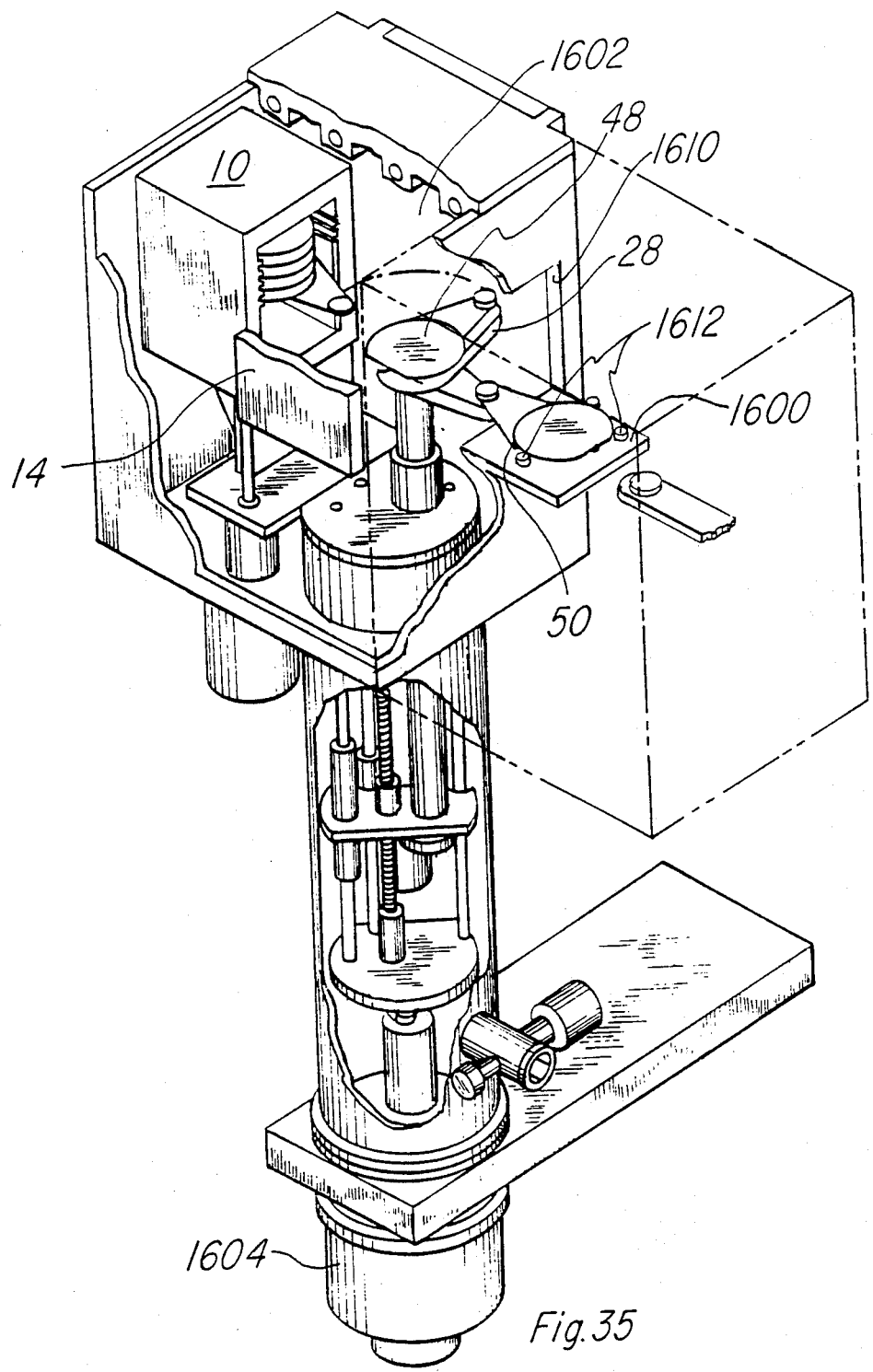
FIGS. 35 and 36, which are similar, respectively to FIGS. 33 and 34, a load lock chamber adapted to transfer wafers between a vacuum carrier and a transfer mechanism to a vacuum processing system.
Figure 36:
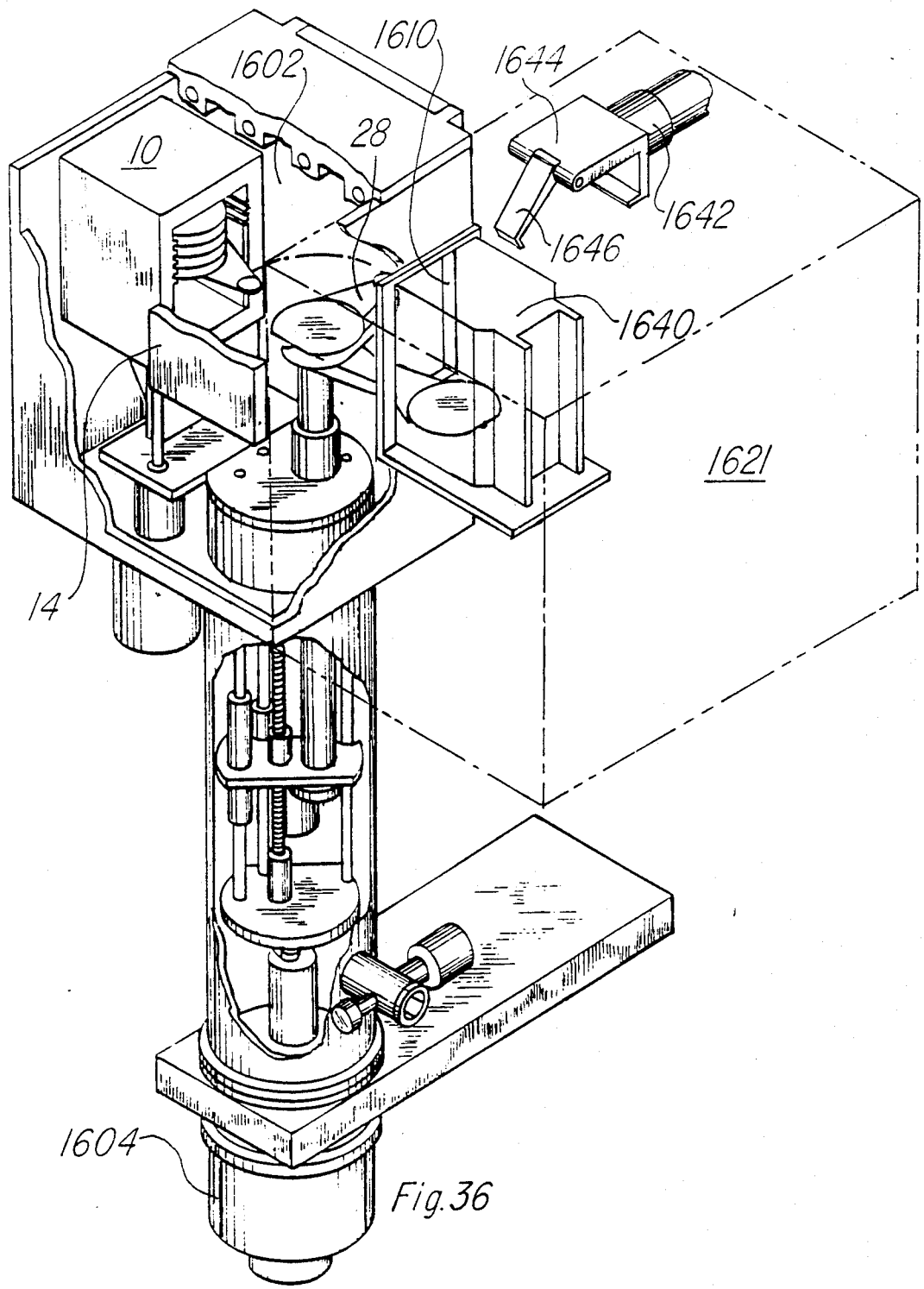

The transfer mechanisms in FIGS. 35 and 36 are generally similar to those shown in FIGS. 33 and 34, respectively. A wafer carrier 10 is shown with its door 14 is open. A platform 1600 is shown receiving a wafer 48 from arm 28. The arm 28 acts as discussed above in connection with FIGS. 1, 3, and 4. The arm 28 is located within a load lock chamber 1602, which is similar to chamber 12 (shown FIGS. 1, 3 and 4). The platform 1600 is similar to plateform 1500 shown FIG. 33 and rotates along its bottom side from vertical position to the horizontal position shown in FIG. 35. The platform would form a seal with the chamber 1602. This would allow a vacuum to be formed by pump 1604 within chamber 1602. Alternatively, a door or isolation gate (not shown) can included to provide an sealable opening through chamber 1602 for arm to extend to platform 1600. The carrier 10 which contains wafers in vacuum is placed into chamber 1602. The chamber 1602 is pumped down to the desired vacuum by pump 1604. A particle counter, similar to counter 850, can be used to monitor the particles within chamber 1602. The door 14 would not be opened until the desired particle conditions are obtained as discussed herein with reference to the various Figures including FIGS. 11 and 31. Once the desired vacuum is established the door 14 is opened. The chamber 1602 can be purged by introducing a clean gas, for example, $N_2$ (nitrogen) as discussed above in connection with the chamber 12 and the process modules. The platform, door, or isolation gate is opened. The arm 28 can reach into carrier 10 under a wafer 48. The arm is raise slightly to lift the wafer. This is the leftmost position in FIG. 35. The arm is the moved out through opening 1610 in chamber 1602. The wafer is resting on three pins 50 (only two are shown in FIG. 35). In the rightmost position in FIG. 35, arm 28 is shown positioned over platform 1600. The platform 1600 has three pins 1612 (only two are shown in FIG. 35) similar to pins 53 in FIGS. 1, 3, and 4. The arm is lower slightly to place wafer 48 onto the pins 1612.

The wafer 48 can then be picked up by another transport mechanism 1620 which is located within vacuum enclosure 1621. This enclosure 1621 is not similar to the standardized modules shown herein, which have basically the same shape, transfer, and closure mechanisms. The transport mechanism 1620 can be another transport arm similar to arm 28 or appropriate mechanism. All of the wafers could be transferred to the platform 1600 one wafer at a time. In the alternative, one wafer could be processed within the non-standard processing module (not shown except for chamber 1621) under vacuum after transport by mechanism 1620, returned to platform 1600, and then to carrier 10. The next wafer could then be transferred to platform 1600 from carrier 10. when it desired to close carrier 10, it is necessary to close the platform, door, or isolation gate. Vacuum is applied to chamber 1602 and the chamber is again purged using a gas, for example, $N_2$. The particular counter can be monitored by computer control system 206 and the door 14 closed after the desired conditions are met. The wafers can be transferred by arm 28 face down as described herein. The computer control system 206 (FIG. 10 and 31) would provide the necessary control to arm 28 and chamber 1602.

The general configuration shown in FIG. 36 is similar to that in FIG. 35. However, the wafers, for example, wafer 48 are not placed on a platform but rather are placed into a non sealable carrier 1640 by arm 28. One or more wafers (or all) can be placed into carrier 1640. A transport mechanism 1642 has a hand 1644 and a claw 1646 which is adapted to grip and move carrier 1640 to the processing equipment, which is not of the standardized module type as shown herein. The carrier 1640 can also be moved and replace by other means,for example, manually. The pump down sequence and the general operation has been discussed above in connection with FIG. 35.

Figure 37:
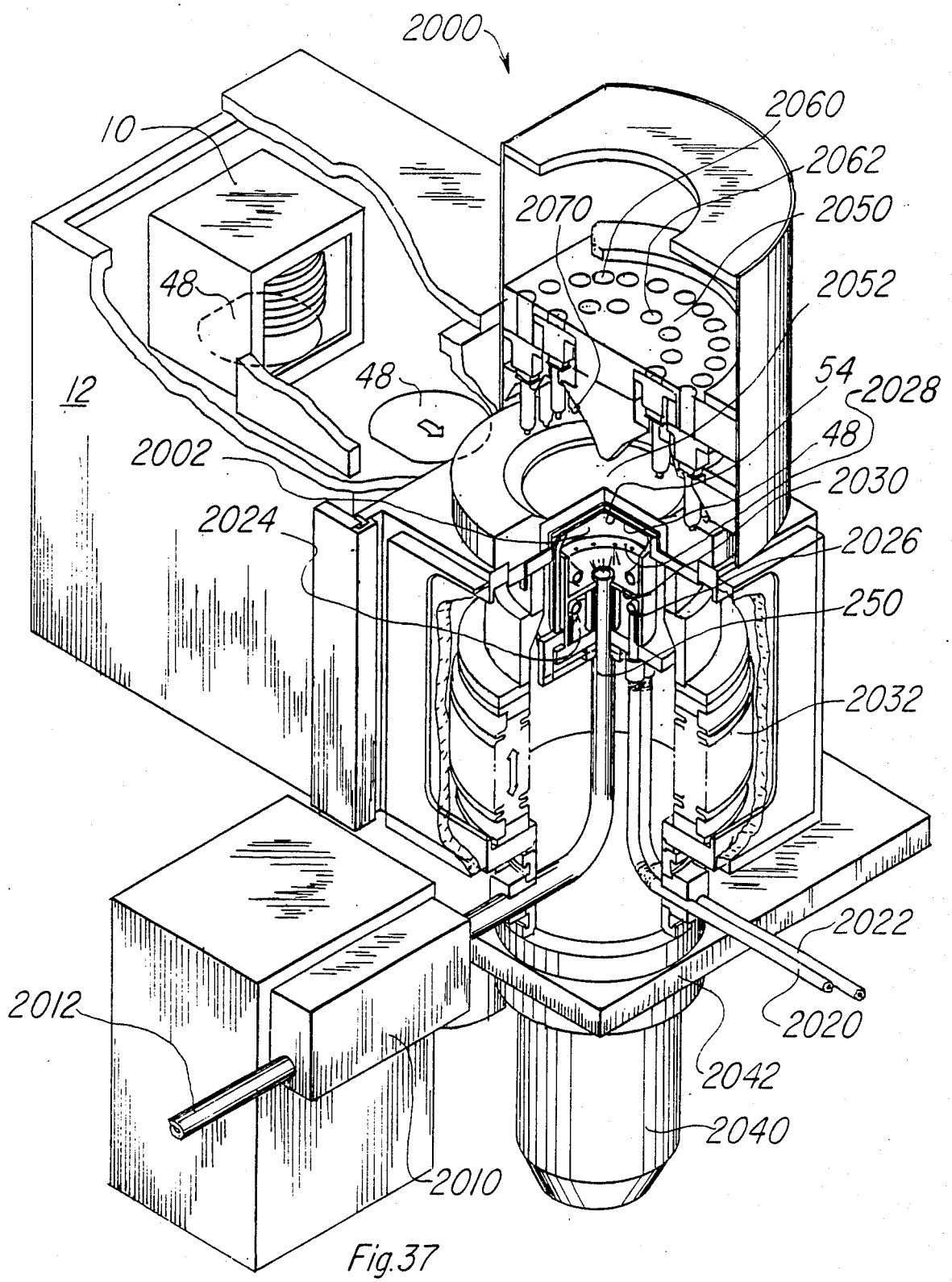
FIGS. 37 through 40 show details of a vacuum processor which has two rings of lamps.

A process module 2000 is shown in FIG. 37. Many of the components of process module 2000 as similar to the components of other modules discussed above. The carrier 10 and chamber 12 operate as discussed above in connection with FIGS. 1, 3, and 4 above. The wafer 48 is shown is with in carrier 10 at its leftmost position and in transit within chamber 12 in its middle position. The type of particle control discussed above in connection with FIG. 11 can be used with module 2000 and the other modules disclosed herein. Wafer 48 in its rightmost position is disposed within a process chamber 2002. A remote plasma generator 2010 generates a remote plasma using microwave energy from the gas mixture supplied through pipe 2012. The feed 250 provides the remote plasma from generator 2010 to chamber 2002. Pipes 2020 and 2022 are connected through a vacuum connection to ultraviolet space 2024 and chamber 2002, respectively. Pipes 2020 and 2022 are connected to gas distribution rings 2026 and 2028, respectively. Space 2024 is located below chamber 2002. A quartz baffle 2030 separates spaces 2024 from chamber 2002. The feed 250 has a slip-fit with quartz baffle 2030. The quartz baffle 2030 has a basic H-shape in cross-section with feed 250 passing through the center of the crossbar. Ring 2026 is located with space 2024 and ring 2028 is located within chamber 2002.

The module 2000 has a pump 2040 and a valve 2042. The quartz baffle forms a part of the sides and bottom of chamber 2002. The quartz baffle is show in FIG. 37 in its upper or closed position. The bellows 2032 provides the vertical movement for quartz baffle 2030. A heat module 2050 is located above chamber 2002. A transparent plate 2052 separates heating module 2050 and chamber 2002. The heat from heating module 2050 is radiantly coupled ot wafer 48 through plate 2052. The plate 2052 forms the top of chamber 2002 in the closed position as shown in FIG. 37. The wafer 48 with its face 54 downward is located just below plate 2052.

Figure 38:
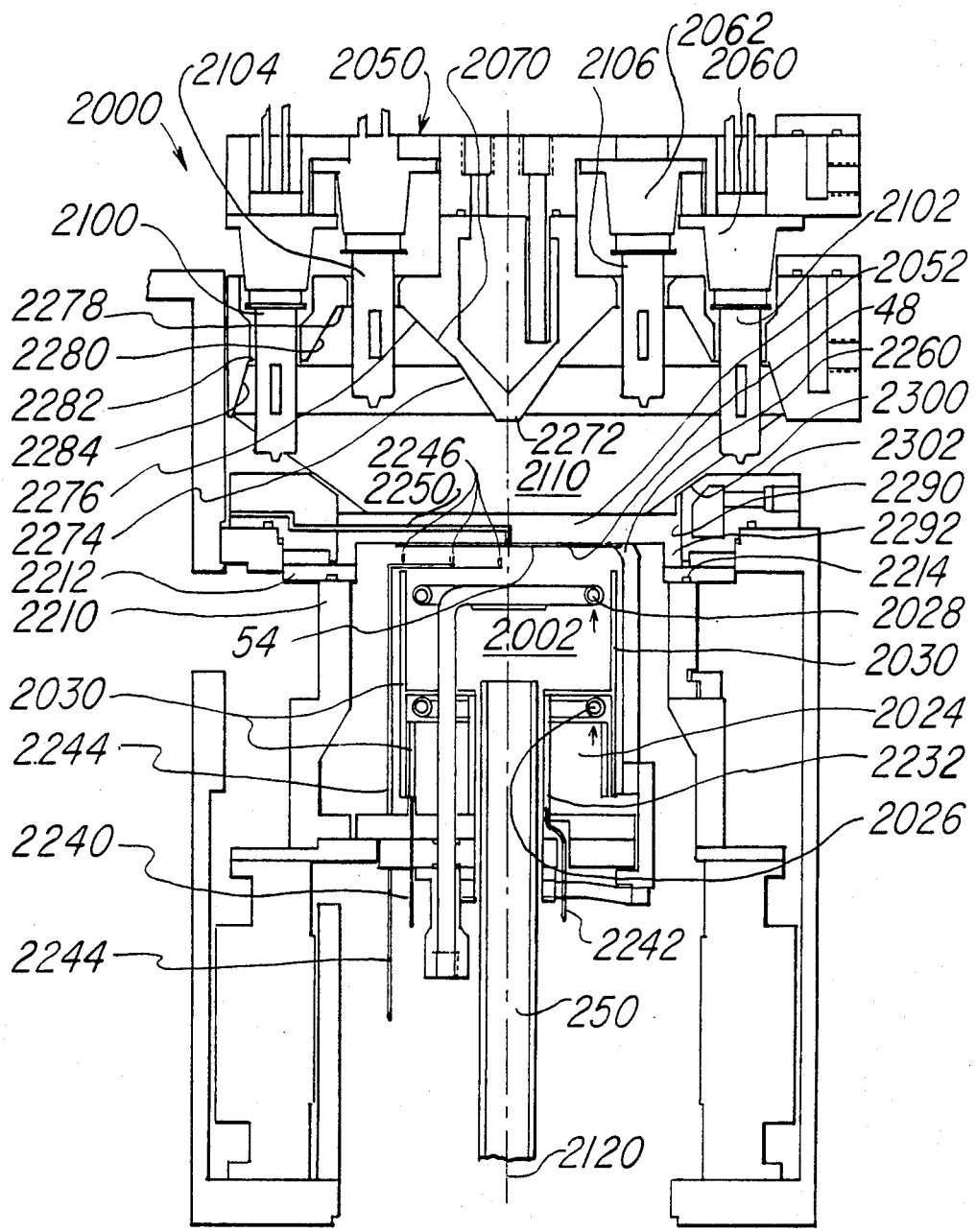
Figure 39:
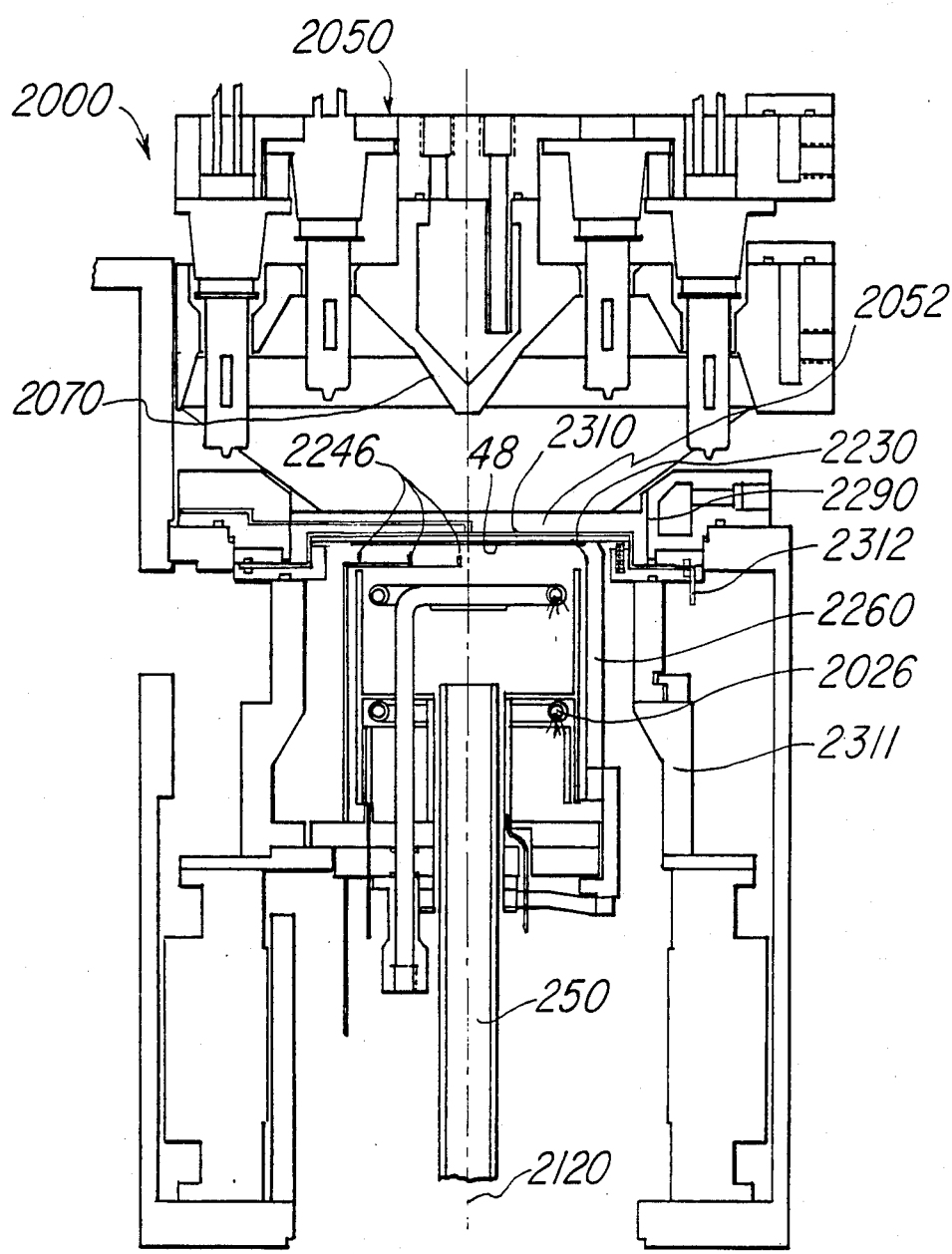
Figure 40:
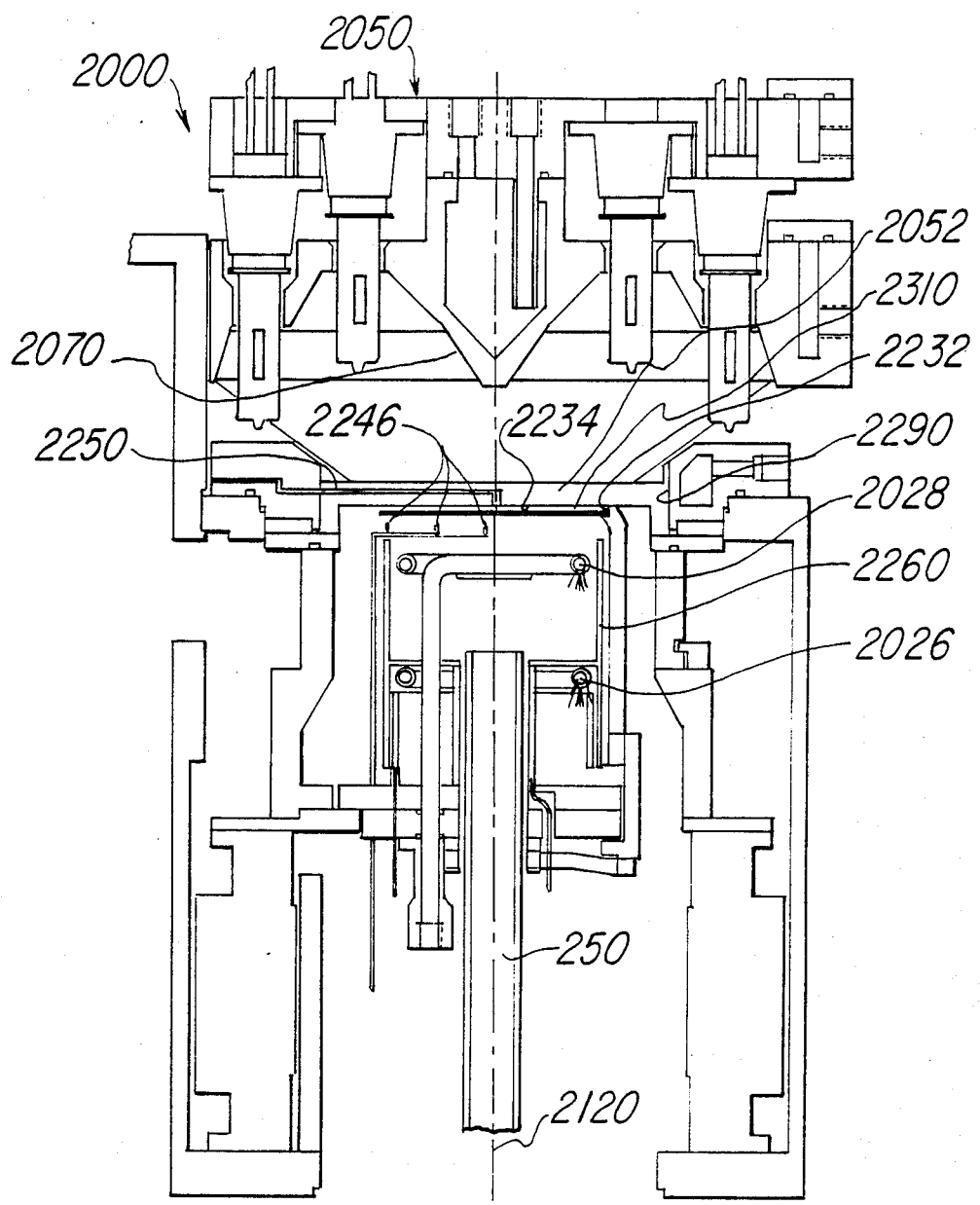

The heating module 2050 is provided with two rings 2060 and 2062 of heating elements. Ring 2060 is located outside of ring 2062. Each ring is comprised of a plurality of heat lamps, for example, 24 in ring 2060 and 12 in ring 2062. The rings are separately controllable. A reflector 2070 is adapted to directed the heat from the rings 2060 and 2062 through plate 2052. The heating module 2050 will be discussed in detail in connection with FIGS. 38, 39, and 40. FIGS. 38, 39, and 40 show modifications to the basic process module 2000 shown in FIG. 37. Therefore, the discussion of FIGS. 38, 39, and 40 will be primarily focused on the differences between the Figures.

FIG. 38 show process module 2000 with the heating module 2050 and two lamps 2100 and 2102 from ring 2060 and two lamps 2104 and 2106 from ring 2062. Reflector 2070 is also shown in FIG. 38. The power supplies connect to the lamps for ring 2060 and ring 2062 are separately controlled by computer control system 206. This allows a greater variety of heating configurations to be available as required. A heater space 2110 is located between the the rings 2060 and 2062 and a portion of reflector 2070, and the plate 2052. The heater space is located above and extends laterally beyond plate 2052. The feed 250 and rings 2026 and 2028 are located as discussed above in connection with FIG. 37. Quartz baffle 2030 is shown in cross-section. A vertical axis 2120 is shown extending through a central portion of module 2000. Feed 250, baffle 2030, rings 2026 and 2028, plate 2052, reflector 2070, and rings 2100 and 2102 are concentric about axis 2120. The baffle 2130 and rings 2026 and 2028 are moved vertically along axis 2120 by bellows 2032. The chamber 2002 is shown in its closed position with the quartz cylinder 2210 against fixed upper support 2212. A seal 2214 as discussed herein can be provided to provide the necessary separation between chamber 2002 and the remainder of the interior of module 2000. A generally downward flow from chamber 2002 is provided by pump 2040 (FIG. 37).

Two electrodes 2230 and 2232 provide the vertical walls for space 2024. Electrodes 2230 and 2232 are cylinders concentric with axis 2120. Electrode 2230 is disposed about electrode 2232. The electrodes 2230 and 2232 provide the necessary power to excite the gas introduced into space 2024 from ring 2026, as discussed above in connection with the other process modules which have ultraviolet light generation capability. Electrical contact to electrodes 2230 and 2232 is through conductors 2240 and 2242. The power supplied would be from a power supply controlled by computer control system 206 as described above. A sensor array 2244 extends upward along the exterior wall of baffle 2030, over the top of the baffle, and horizontally into chamber 2002. A plurality of temperature sensors 2246 (three are shown in FIGS. 38, 39, and 40 although the number can vary) are disposed on the horizontal portion of array 2244. The sensors 2246 are located just below the face 54 of the wafer 48 to measure the temperature at the area where they are disposed. A opening 2250 in plate 2052 extends from the circumference of plate 2052 horizontally to the center and then downward to the lower surface of plate 2052. Opening 2250 will be discussed in detail herebelow. Fingers 2260 (only one of three fingers is shown in FIG. 38) hold the wafer 48 against plate 2052 and are similar to the fingers 53. The array 2244 can be utilized with the other heating modules shown herein, for example, that shown in FIGS. 18 and 19.

The reflector 2070 has a portion with a conic frustum with a flat rip 2272 with a cone shaped surface 2274 extending upward and away from the flat tip 2272. The flat tip 2272. The center of flat tip 2272 is coincident with axis 2120. The surfaces of the reflector 2070 will now be discussed and it should be appreciated that they are shown in cross-section in FIG. 38. Another cone shaped surface 2276 extends upward and away from axis 2120 at greater angle than surface 2274. From surface 2276, a horizontal surface 2278 extends perpendicular to axis 2120 to a cone shaped surface 2280. Surface 2280 extends away from surface 2278 downward and outward from axis 2120 to a horizontal surface 2282. The horizontal surface 2282 extends from surface 2280 outward perpendicular to axis 2120 to another cone shaped surface 2284. From surface 2282, surface 2284 extends downward and outward from axis 2120. The outward most part of surface 2284 is at approxiamtely the same distance along axis 2102 as tip 2272. Surfaces 2274 and 2276 meet at about the same distance along axis 2120 as surface 2282 is located. The tip 2272 and surfaces 2274, 2276, 2278, 2280, 2282, and 2284 form the upper portion of reflector 2070. Tip 2272 is spaced from plate 2052.

The lower portion of reflector 2070 has a cylindrical surface 2290 which is concentric about axis 2120. The lower end of surface 2290 extends below wafer 48 and is separated from chamber 2002 by a ring shaped foot 2292 of plate 2052 which extends downward beyond wafer 48. Foot 2292 extends outside the circumference of wafer 48 and is spaced therefrom. In other words, foot 2292 extends from the main body of plate 2052 downward a distance along axis 2120 greater than wafer 48 as shown in FIG. 38. From surface 2290, the reflector 2070 has a cone shaped surface 2300 which extends upward and away from axis 2120. A horizontal surface 2302 extends outward perpendicular to axis 2120 from its connection to surface 2300. The upper and lower portions of reflector are not connected although each forms a continuous surface. The surface 284 is at about the same distance along axis 2120 as surface 2274 and the heat elements of lamps 2100 and 2102. Surface 2284 can be at an angle to reflect heat from lamps 2100 and 2102 approximately parallel to surface 2300 and onto the wafer with a greater concentration of the heat directed onto the area adjacent its circumference. The heat elements of lamps 2104 and 2106 are about the same distance along axis 2120 as surfaces 2276 and 2280. The surfaces 2276 and 2280 reflect heat from lamps 2104 and 2106 onto wafer 48 with a greater concentration of the heat from the lamps directed onto the central area of the wafer. Surface 2300 can be angled to reflect heat upward and toward axis 2120 and onto surface 2276. Surface 2302 also directs heat upward for reflection downward. Surface 2290 directs additional heat horizontally toward axis 2120 and onto the edge. In general the surfaces and tip of reflector 2070 direct and redirect heat through space 2110 to provide the maximum amount of heat onto the wafer 48. The particular reflector 2070 shown herein is only one way of implementing a reflector for heating module 2050. Since the wafer 48 is against plate 2052, the upward facing face of wafer 48 is protected during depositions.

The module 2000 is shown in FIGS. 39 and 40 along with heating module 2050 and reflector 2070 are the same as those shown in FIG. 38 and will not be discussed further. The rings 2026 and 2028, baffle 2030, plate 2052, feed 250 and in general the entire configuration of the lower part of the module 2000 are approximately the same and only the modifications will be discussed.

In FIG. 39, an electrode 2310 is located between wafer and plate 2052. The plate 2052 is conductive and can be made of, for example, graphite or silicon. Conductor 2312 is attached to electrode 2310 near its edge. Fingers 2260 bring wafer 48 into contact with electrode 2310 when the chamber 2002 is closed as shown in FIG. 39. It should be noted that the fingers 2260 have a notch 2330 which allows the wafer to lie in the notch with the upper ends of the fingers to rest against plate 2052 with the wafer held against electrode 2310 (or as shown in FIG. 38, against plate 2054. However, the pins 53 in FIGS. 1,3, and 4 could also be used. The heat from module 2050 is directed onto electrode 2310 except at the circumference of wafer 48 by surface 2290 directing heat toward axis 2120. The sensors 2246 also provide the same function of providing the temperature of the wafer at various locations, for example, adjacent the circumference, at about one half of the radius, and adjacent the center. This arrangement allows the use of in situ plasma. The RF power would be applied to electrode 2310 and cylindrical support 2311. This would allow the RF enhanced plasma as discussed above to be utilized for the above described processes and for chamber cleanup as described above.

In FIG. 40, the fingers 2260 have a deeper notch 2332 than notch 2330 which allows the tip of fingers 2260 to rest against plate 2310 while the wafer 48 remains spaced from plate 2310 by a space 2234. The opening 2250 in plate 2052 provides a purge gas, for example, an inert gas such as Helium and $H_2$ to the upward facing face of wafer 48 which prevents deposition on that side of the wafer. The sensors 2246 perform the same function as in FIGS. 38 and 39. The surface 2290 of reflector 2070 extends far enough down to direct heat onto the circumference of wafer 48. The various modifications of module 2000 shown in FIG. 37, 38, 39, and 40 show the flexibility of the basic module concept with improved heating at the circumference of the wafer.

Unless specifically stated otherwise above the power and frequencies used for RF and MW plasma and ultraviolet light can be widely varied, as can the other process parameters. The term low pressure as used herein indicates a pressure which is less than ambient pressure.

All of the process modules disclosed herein can be utilized with one or more of the chamber 12 and arm 28 as shown in FIGS. 1, 3, 4, 5A, and 5B. Although silicon, GaAs, and HgCdTe examples are shown herein wafers made of other materials such as germanium, etc. can be utilized. The wafers can be comprised of many different configurations, for example, a single piece of crystal material or small crystals located on a larger substrate. The plasma produced as disclosed herein will include free radicals. Although wafers such as wafer 48 are disclosed herein other types of flat workpieces could be used with the techniques disclosed herein.

The result of processing the wafer 48 can be electronic devices, for example, integrated circuits or discrete semiconductor devices. Once the processing is completed the wafers are divided into devices. The circuits and devices are enclosed into packages, for example, as shown in U.S. Pat. Nos. 4,465,898 issued to Orcutt et al on Aug. 14, 1984 and 3,439,238 issued to Birchler et al on Apr. 15, 1969, which are incorporated hereinto by reference. These packages are then utilized in the construction of printed circuit boards. The printer circuits boards, which cannot operate without the packaged integrated circuits and devices to perform their intended functions, are the required electrical components within computers, photocopiers, printers, telecommunication equipment, calculators, and all of the other electronic equipment which are an essential ingredients of the electronic and information age. Thus electronic equipment cannot function with the circuits and devices.

The present application describes a processing system and a number of classes of process stations and a number of classes of processing methods, which respectively contain numerous additional features which serve to provide further advantages.

It is an advantage of the present invention to provide the capability for automatic transfer between vacuum and non-vacuum systems.

It is an advantage of the present invention to provide chamber enclosing a sealable carrier which is capable of evacuating the carrier prior to sealing.

It is an advantage of the present invention to provide a chamber capable of opening a sealable carrier and bring the contents to ambient pressure.

It is an advantage of the present invention to provide the capability of transferring one wafer at a time from a sealable vacuum carrier to the processing non-vacuum system from the vacuum system and transferring one wafer at a time to the sealable carrer.

It is an advantage of the present invention to provide the capability of transferring wafers from a sealable vacuum carrier to a non-sealable carrier to fill the non-sealable carrier and transferring wafers from the non-sealable carrier to fill the sealable vacuum carrier.

It is an advantage of the present invention to provide a chamber which minimizes the particles in the chamber prior to opening a sealable vacuum carrier prior to exposing the interior of the carrier to ambient pressure and transferring wafers from the carrier to the transfer mechanism of a non-vacuum system.

Having described the invention in connection with certain specific embodiments thereof, it is to be understood that further modifications may now suggest themselves to those skilled in the art, it is intended to cover all such modifications as fall within the scope of the appended claims.

What is claimed is:

1. An apparatus for transferring workpieces comprising:
   (a) a vacuum carrier having a sealable carrier door and capable of maintaining a vacuum with said workpieces therein, said carrier door movable between an open and close position;
   (b) a chamber adapted to receive said carrier and selective move said carrier door and having a closeable port, said chamber capable of maintaining an applied vacuum;
   (c) a moveable arm located within said chamber and capable of engaging said workpieces, said arm moveable into said carrier and through said port to transfer said workpieces;
   (d) a transfer mechanism located exterior to said chamber and adapted to transfer said workpieces from said arm to a non-vacuum processing station; and
   (e) a control system selectively applying vacuum and ambient pressure to said chamber.

2. The apparatus as set forth in claim 1 including a vacuum pump connected to said chamber through a valve controlled by the control system.

3. An apparatus for transferring workpiece comprising:
   (a) a vacuum carrier having a sealable carrier door, the carrier door movable between an open and close position;
   (b) a chamber adapted to receive said carrier and selectively move the carrier door and having a closeable port;
   (c) an arm located within said chamber, said arm moveable into said carrier and through the port to transfer said workpieces;
   (d) a transfer mechanism located exterior to said chamber and adapted to transfer said said workpieces from said arm to a non-vacuum processing station; and
   (e) a control system for selectively applying vacuum and ambient pressure to said chamber.

4. The apparatus as set forth in claim 3 including a vacuum pump connected to said chamber through a valve controlled by the control system.

* * * * *